United States Patent
Yilmaz

(10) Patent No.: US 10,714,574 B2
(45) Date of Patent: Jul. 14, 2020

(54) SHIELDED TRENCH DEVICES

(71) Applicant: iPower Semiconductor, Gilroy, CA (US)

(72) Inventor: Hamza Yilmaz, Gilroy, CA (US)

(73) Assignee: iPower Semiconductor, Gilroy, CA (US)

( * ) Notice: Subject to any disclaimer, the term of this patent is extended or adjusted under 35 U.S.C. 154(b) by 0 days.

(21) Appl. No.: 16/363,812

(22) Filed: Mar. 25, 2019

(65) Prior Publication Data

US 2019/0348510 A1 Nov. 14, 2019

Related U.S. Application Data

(60) Provisional application No. 62/668,800, filed on May 8, 2018, provisional application No. 62/683,576, filed on Jun. 11, 2018.

(51) Int. Cl.
*H01L 29/40* (2006.01)
*H01L 29/423* (2006.01)
*H01L 29/06* (2006.01)
*H01L 29/739* (2006.01)
*H01L 29/78* (2006.01)

(52) U.S. Cl.
CPC ........ *H01L 29/407* (2013.01); *H01L 29/0623* (2013.01); *H01L 29/4236* (2013.01); *H01L 29/7397* (2013.01); *H01L 29/7813* (2013.01)

(58) Field of Classification Search
CPC .......................... H01L 29/407; H01L 29/0623
See application file for complete search history.

(56) References Cited

U.S. PATENT DOCUMENTS

| | | | |
|---|---|---|---|
| 4,941,026 A | 7/1990 | Temple | |
| 5,168,331 A | 12/1992 | Yilmaz | |
| 5,998,833 A | 12/1999 | Baliga | |
| 7,323,386 B2 * | 1/2008 | Yilmaz | H01L 29/0619 438/268 |
| 7,345,342 B2 * | 3/2008 | Challa | H01L 21/3065 257/341 |
| 7,405,452 B2 | 7/2008 | Yilmaz | |
| 7,489,011 B2 | 2/2009 | Yilmaz | |
| 7,645,659 B2 | 1/2010 | Yun et al. | |
| 7,687,851 B2 | 3/2010 | Hshieh | |
| 7,923,804 B2 | 4/2011 | Zeng et al. | |
| 8,283,213 B2 | 10/2012 | Bobde et al. | |
| 8,362,550 B2 | 1/2013 | Rexer et al. | |
| 8,461,040 B2 | 6/2013 | Grebs et al. | |
| 8,581,341 B2 * | 11/2013 | Darwish | H01L 29/407 257/340 |
| 9,620,630 B2 | 4/2017 | Bobde et al. | |

(Continued)

OTHER PUBLICATIONS

Constapel, Rainer et al., "Trench-IGBTs With Integrated Diverter Structures" Proceedings of 1995 International Symposium on Semiconductor Devices and ICs (ISPSD), Yokohama, Japan (1995) pp. 201-206.

(Continued)

*Primary Examiner* — William Coleman
(74) *Attorney, Agent, or Firm* — David Millers

(57) ABSTRACT

A shield trench power device such as a trench MOSFET or IGBT employs a gate structure with an underlying polysilicon shield region that contacts a shield region in an epitaxial or crystalline layer of the device.

35 Claims, 46 Drawing Sheets

(56) References Cited

U.S. PATENT DOCUMENTS

| | | |
|---|---|---|
| 9,685,335 B2 | 6/2017 | Lee et al. |
| 9,748,375 B2 | 8/2017 | Yilmaz et al. |
| 9,852,910 B2 | 12/2017 | Yilmaz |
| 2008/0315407 A1 | 12/2008 | Andrews, Jr. et al. |
| 2017/0179277 A1 | 6/2017 | Shea |
| 2017/0213908 A1 | 7/2017 | Fursin et al. |

OTHER PUBLICATIONS

Deng, Shengling et al., "Doping Engineering for Improved Immunity Against BV Softness and BV Shift in Trench Power MOSFET" Proceedings of the 2016 28th International Symposium on Semiconductor Devices and ICs (ISPSD) Prague, Czech Republic, (2016) pp. 375-378.

Hossain, Zia et al., "3-D TCAD Simulation to Optimize the Trench Termination Design for Higher and Robust BV DSS" Proceedings of the 2016 28th International Symposium on Semiconductor Devices and ICs (ISPSD) Prague, Czech Republic, (2016) pp. 391-394.

Nakamura, Katsumi et al., "Advanced Wide Cell Pitch CSTBTs Having Light Punch-Through (LPT) Structures" IEEE Pub. No. 0-7803-7318-9/02 (2002) pp. 277-280.

Nishiwaki, Tatsuya et al., "Breakdown Voltage Instability Mechanism and Improving Ruggedness in Trench Field Plate Power MOSFET" Proceedings of the 2016 28th International Symposium on Semiconductor Devices and ICs (ISPSD) Prague, Czech Republic, (2016) pp. 215-218.

Nishiwaki, Tatsuya et al., "Modeling of Time Dependent Breakdown Voltage Degradation in Trench Field Plate Power MOSFET" Proceedings of the 2016 29th International Symposium on Semiconductor Devices and ICs (ISPSD) Sapporo, Japan (2017) pp. 463-466.

Oyama, K. et al., "Novel 600-V Trench High-Conductivity IGBT-(Trench HiGT) with Short-Circuit Capability" Proceedings of the 2001 International Symposium on Semiconductor Devices and ICs (ISPSD) Osaka, Japan (2001) pages 417-420.

\* cited by examiner

SHIELDED TRENCH DEVICES

CROSS-REFERENCE TO RELATED APPLICATIONS

This patent document claims benefit of the earlier filing date of U.S. provisional Pat. App. No. 62/668,800, filed May 8, 2018, and claims benefit of the earlier filing date of U.S. provisional Pat. App. No. 62/683,576, filed Jun. 11, 2018, both of which are hereby incorporated by reference in their entirety.

BACKGROUND

Power semiconductor devices with trench gates have become an industry standard because such devices can provide low on resistance and fast switching of relatively high voltages. In particular, current power MOSFETs (Metal-Oxide-Semiconductor Field-Effect Transistors) with trench gate structures can achieve a breakdown range of 20V to 200V and low on resistance.

Shielded gate or split gate trench MOSFETs, as they are sometimes called, have become the current choice for high performance in low to mid voltage power MOSFET products. U.S. Pat. No. 4,941,026, for example, disclosed a trench power MOSFET with a second gate inside the trench for low ON-state resistance. U.S. Pat. No. 5,998,833 discloses a Trench Power MOSFET with a similar split-gate structure for high frequency switching. U.S. Pat. No. 7,489,011 discloses trench MOSFETs or trench Insulated Gate Bipolar Transistors (IGBTs), which may include an epitaxially-grown field shield region in the trench beneath the gate of a trench MOSFET or IGBT. Reliability implications of shielded gate trench MOSFETs have also been studied, for example, by Zia Hossain et al. (ISPSD 2016, pp. 391-394), Nishiwaki et al. (ISPSD 2016, pp 215-218), Deng et al. (ISPSD 2016, pp. 75-378), and Nishiwaki et al. (ISPSD 2017, pp. 463-466).

BRIEF DESCRIPTION OF THE DRAWINGS

The drawings illustrate examples for the purpose of explanation and are not of the invention itself. Use of the same reference symbols in different figures indicates similar or identical items.

DETAILED DESCRIPTION

Figure 1A:
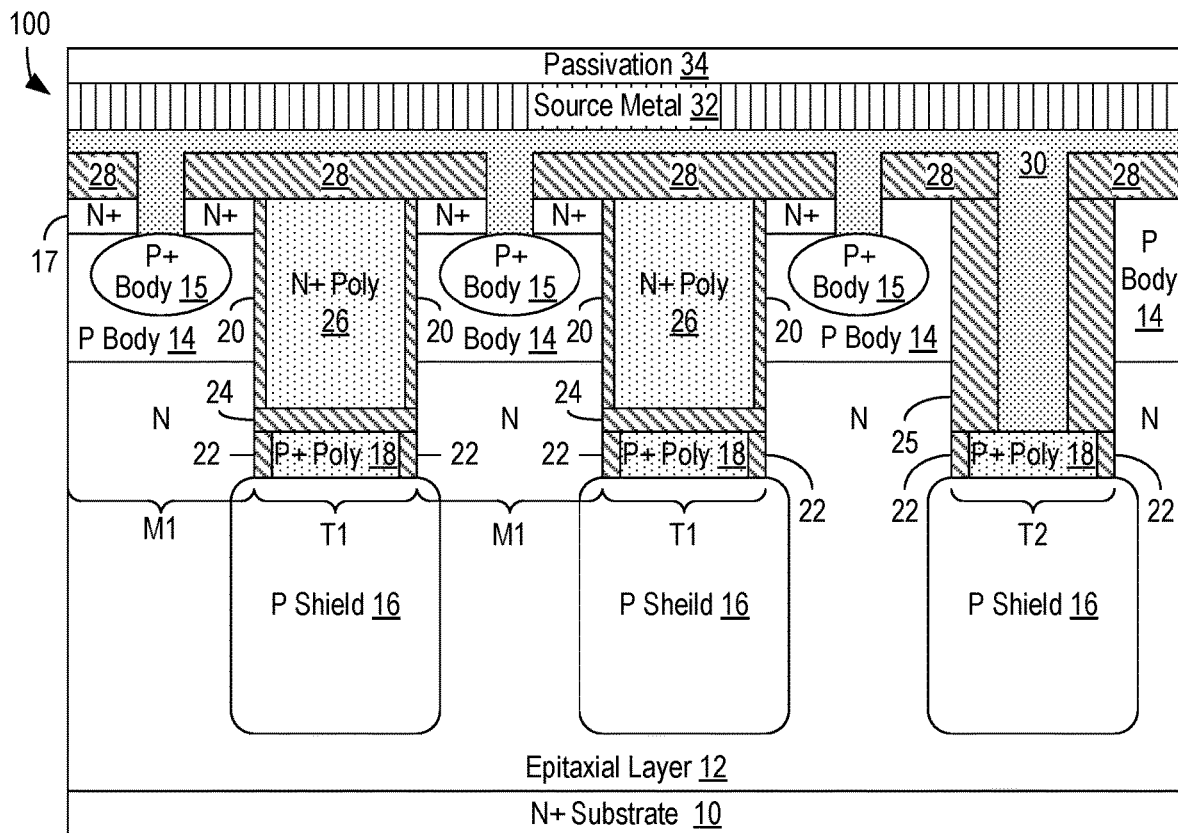
FIG. 1A illustrates a portion of an exemplary poly shield trench MOSFET including active cells and a shield contact.

A power semiconductor device such as a trench MOSFET or a trench IGBT includes a poly shield region, i.e., a shield region made of polycrystalline silicon, that is laterally confined by insulators and a further shield region that is under and contacting the poly shield region and may particularly be in a drift region of the semiconductor device. The new shield structure can replace a shielded MOS gate with a P type polysilicon PN junction type shielding structure to resolve reliability and fabrication challenges of the thick shielded gate structures. Shield oxide and related reliability issues may be eliminated by employing P poly PN junction type shield structures as disclosed herein.

FIGS. 1A to 1D show cross-sectional views of different portions of a trench MOSFET 100 in accordance with an exemplary embodiment of the present invention. MOSFET 100 includes a semiconductor substrate 10 and an overlying epitaxial layer 12 that may be intrinsically of the same conductivity type as substrate 10. In the exemplary embodiment, substrate 10 is a N+ silicon substrate, and epitaxial layer 12 is a crystalline layer of N-type silicon grown on substrate 10. Epitaxial layer 12 includes doped regions of the opposite conductivity type, e.g., P body regions 14, P+ body contact regions 15, and P shield regions 16, as described further below. Source regions 17, e.g., N+ regions, are in mesa area M1 of epitaxial layer 12, above or in P body regions 14, and adjacent to gate structures in trench areas T1. Portions of body regions 14 in mesa areas M1 adjacent to gate trench areas T1 provide a vertical channel of trench MOSFET 100. A drain contact may be on the bottom of MOSFET 100, particularly on a bottom surface of N+ substrate 10, and an electrical contact between N+ substrate 10 and a metal contact pad/layer (not shown) could be ohmic. A Schottky contact at the drain side would make Power MOSFET 100 a high drain-source resistance (Rds) switch, which is generally not acceptable.

Different trench areas T1, T2, and T3 in MOSFET 100 may contain gate structures, electrical contacts, and/or dielectric above shield structures. In particular, poly shield regions 18 may be in all trenches areas T1, T2, and T3 and may contact underlying shield regions 16 in epitaxial layer 12, but the structures above poly shield regions 18 may differ in different trench areas T1, T2, and T3. In the illustrated implementation, each poly shield region 18 is a P+ polysilicon region and is laterally bounded by sidewall insulation 22, e.g., oxide, on the walls of the trenches in which the poly shield region 18 was formed. Some poly shield regions 18 are in "gate" trench areas T1 that also include overlying gate structures. Above polysilicon regions 18, the sidewalls of the gate trench areas Ti may be lined with a gate dielectric layer 20 often referred to as gate oxide 20, although gate dielectric layer 20 may contain an oxide, e.g., silicon dioxide ($SiO_2$), or another dielectric material, e.g., silicon nitride ($Si_3N_4$). Inter-poly dielectric spacers 24 are above respective poly shield regions 18 in the gate trench areas T1 and insulate P poly shield regions 18 from conductive gates 26. Conductive gates 26 may be formed using a heavily-doped polysilicon, e.g., N+ polysilicon, or a silicide material filling the remainder of the trenches above inter-poly dielectric spacers 24 in gate trench areas T1. In the exemplary embodiment, MOSFET 100 provides a P+ poly shield region 18 extending underneath each trench gate 26, and oxide spacers 22 on trench sidewalls laterally confine the P+ polysilicon regions 18.

An insulating layer 28, e.g., a borophosphosilicate glass (BPSG) layer 28, overlies epitaxial layer 12 and structures formed in the trench and mesa areas of epitaxial layer 12. Insulating layer 28 is patterned to provide openings or vias for electrical connections to underlying active regions. One or more layers of metal or other conductive material may fill the openings and vias in insulating layer 28 and may be patterned to provide interconnects and contact pads on a top surface of MOSFET 100. MOSFET 100 particularly includes a conductive adhesion material, such as titanium (Ti), titanium nitride (TiN), and Tungsten (W), that fills vias in MOSFET 100 and is patterned to create a source contact region 30 that is electrically separate from a gate contact region 38. A further layer of metal such as aluminum (Al) or copper (Cu) is on the adhesion layer and may be patterned the same as the adhesion layer, e.g., to define source metal 32 and gate metal 36, which include contact pads of MOSFET 100. A passivation layer 34, e.g., a layer containing silicon nitride ($Si_2N_3$), silicon dioxide ($SiO_2$), or polyamide, protects the surface of MOSFET 100 and is patterned to expose contact pad portions of metal 32 and 36 where external electrical connections to MOSFET 100 are desired.

FIG. 1A particularly illustrates a portion of trench MOSFET 100 including active cells and source metal 32 that connects to source regions 17 and also connects to P+ body contact regions 15 and P+ poly shield regions 18. Use of P+ body contact regions 15, rather than direct connections to P body regions 14, may make MOSFET 100 more robust under high current and high voltages, which may be induced by an inductive load. P+ body contact regions 15 may further make base to emitter shorting very low resistance to prevent triggering a parasitic NPN bipolar transistor in MOSFET 100. Electrical connections to P+ poly shield regions 18 may be made in one or more trench areas T2, which do not contain gate structures. As shown in FIG. 1A, a trench area T2 may be filled with a dielectric 25 surrounding a portion of conductive interconnect 30 that connects P+ poly shield region 18 to source contact 32. As described further below, contact to P+ poly shield regions 18 may alternatively be made through a trench area where the P+ polysilicon fills the trench. Poly shield regions 18 may all be part of a contiguous structure in all or multiple trenches of the device, or one or more of shield regions 18 may be separate from the other shield regions 18. Poly shield regions 18 have an ohmic contact to respective underlying shield regions 16, so that shield regions 16 and 18 are shorted to each other and to source regions 17 in MOSFET 100.

Figure 1B:
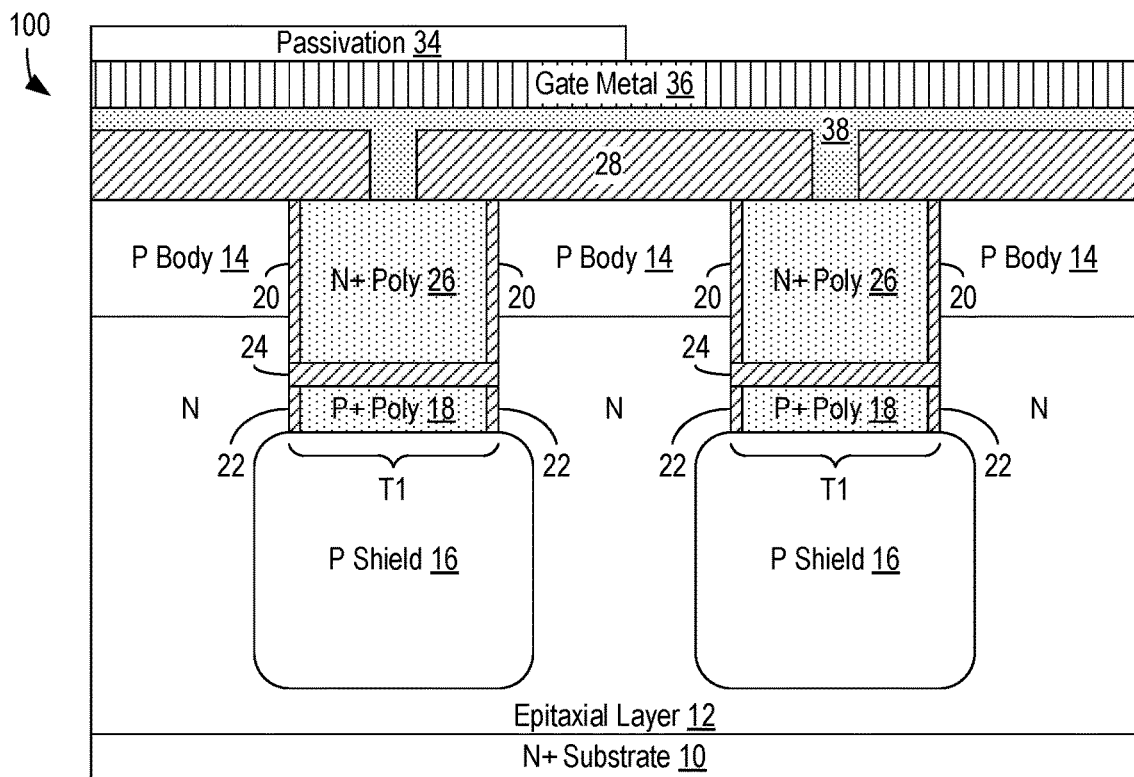
FIG. 1B illustrates a portion of the exemplary poly shield trench MOSFET including gate contacts and gate metal regions.

FIG. 1B illustrates a portion of P poly shield trench MOSFET 100 including gate metal 36 connected to conductive trench gates 26 through conductive interconnect 38.

Figure 1C:
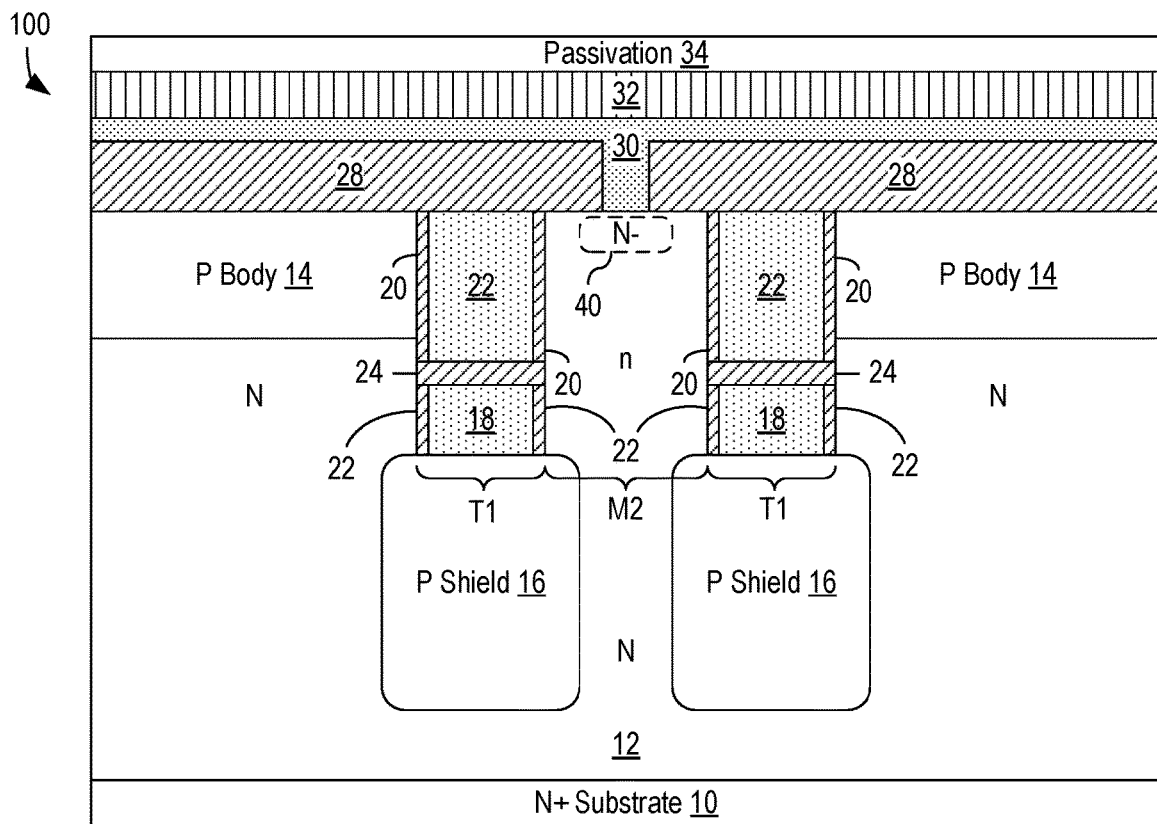
FIG. 1C illustrates a portion of the exemplary poly shield trench MOSFET including an integrated Schottky diode.

FIG. 1C illustrates a portion of trench MOSFET 100 including an integrated Schottky diode. In particular, as shown in FIG. 1C, a mesa area M2 of epitaxial layer 12 between gate trench areas T1 is not doped to create a P body region but is instead doped to provide an N– region 40 that creates a Schottky barrier at the interface with adhesion metal region 30. The resulting Schottky diode may be contacted to source regions 17 on top, e.g., through metal regions 30 and 32.

Figure 1D:
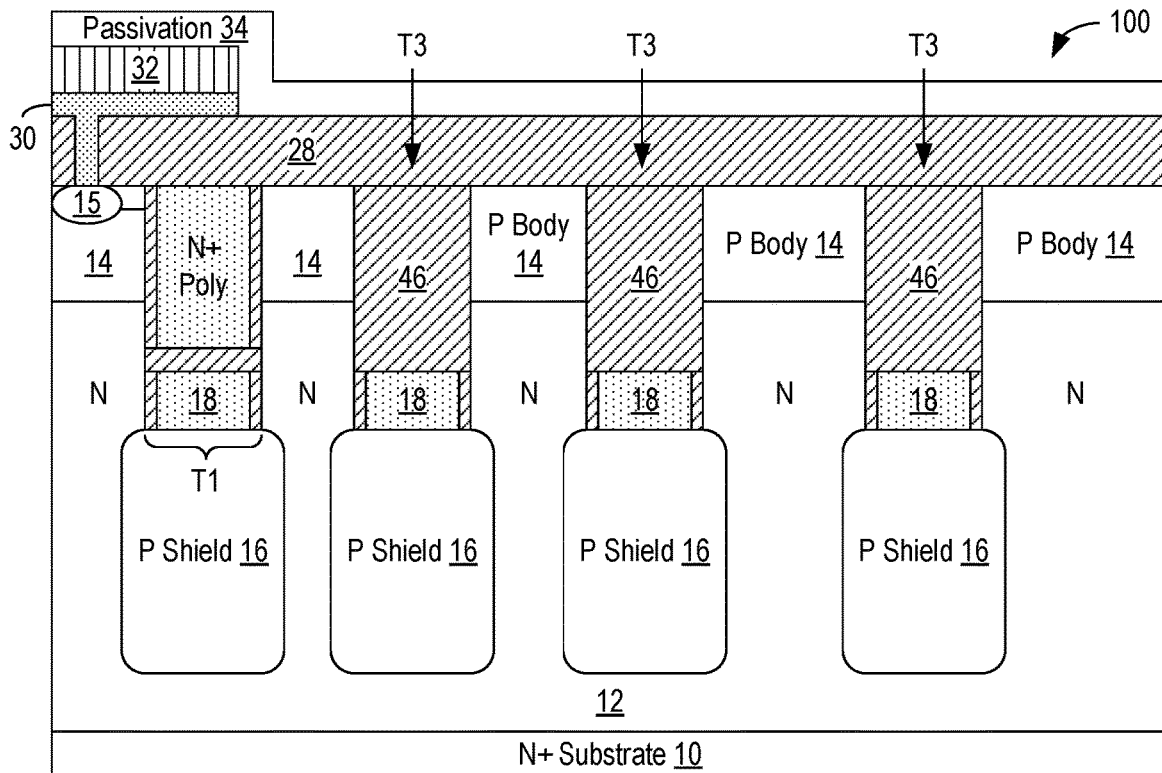
FIG. 1D illustrates an edge termination area of the exemplary poly shield trench MOSFET including oxide filled trenches and buried polysilicon shields.

FIG. 1D illustrates a portion of P poly shield trench MOSFET 100 including part of an edge termination area. The edge termination area includes trench areas T3 of trench rings that are filled with oxide or other dielectric 46 and buried P+ poly shield regions 18. The edge termination area of MOSFET 100 generally contains structure that resists or prevents breakdown at cut edges of the die containing MOSFET 100, and without proper edge termination structure, MOSFET 100 would breakdown at a lower voltage than required. In particular, the number, content, and spacing of trench ring areas T3 around the edges of MOSFET 100 may be chosen and implemented to maintain the breakdown voltage achieved in active cell areas.

Figure 2A:
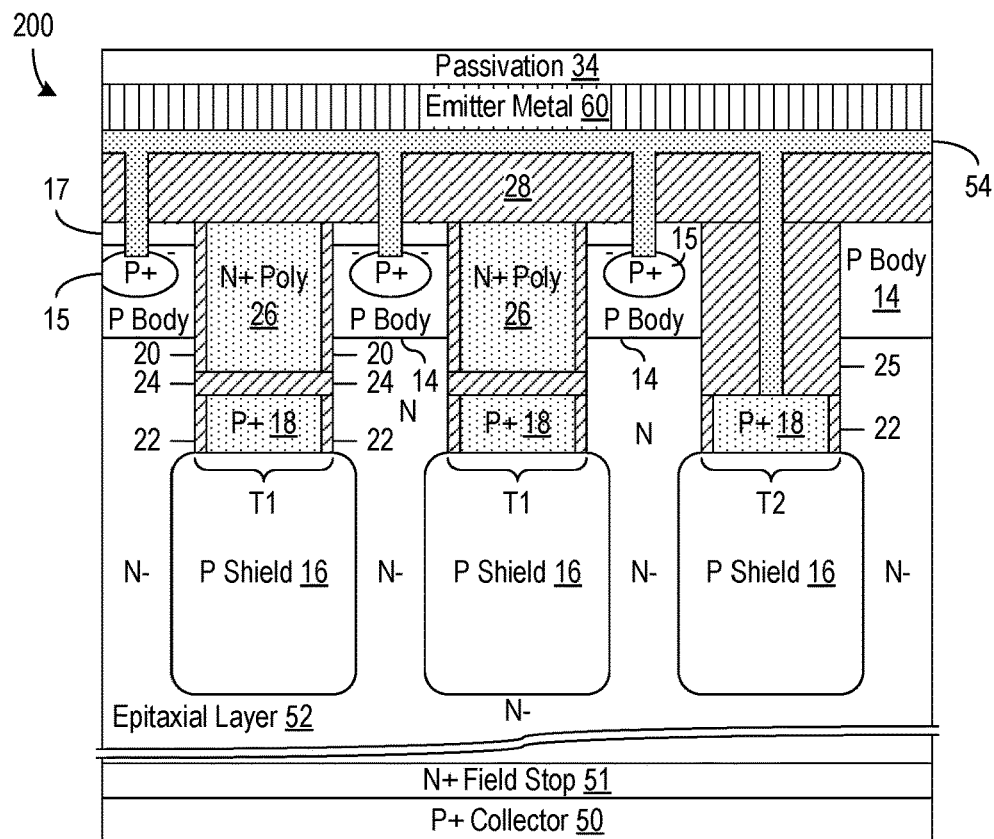
FIG. 2A illustrates a portion of an exemplary trench IGBT including a poly shield trench structure and active cells with a selective P poly shield contact and floating poly shields.
Figure 2B:
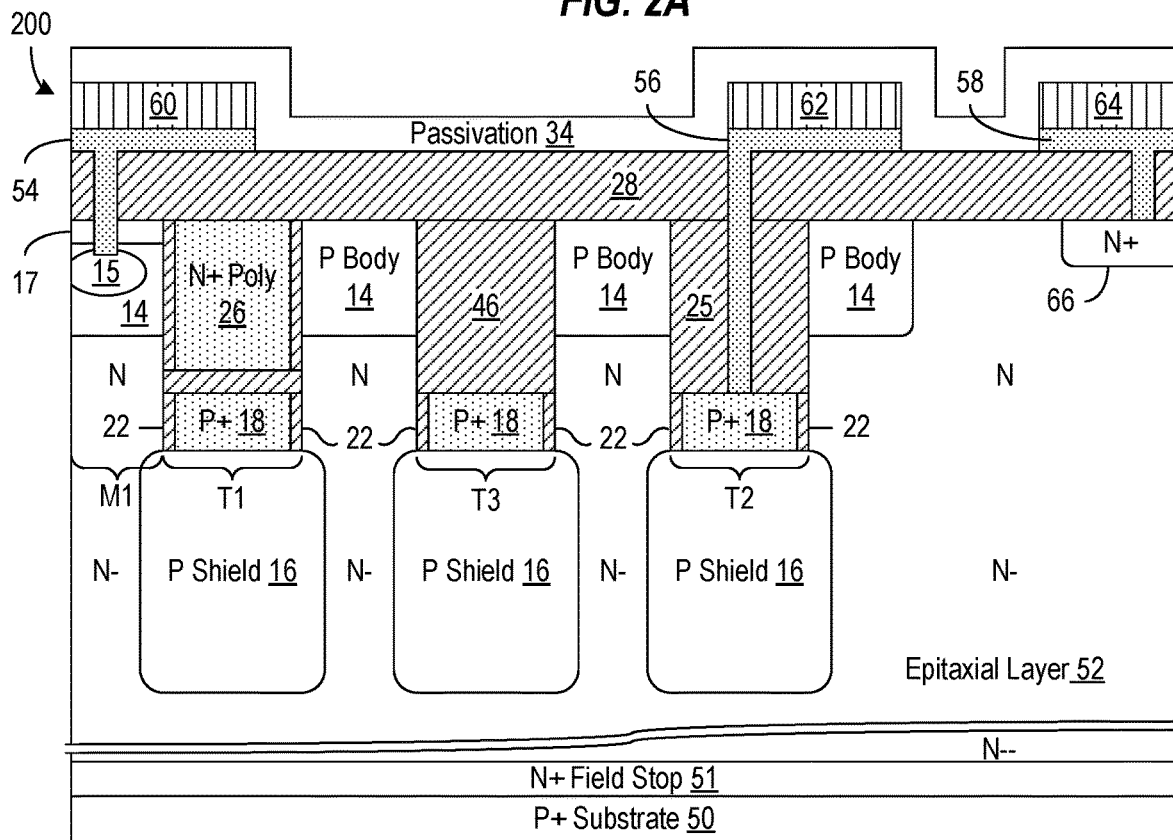
FIG. 2B illustrates a portion of the exemplary poly shield trench IGBT edge termination area.

FIGS. 2A and 2B show cross-sections of the active cell and termination regions of a trench IGBT 200 according to another exemplary embodiment of the present invention. IGBT 200 includes a collector 50, e.g., a P+ silicon substrate, on which layers 51 and 52 of the opposite conductivity type from collector 50 are formed. In the example of FIGS. 2A and 2B, layer 51 is an N+ field stop layer, and layer 52 is an epitaxial layer with a doping concentration that increases from a low concentration N– adjacent to N+ field stop 51 to a N doping at a top surface of epitaxial layer 52. P+ collector 50, N-type layers 51 and 52, and P-type body region 14 form active regions of a vertical PNP bipolar transistor. IGBT 200 also includes a field effect transistor including source regions 17, conductive gates 26, gate oxide 20, and channels in P body regions 14, and structures forming the field effect transistor may be similar or identical to structures described above with reference to MOSFET 100 of FIGS. 1A to 1D. In particular, P body regions 14 adjacent to trench gates 26 in gate areas T1 of epitaxial layer 52 provide a vertical P channel of the field effect transistor, with the P channel being between N-type source regions 17 and N-type layer 52, and the voltage on gates 26 can control the current through the field effect transistor to the base of the vertical PNP bipolar transistor.

IGBT 200 further includes shield structures that may be substantially identical to the shield structures described above with reference to FIGS. 1A to 1D. In particular, the shield structure includes P+ polysilicon regions 18 that are laterally bounded by oxide spacers 22 and further includes P shield regions 16 in epitaxial layer 52, i.e., in the drift region of IGBT 200. P shield regions 16 and the surrounding drift region have majority charge carriers of opposite conductivity types but generally have substantially the same charge carrier density. In IGBT 200, shield regions 16 and 18 are generally not shorted to source regions 17 as is the case with MOSFET 100 but may be floating or may have a separate contact for independent control of the voltage applied to at least some of the shield regions 16 and 18. More specifically, for IGBT 200, P poly shield regions 18 and underlying shield regions 16 in an active device area may be fully floating to minimize potential drop (Vce) across the emitter and collector electrodes. Alternatively, some of P poly shield regions 16 and underlying shield regions 18 in IGBT 200 may be ohmically shorted to the emitter electrode, which may improve switching performance and/or optimized Vce.

FIG. 2A illustrates a portion of poly shield trench IGBT 200 including active cells with selected poly shield contact from emitter metal 54 and 60 to P+ poly shield region 18 in a trench area T2. P+ poly shield regions 18 in other trench areas may not be ohmically connected to emitter metal 54 and 60 and may be fully floating or may be ohmically connected to an independently biased external contact.

FIG. 2B illustrates a portion of poly shield trench IGBT 200 in an edge termination area. As shown, active cells include emitter regions 14 and 15 that are in a mesa area M1 adjacent to a trench gate area T1 and are connected to emitter metal 60 through metal interconnect 54. Shield regions 16 and 18 associated with the trench gate area T1 may have an electric potential that floats. Some trench areas T3 that do not contain a trench gate 26 may contain shield regions 16 and 18 that float. Other trench areas T2 that do not contain a trench gate 26 may contain shield regions 16 and 18 electrically connected through an interconnect 56 to a separate metal field plate 62 with a contact to the last floating shield regions 16 and 18. A further metal field plate 64 electrically connects through an interconnect 58 to an N+ channel stop 66. Channel stop 66 serves to prevent depletion from reaching to sawn die edges, which could otherwise cause high leakage current during high voltage blocking mode.

In one embodiment of IGBT 200, shield columns, each of which includes P-type semiconductor region 16 with an overlying P poly shield region 18 that is laterally confined with oxide spacers 22 and is beneath a trench gate 26 in active device area of IGBT 200, float to minimize voltage drop Vce across the collector and emitter electrodes. To optimize Vce and switching performance of IGBT 200, a number of the shield columns may be shorted electrically to emitter electrode 60 on the top surface of IGBT 200. In particular, the shield columns adjacent to a gate bus and pad areas and in the first trench ring enclosing the active device cells may be shorted to emitter electrode 60.

Figure 3A:
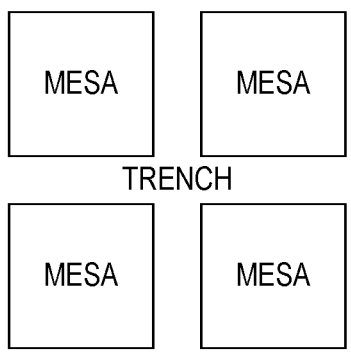
FIGS. 3A to 3E show top or plan views of alternative active-cell trench patterns respectively including square, circular, rectangular, stripe, and hexagonal trench cell patterns.
Figure 3B:
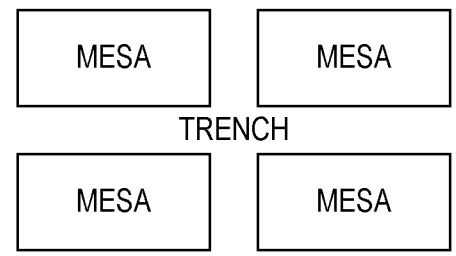
Figure 3C:
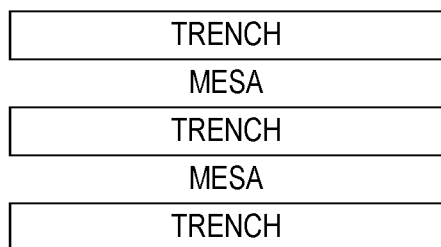
Figure 3D:
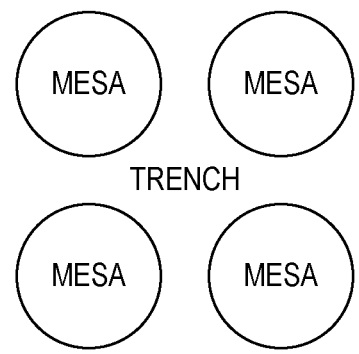
Figure 3E:
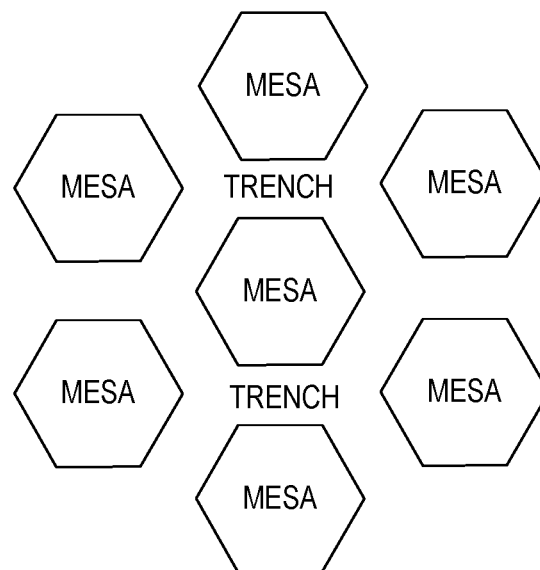

FIGS. 3A to 3E show top views of alternative examples of active cell patterns for trench devices such as MOSFET 100 and IGBT 200 described above. FIG. 3A particularly shows a layout including square mesa areas separated by a grid of trench areas. FIG. 3B shows a layout including rectangular mesa areas separated by a grid of trench areas. FIG. 3C shows a layout including stripe-shaped trench areas separated by rows of mesa areas. FIG. 3D shows a layout including circular mesa areas surrounded by trench areas. FIG. 3E shows a layout including hexagonal mesa areas separated by a honeycomb-shaped trench area. Other cell patterns or layouts could also be employed. For example, in the example active cell patterns, areas designated for mesas and areas designated for trenches could be interchanged to provide multiple separated or independent trenches.

Figure 4:
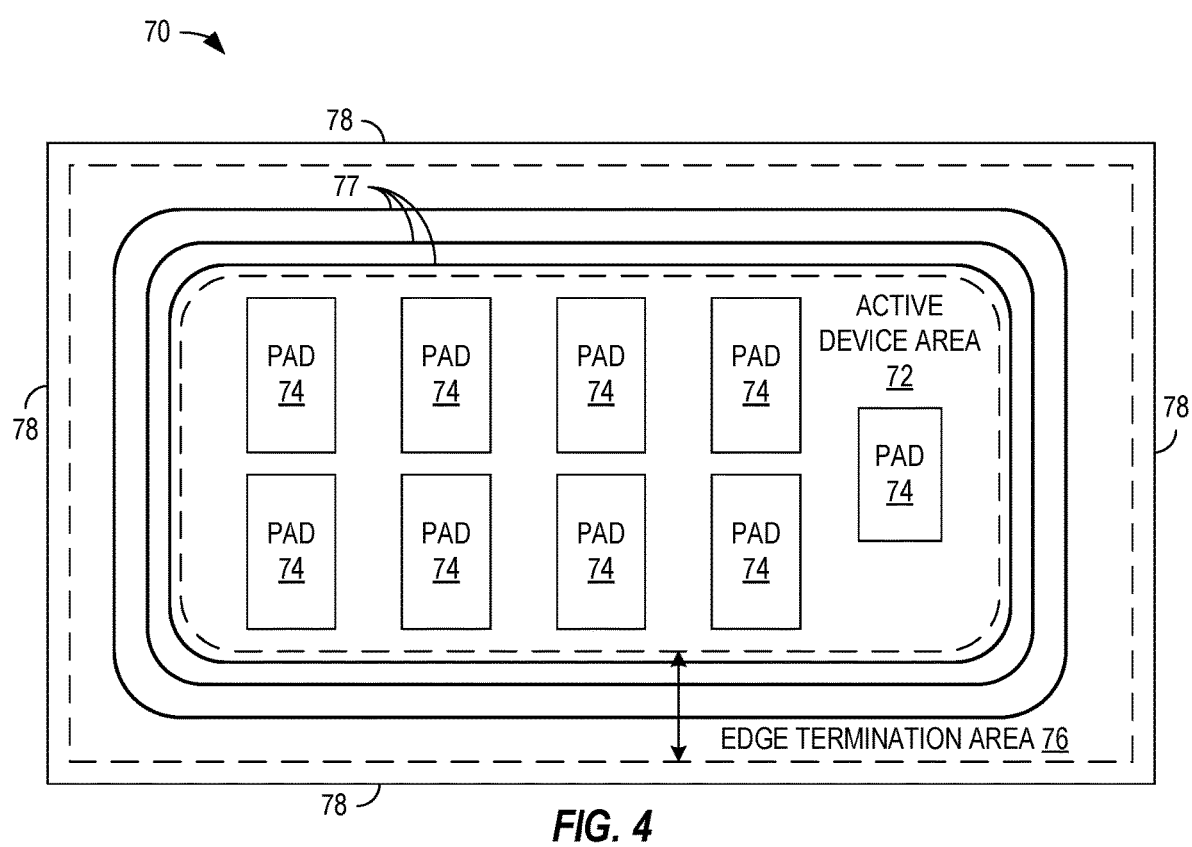
FIG. 4 shows a top view of a trench semiconductor device according to one implementation of the present invention.

FIG. 4 shows a top view of a wafer area 70 corresponding to a trench device such as MOSFET 100 or IGBT 200. Wafer area 70 includes an active device area 72 containing the active cells of the trench device. The active cells in active device area 72 may include trenches and mesas with a layout or pattern such as described above with reference to FIGS. 3A to 3E. The active cells are generally covered by passivation, except where pads 74 are exposed for electrical connections to the trench device. An edge termination area 76 is around active device area 74 and is between active device area 72 and saw street areas 78. Edge termination area 76 generally contains one or more trench rings that contain termination structures that prevent edge effects such as current leakage that might otherwise occur at cut edges of the trench device. In particular, a dicing operation may cut the wafer along saw street areas 78 to separate individual trench device chips or dice.

Tables 1A and 1B list masking steps respectively for a six-mask fabrication process and a seven-mask fabrication process for a poly shield trench MOSFET such as MOSFET 100 with a reliable termination structure for devices with breakdown voltage below about 100V. The two process flows differ in that seven-mask process employs a P Body mask (Mask 2B process) not used in the six-mask process.

TABLE 1A

| MASK | PROCESS STEP |
| --- | --- |
| 1 | Trench Etch |
| 2 | IPD (Inter Poly Dielectric) |
| 3 | N+ Source |
| 4 | Contact |
| 5 | Metal |
| 6 | Passivation |

TABLE 1B

| MASK | PROCESS STEP |
| --- | --- |
| 1 | Trench Etch |
| 2 | IPD (Inter Poly Dielectric) |
| 2B | P Body |
| 3 | N+ Source |
| 4 | Contact |
| 5 | Metal |
| 6 | Passivation |

The fabrication processes of Table 1A or 1B may begin with a trench etch mask process. More particularly, a starting wafer for a power MOSFET may include an N++ substrate 10 with an overlying epitaxial layer (or drift region) 12. The thickness and doping concentrations of substrate 10 and epitaxial layer 12 may be selected based on the targeted power MOSFET breakdown voltage. An oxide ($SiO_2$) layer 80 and a nitride ($Si_3N_4$) layer 82 are deposited on the surface of epitaxial layer 12 to a thickness range of about 1 to 2 microns each. Next, a photoresist layer (not shown) may be deposited on top of nitride layer 82 using a spin coating process. The photoresist is selectively exposed to UV light and then developed to form a photoresist trench mask. The photoresist trench mask pattern may include openings for P+ body contact trenches 84 and gate trenches 86. Accordingly, the process may be referred to as a self aligned trench gate and P+ body contact trench process. Alternative processes in which contact trenches are not self aligned with gate trenches are described further below.

The trench mask pattern is transferred to the silicon surface. More specifically, after UV light exposure and the development of photoresist layer, the photoresist on the wafer surface may be used as a mask to etch oxide and nitride layers 80 and 82. Using the remaining portions of oxide/nitride layer 80/82 as a mask (a hard mask), epitaxial layer 12 is etched. In an exemplary configuration, gate trenches 86 may be substantially wider than the body contact trenches 84. For example, the gate-trench width may be about 0.3 to 1 micron, and body contact trench may be about 0.1 to 0.5 micron wide in one implementation. The desired depth of the body contact trenches 84 may be about 0.4 to 0.8 micron, and the desired depth of the self aligned gate trenches 86 may be about 1 to 3 microns. To provide deeper gate trenches 86, body contact trenches 84 may be filled with oxide 88 after the etch process etches trenches 84 and 86 to a desired depth for body contact trenches 84. Oxide 88 then remains in body contact trenches 84, while the etching process continues to further deepen gate trenches 86.

Figure 5A:
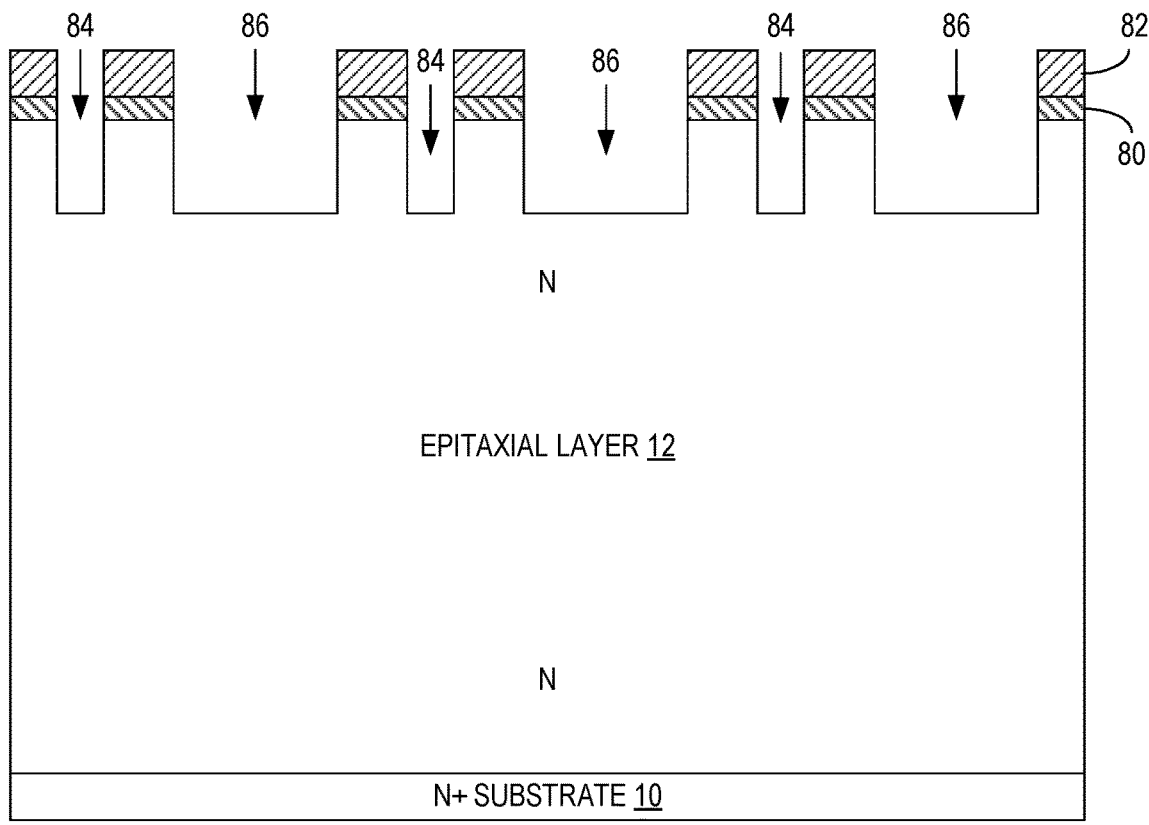
FIGS. 5A to 5U show cross-sectional views of structures formed during a process for fabricating a P poly trench MOSFET device with gate trenches and source contact trenches that are self-aligned.
Figure 5B:
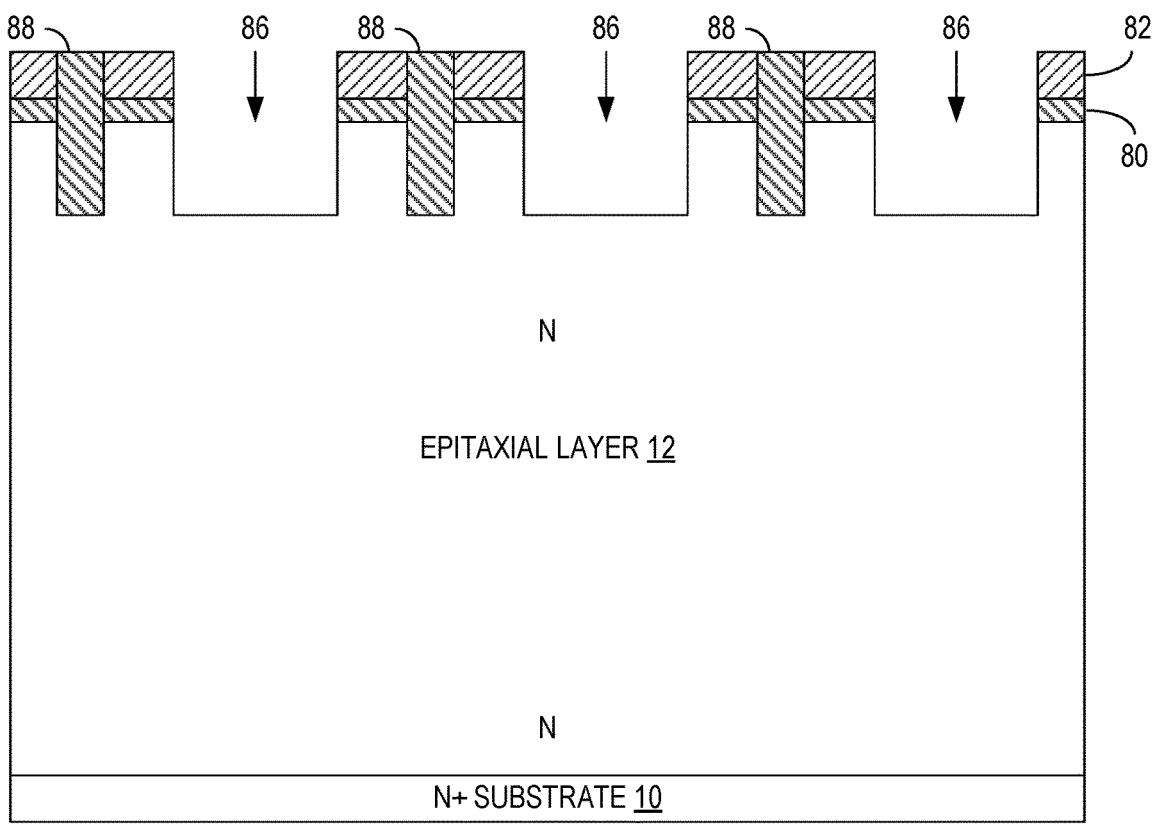
Figure 5C:
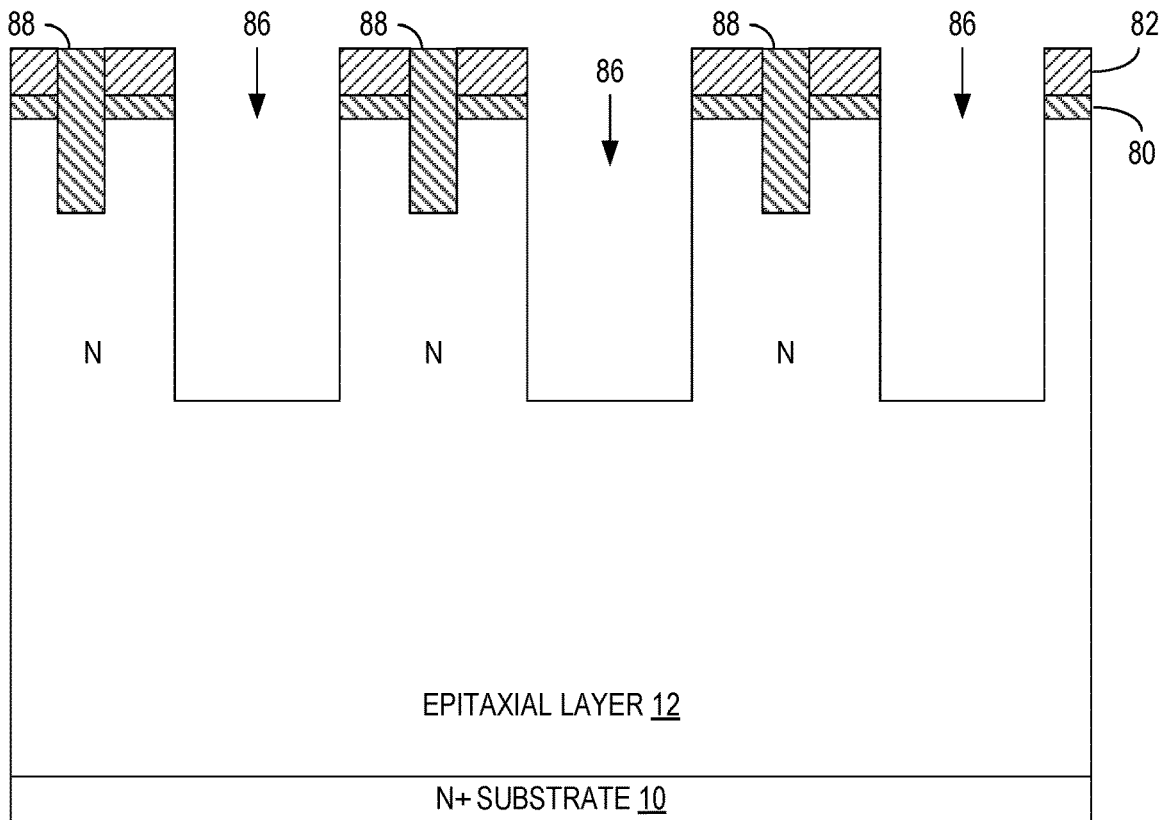

A two-step trench etch process may include a first etch step that etches areas of epitaxial layer 12 down to the depth of the body contact trench, i.e., about 0.5 micron, as depicted in FIG. 5A. Next, an oxide layer may be deposited to fully fill body contact trench 84 and partially fill gate trenches 86. An isotopic etch may be used to remove the oxide from the wider gate trenches 86 to expose the bottom of the gate trenches 86 while leaving body contact trenches 84 filled with oxide 88 as shown in FIG. 5B. As shown in FIG. 5C, the second etch step may selectively etch epitaxial (silicon) layer 12 to further deepen gate trenches 86 down to the targeted depth without etching oxide-filled body contact trenches 84 any further. The mesa regions between trenches 84 and 86 are protected by oxide and nitride layers 80 and 82 during the trench etch processes.

Figure 5D:
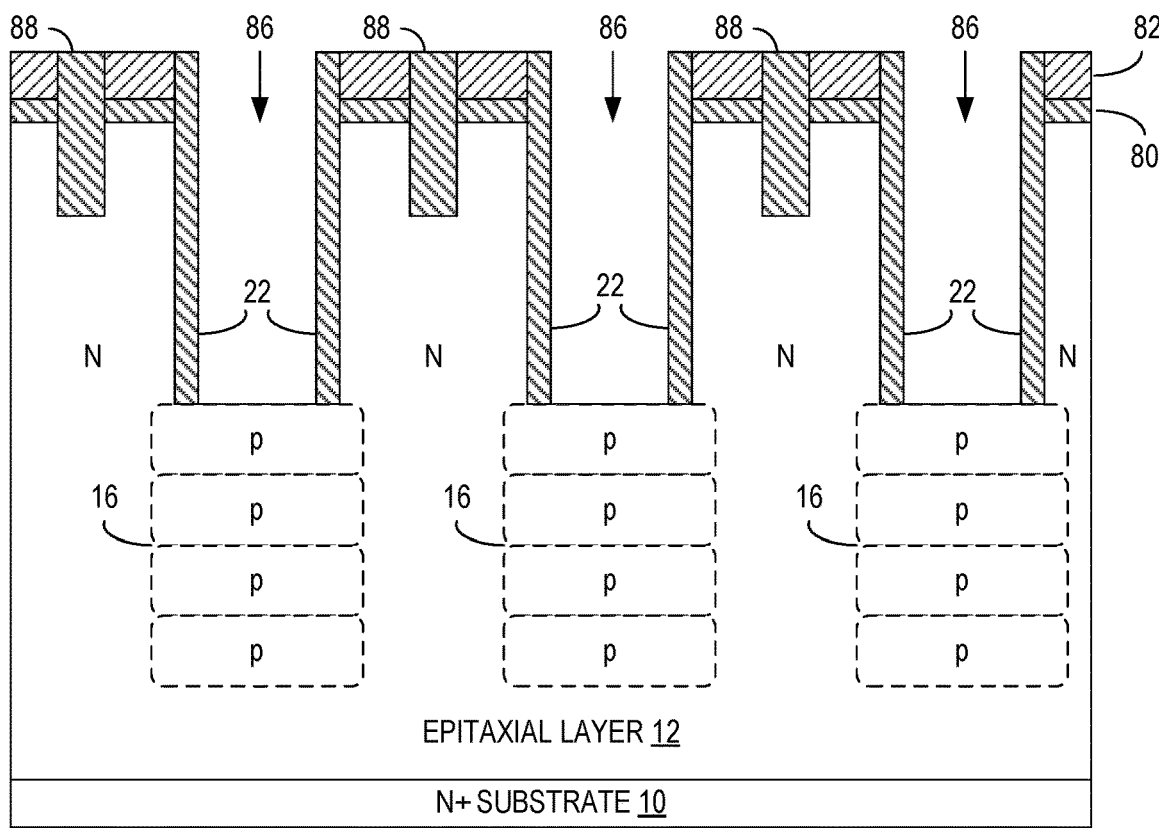
Figure 5E:
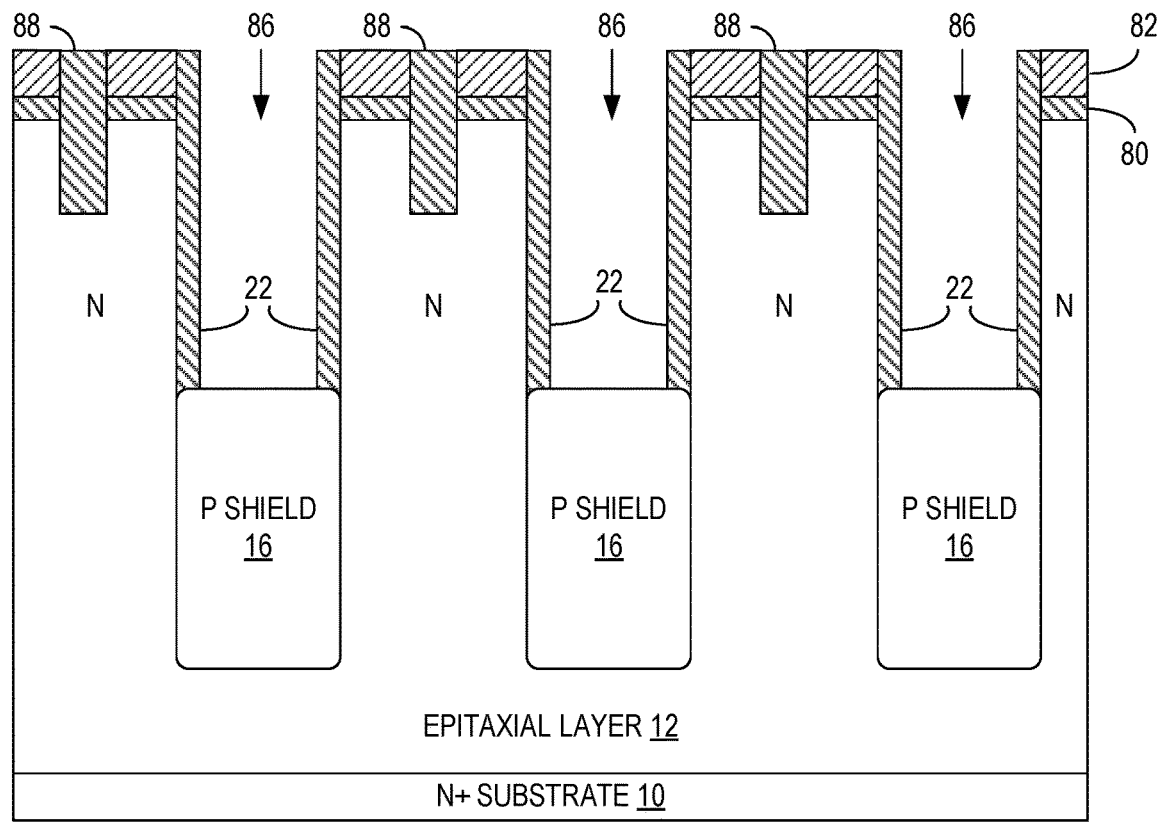

FIG. 5D illustrates sidewall spacer oxide 22 that may be deposited or thermally grown to a thickness in a range from about 0.05 to 0.15 microns on the sidewalls of gate trenches 86. Spacer oxide 22 laterally limits the size of P poly shield regions that are subsequently formed in trenches 86 and prevents lateral diffusion of boron from the P polysilicon in trenches 86. In one embodiment, as shown in FIG. 5D, P shield regions 16 may be formed under gate trenches 86 by multiple high energy and high dose ion implantation steps through gate trenches 86, and sidewall spacer oxide 22 also confines the implantations. During the implantation process, ion implant doses may be in the range of about 5 e11 to 1e13 cm$^{-2}$ and the ion implant energy may be in the range of about 3 Mev to 30 Key. An alternative process may form shield regions 16, as illustrated in FIG. 5E, by etching deeper trenches 86 and growing P type epitaxial silicon regions 16 from the bottom of the deeper trenches 86 up to the bottom end of oxide spacers 22. However shield regions 16 are formed, P-type, e.g., boron implanted, polysilicon may be deposited on top of P type epitaxial regions 16 and may entirely fill trenches 86.

Figure 5F:
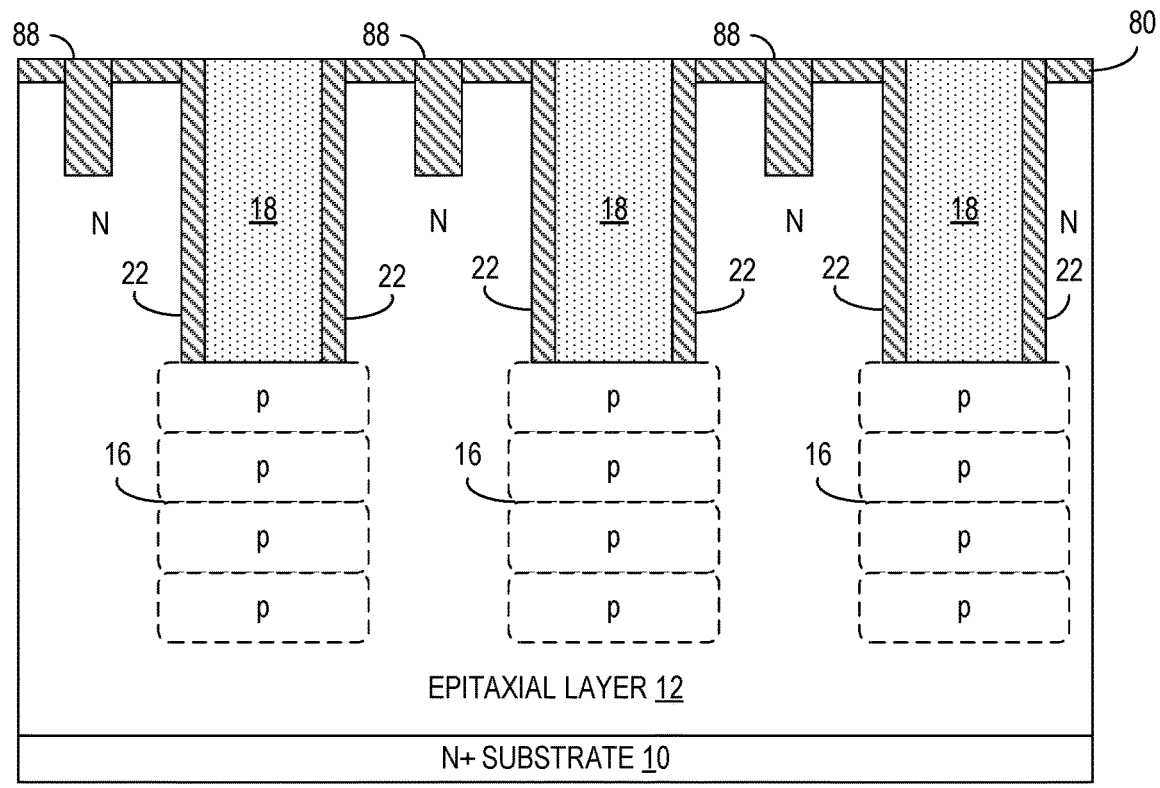
Figure 5G:
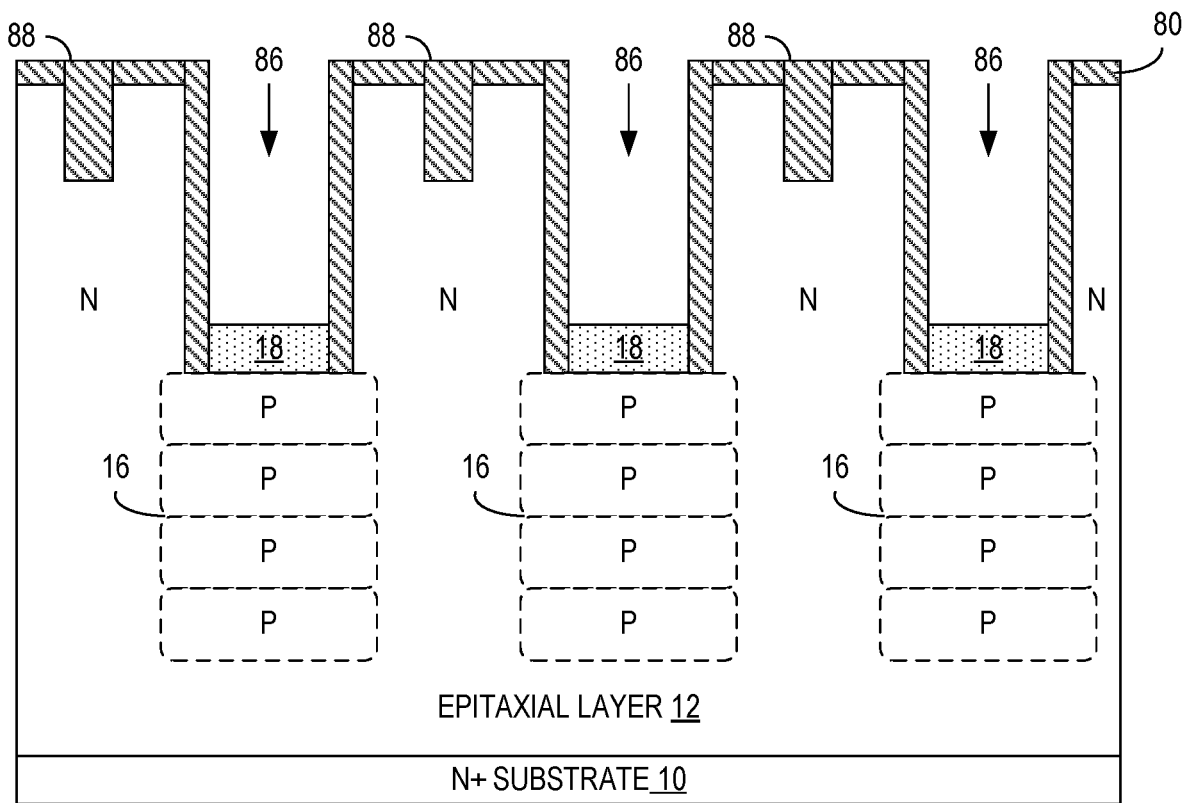

Polysilicon shield regions 18 may initially be deposited to a thickness in a range between 0.25 and 1.0 micron or may fill gate trenches 86. FIG. 5F illustrates polysilicon 18 filling gate trenches 86 after the top surface of the structure is planarized, for example, using Chemical-Mechanical Polishing (CMP), and after silicon nitride layer 82 is removed. FIG. 5G illustrates the structure after the partial removal of polysilicon 18. Polysilicon 18 in trenches 86 may be etched down to 0.2 to 1.0 micron thickness with respect to the bottoms of gate trenches 86. (Alternatively, a mask may control the polysilicon etch process to etch down polysilicon 18 in some areas of gate trenches 86 and to leave polysilicon 18 filling some other areas of gate trenches 86.) A boron implant dose to the P polysilicon 18 may be in the range from about 5e12 to 1e15 cm$^{-2}$ and using energy of about 30 to 60 KeV. Alternatively, in-situ doping is possible and desirable, but in-situ doping of P-type polysilicon is less common than in-situ doping of N+ polysilicon.

Figure 5H:
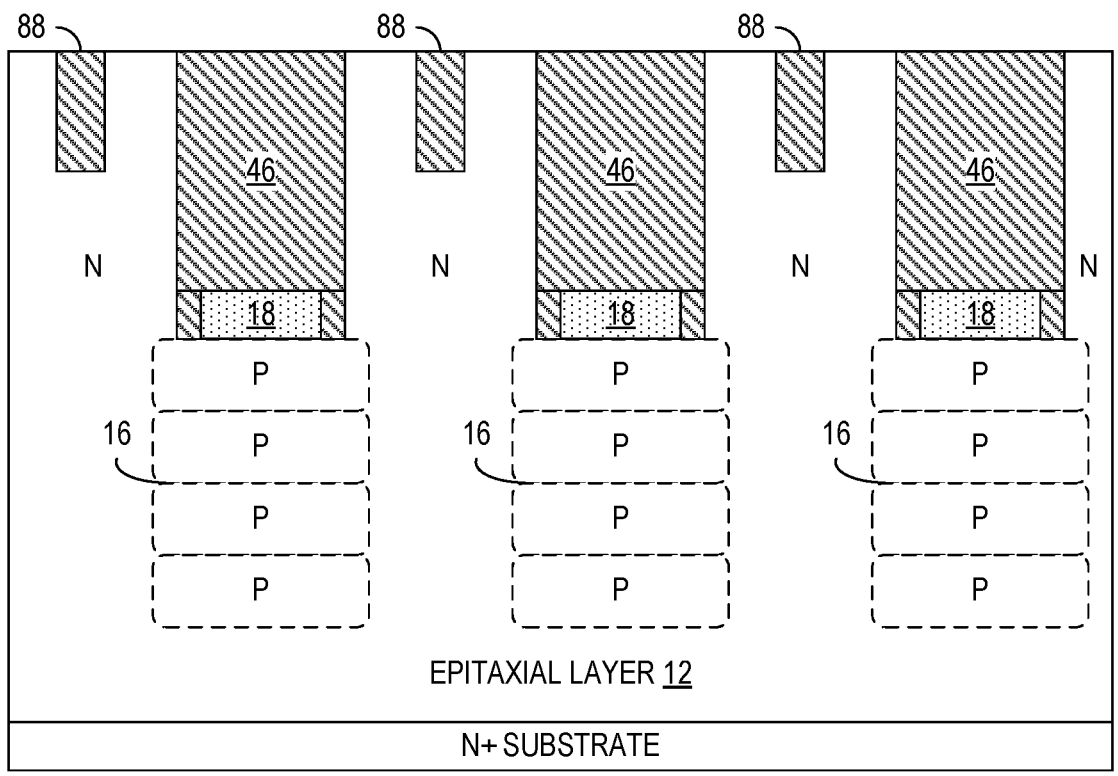

A High Density Plasma (HDP) process may deposit an oxide (SiO$_2$) layer 46, which will be referred to as HDP oxide 46, on P polysilicon regions 18 in gate trenches 86. HDP oxide 46 may fully fill gate trenches 86, i.e., HDP oxide 46 may fill the gaps between oxide spacers 22 above P polysilicon regions in gate trenches 86. A planarization process, e.g., CMP, can remove oxide layer 80 and upper portions of oxide 88 and HDP oxide 46, resulting in a planar wafer surface. FIG. 5H illustrates the planar wafer surface including the exposed oxide surfaces in contact and gate trenches 84 and 86 being coplanar with the top surface of epitaxial silicon layer 12 in which trenches 84 and 86 were formed, which completes the Mask 1 process.

Figure 5I:
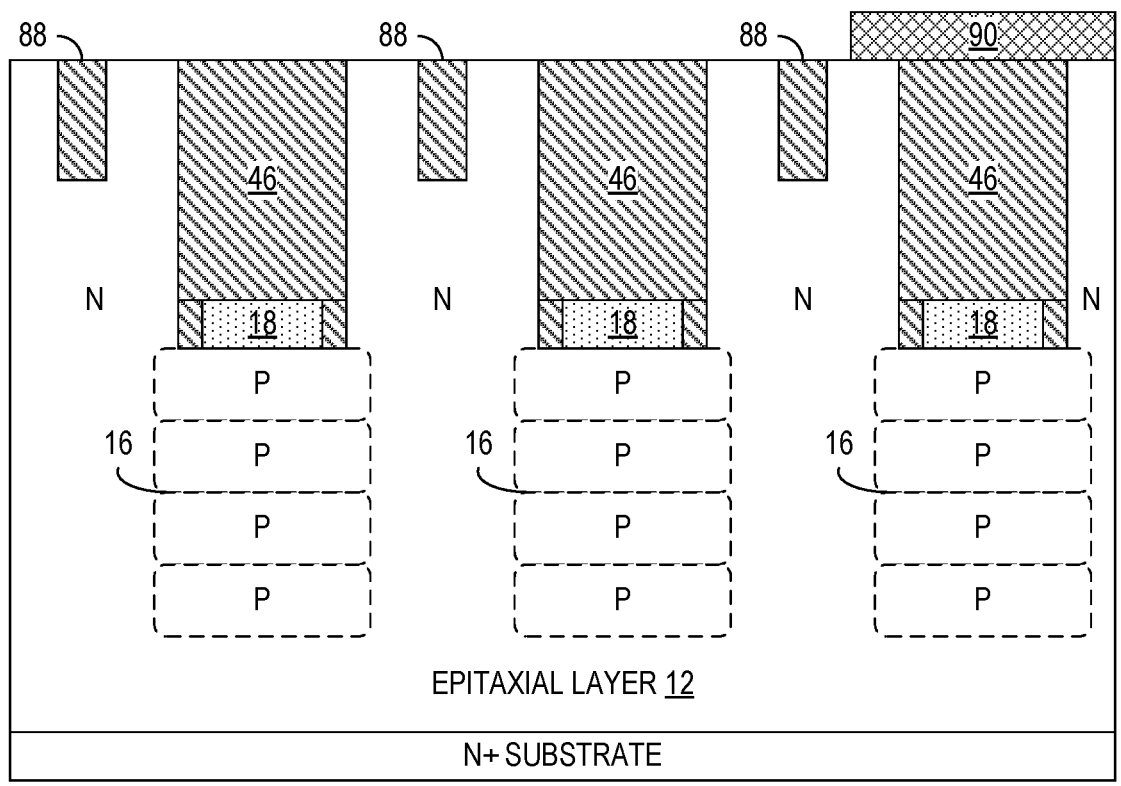
Figure 5J:
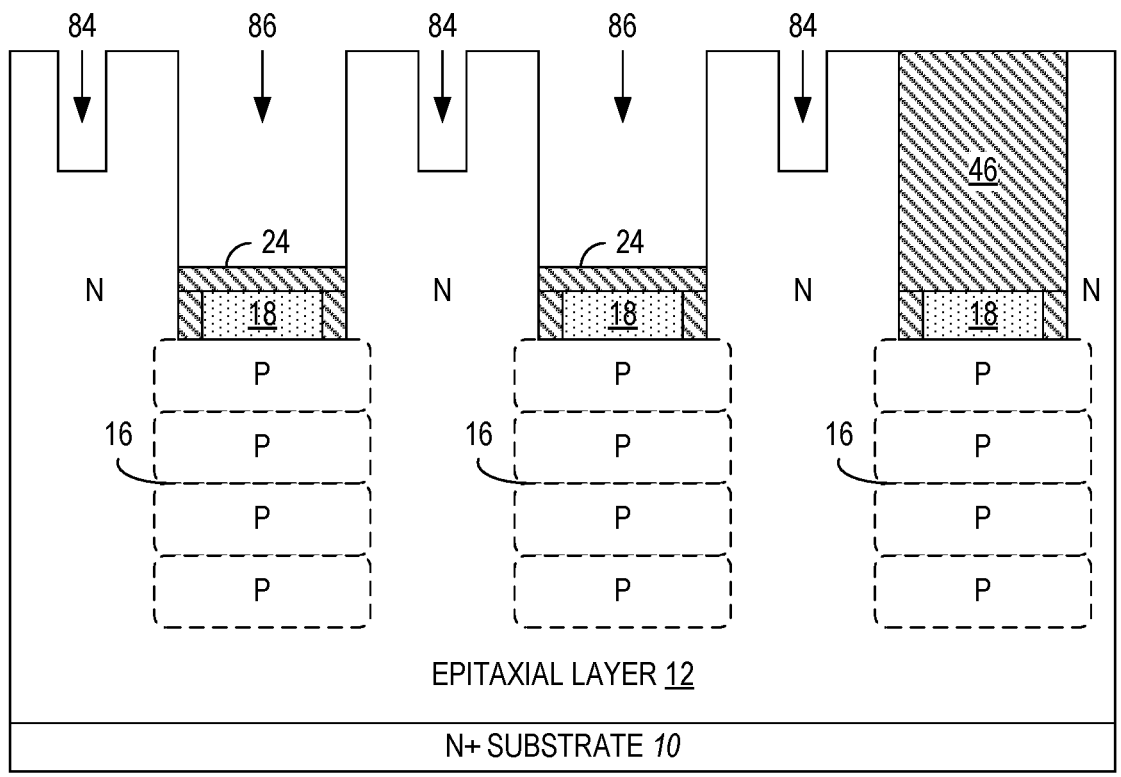
Figure 5K:
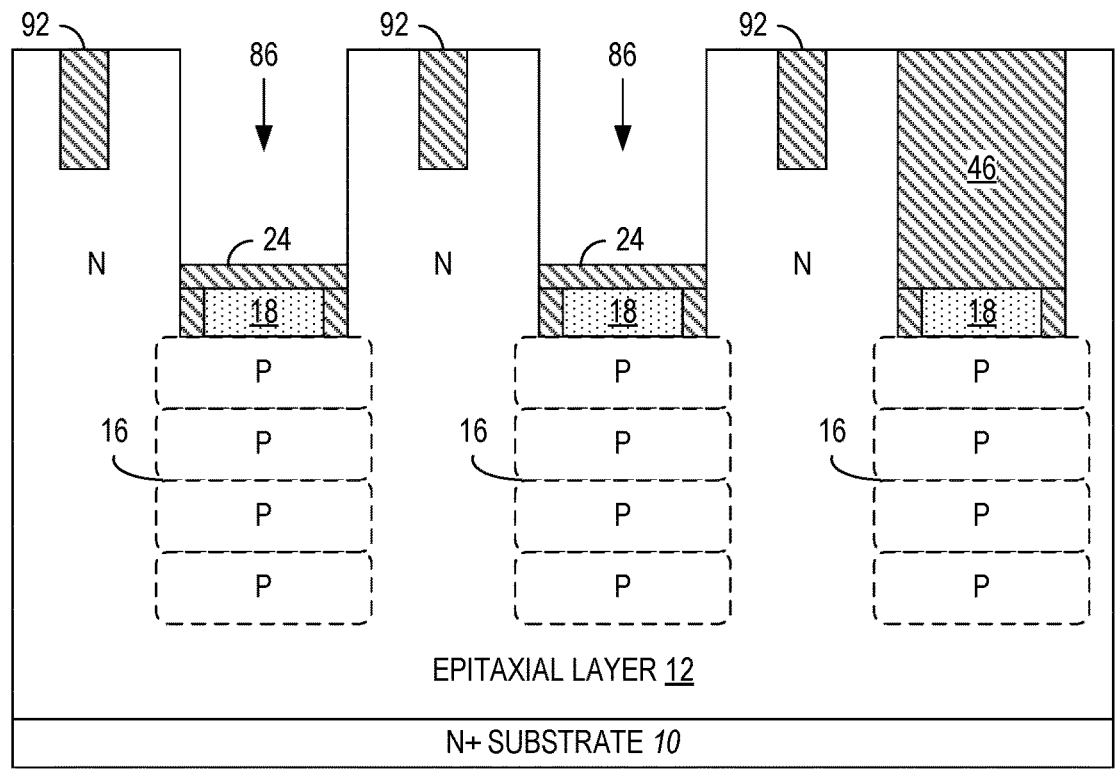

A Mask 2 process employs an inter poly dielectric (IPD) mask. For the Mask 2 process, photoresist may be first applied to the planar wafer surface of FIG. 5H. The photoresist is patterned to form a photoresist mask 90 that blocks etching of HDP oxide 46 from certain gate trench areas as depicted in FIG. 5I. As shown in FIG. 5J, in the next step, HDP oxide 46 filling the exposed body and gate trenches 84 and 86 may be etched to a controlled depth. In particular, HDP oxide 46 in exposed trenches 86 may be etched down to a thickness range of about 0.05 to 0.3 micron on top of P poly shield regions 18 to leave inter-poly dielectric spacers 24. The oxide etch may fully or partially remove oxide 88 from body contact trenches 84. Next, an oxide layer 92 may be deposited thick enough to fill body contact trenches 84, but not completely fill the wider gate trenches 86. Any oxide deposited inside gate trenches 86 may be etched isotropically to remove oxide from the sidewalls of gate trenches 86 and provide the structure shown in FIG. 5K.

Figure 5L:
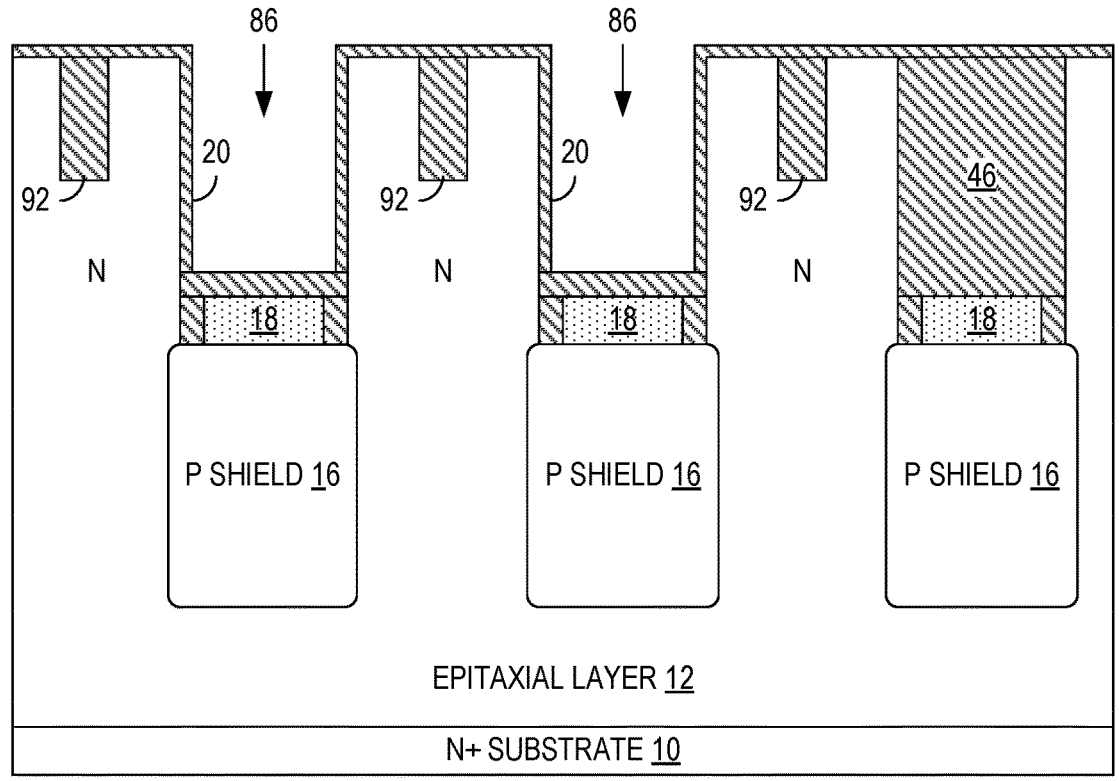
Figure 5M:
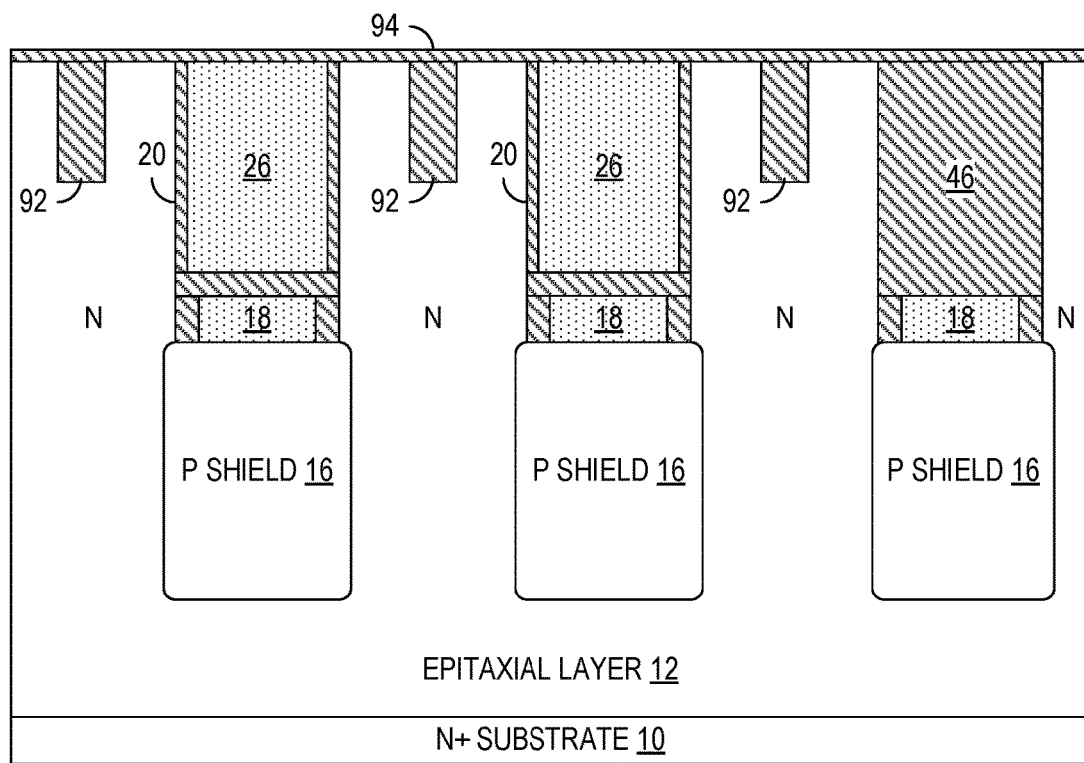

FIG. 5L illustrates the structure after cleaning of the wafer and growth of a gate oxide 20 to a thickness in the range of about 150 to 1500 Å (angstroms) at a temperature in the range from 1000 to 1100° C. The temperature of the oxide growth may diffuse dopants implanted to form P shield regions 16, making P shield regions 16 more uniform, but the process temperature is preferably chosen (lower) to minimize lateral diffusion of boron from P shield regions 16. Next, N+ doped gate polysilicon 26 may be deposited to fill the remainder of gate trenches 86, which may be followed by planarizing gate polysilicon 26 either using CMP or etching to form a flat top surface of the wafer. Next, a screen oxide 94 for the ion implantation may be deposited or grown in a thickness range of about 100 to 300 Å on the wafer surface as shown in FIG. 5M.

A P body mask is generally not required for fabrication of a trench MOSFET having a breakdown voltage lower than about 100 V. Implantations with multiple energies and doses of boron or other P-type dopant may form P body regions 14 in epitaxial layer 12. The body implant process may be followed by damage removal and boron activation by using Rapid Thermal Activation (RTA) at about 1000° C. The Mask 2 (IPD mask) process may thus provide a structure as illustrated in FIG. 5N.

Figure 5N:
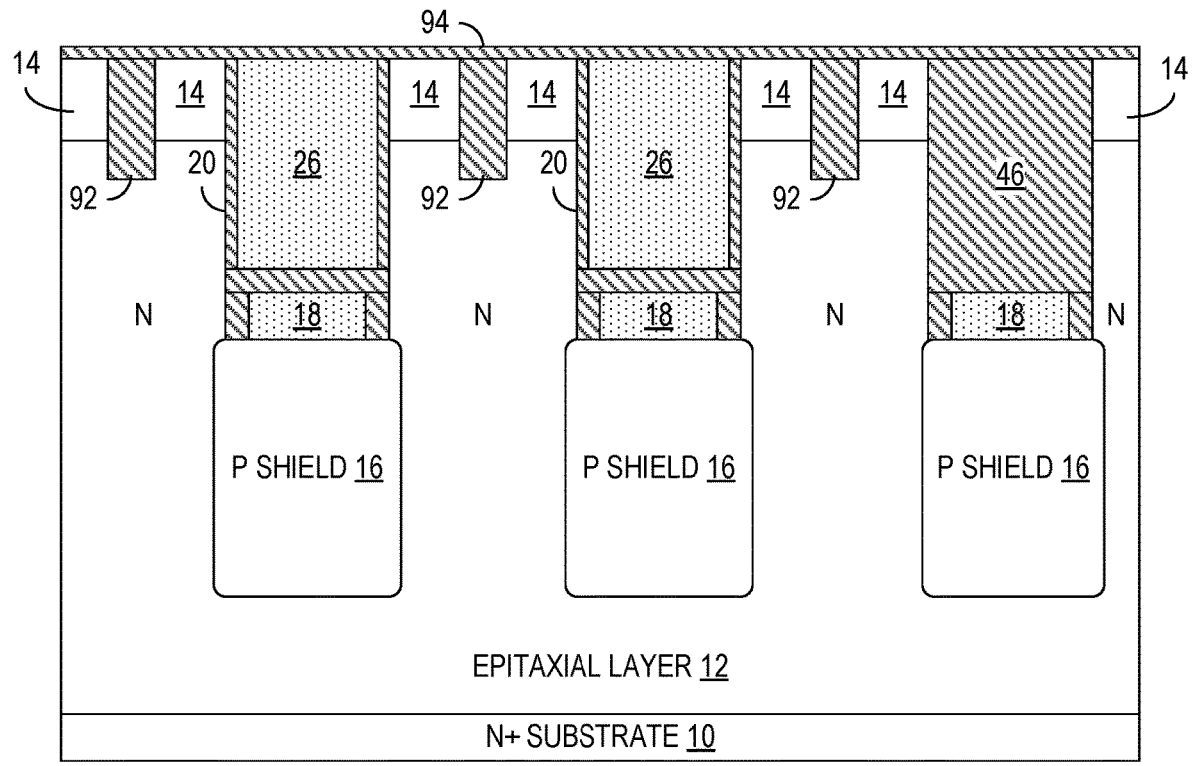
Figure 5O:
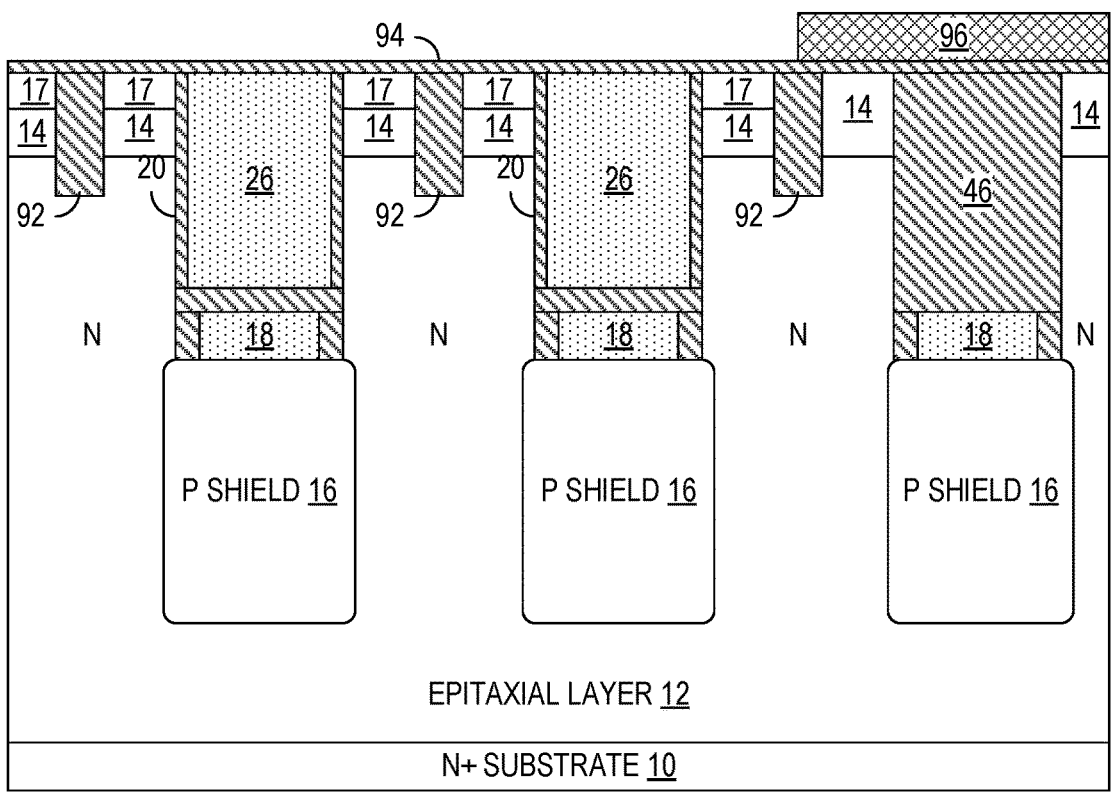

A Mask 3 or N+ source/emitter block mask process may begin with the structure of FIG. 5N. The Mask 3 process includes forming a photoresist mask 96 to control implantation of arsenic or other N-type dopant that forms source regions 17. Photoresist mask 96 blocks the implantation of the N-type dopant from certain portions of the device such as the edge termination area and gate pad regions. The device structure after N+ ion implants is illustrated in FIG. 5O. As shown, N+ ion implants form source regions 17, e.g., N+ source regions, in P body regions 14. As described further below, P body regions 14 and N+ source regions 17 will ohmically contact a top electrode, i.e., the source electrode.

Figure 5P:
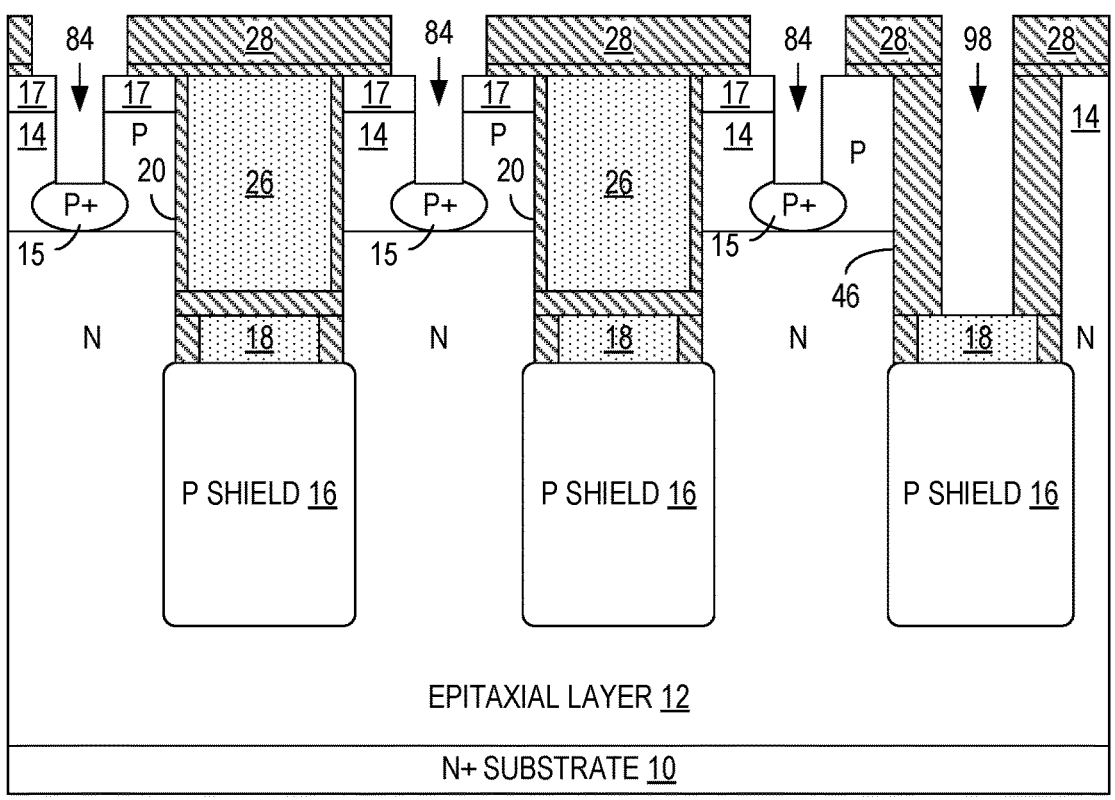

After removing photoresist mask 96, a BPSG layer 28 may be deposited to a thickness in a range from about 0.2 to 0.8 micron on the surface of the wafer. A Mask 4 process uses a contact mask that exposes BPSG layer 28 at the locations of contacts to source regions 17, body regions 14, and shield polysilicon regions 18. As shown in FIG. 5P, BPSG layer 28 may be etched via a photoresist contact mask (not shown) that is formed during the Mask 4 process. This etch process particularly removes areas of BPSG 28 over body contact trenches 84 and over portions of source regions 17 adjacent to body contact trenches 84, removes oxide 92 from body contact trenches 84, and forms one or more vias or openings 98 through oxide 46 to shield poly regions 18, in areas of gate trenches 86 away from gate polysilicon 26. A P-type ion implant, e.g., of $BF_2$ or Boron, into the silicon at the bottom of body trenches 84 with energy in the range of about 20 to 40 Key and ion dose about 5e14 to 1e15 $cm^{-2}$ forms P+ body region contact regions 15. FIG. 5P also illustrates an opening 98 to P poly shield region 18 formed by etching oxide filled gate trench areas during the source contact etch step so that poly shield regions 18 can be ohmically shorted to a source electrode.

Figure 5Q:
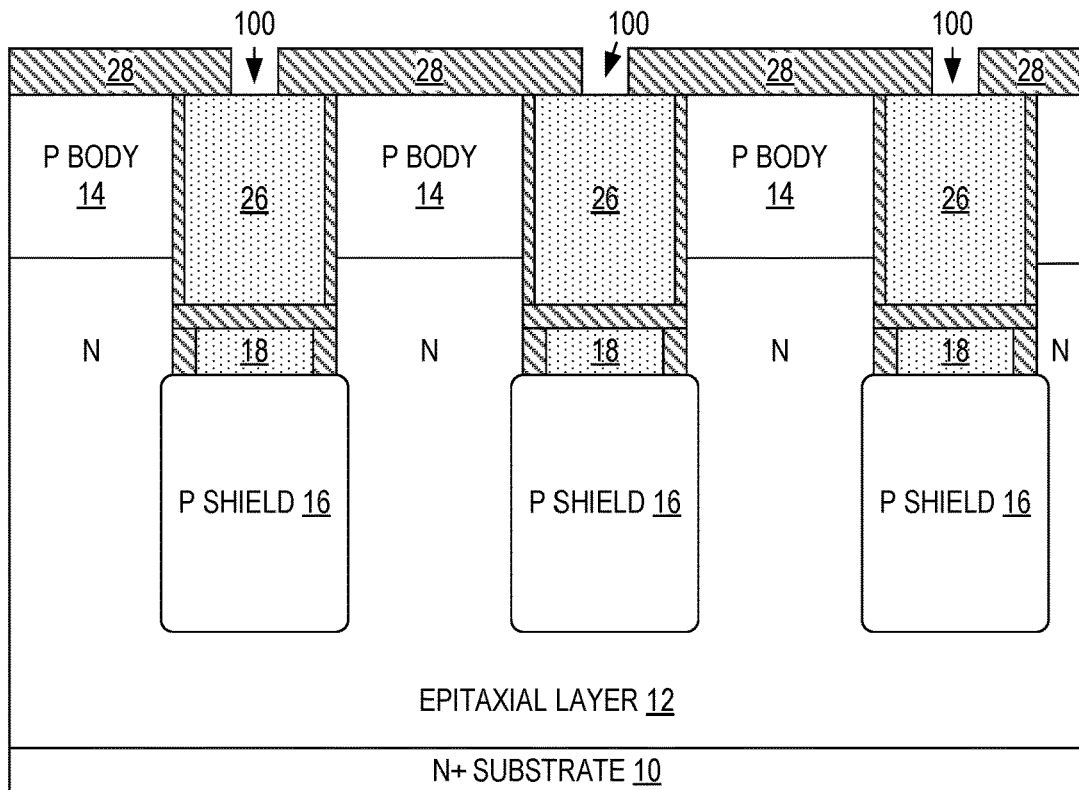

FIG. 5Q shows a cross-section in an area of the device where openings 100 through BPSG layer 28 are formed for gate contacts. Openings 100 may be etched through BPSG layer 28 during the etching process that also remove oxide 92 and forms openings 98 in HDP oxide 46. Subsequently, during the P+ body ion implantation process of $BF_2$, boron ions, or other P-type dopants may also be implanted into N+ gate polysilicon 26 through openings 100, however N+ concentration in N+ gate polysilicon 26 is higher than the concentration of $BF_2$ or boron ions, i.e., the P+ body dose, thus poly gate regions 26 remain N+ polysilicon even in the contact areas below openings 100.

Interconnect and contact structures can be formed on the structure of FIGS. 5P and 5Q after photoresist mask removal and wafer cleaning processes. In particular, metal may be deposited using sputter deposition processes. First, an adhesion or fill layer, e.g., a Ti/TiN/W layer, may be sputter deposited to fill body contact trenches 84 and openings 98 and 100 and adhere to BPSG layer 28 and then a top metal layer, e.g., Al:Cu:Si or Al:Cu, may be sputter deposited to a thickness in a range from about 2 to 8 microns.

Figure 5R:
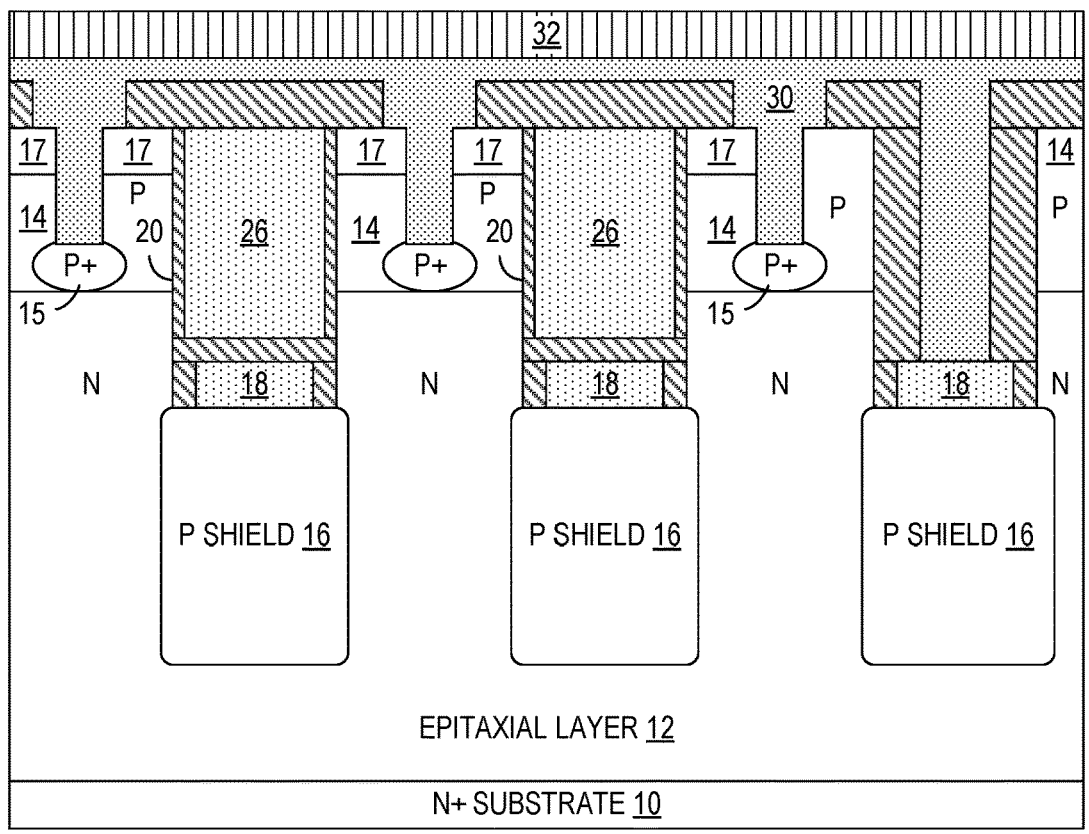
Figure 5S:
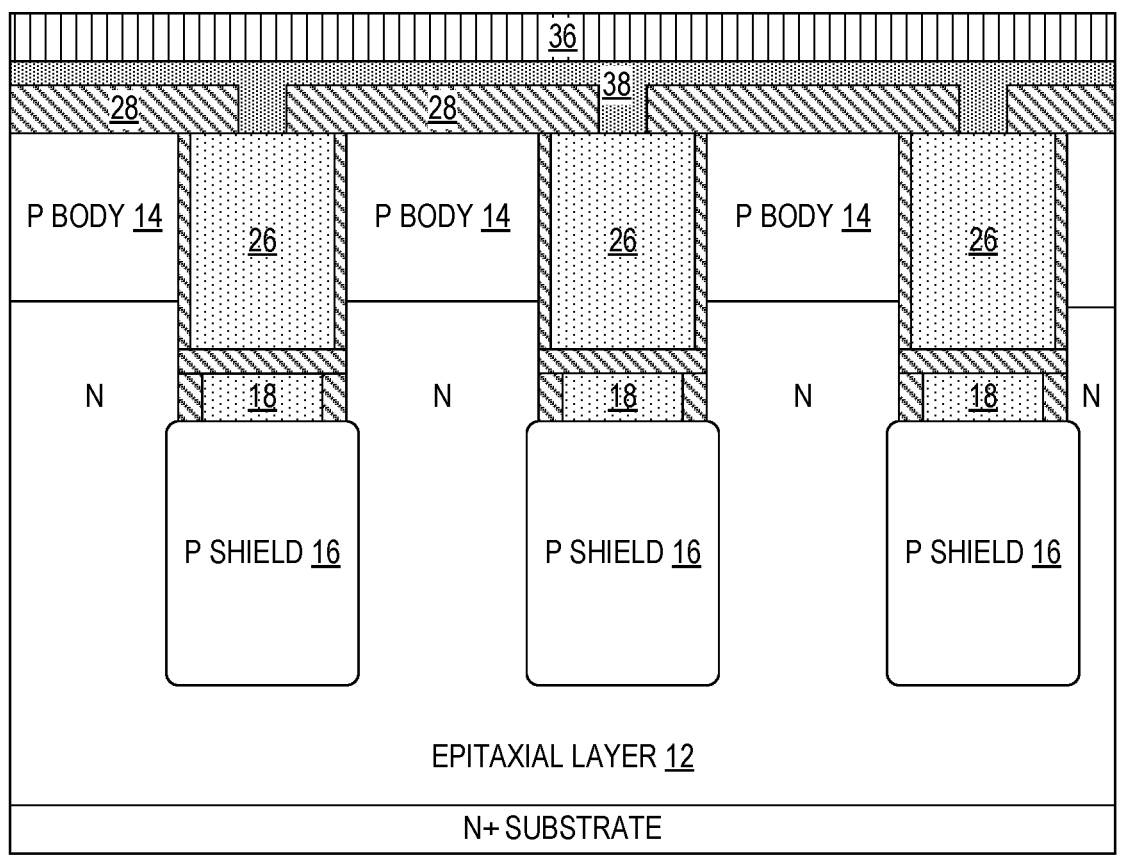

A Mask 5 process patterns the metal layer. Metal, e.g., the combined Ti/TiN/W and Al:Cu:Si or Al:Cu layer, may be etched via a photoresist mask (not shown). FIGS. 5R and 5S show device cross-sections after metal etching. In particular, FIG. 5R illustrates the same area of the device shown in FIG. 5P after formation of a source contact including metal regions 32 and 30, and FIG. 5S illustrates the same area of the device shown in FIG. 5Q after formation of a gate contact including metal regions 36 and 38. After photoresist removal and wafer cleaning for the Mask 5 process, a passivation layer 34 may be deposited on the top surface of the device. For example, an oxide and nitride layer may be deposited in a thickness range of about 0.8 to 1.5 microns for trench devices having voltage ratings up to about 200 V, and a polyimide layer may be deposited on the oxide or nitride layer with a thickness range of about 5 to 15 microns for trench devices voltage ratings up to about 500 V or more.

Figure 5T:
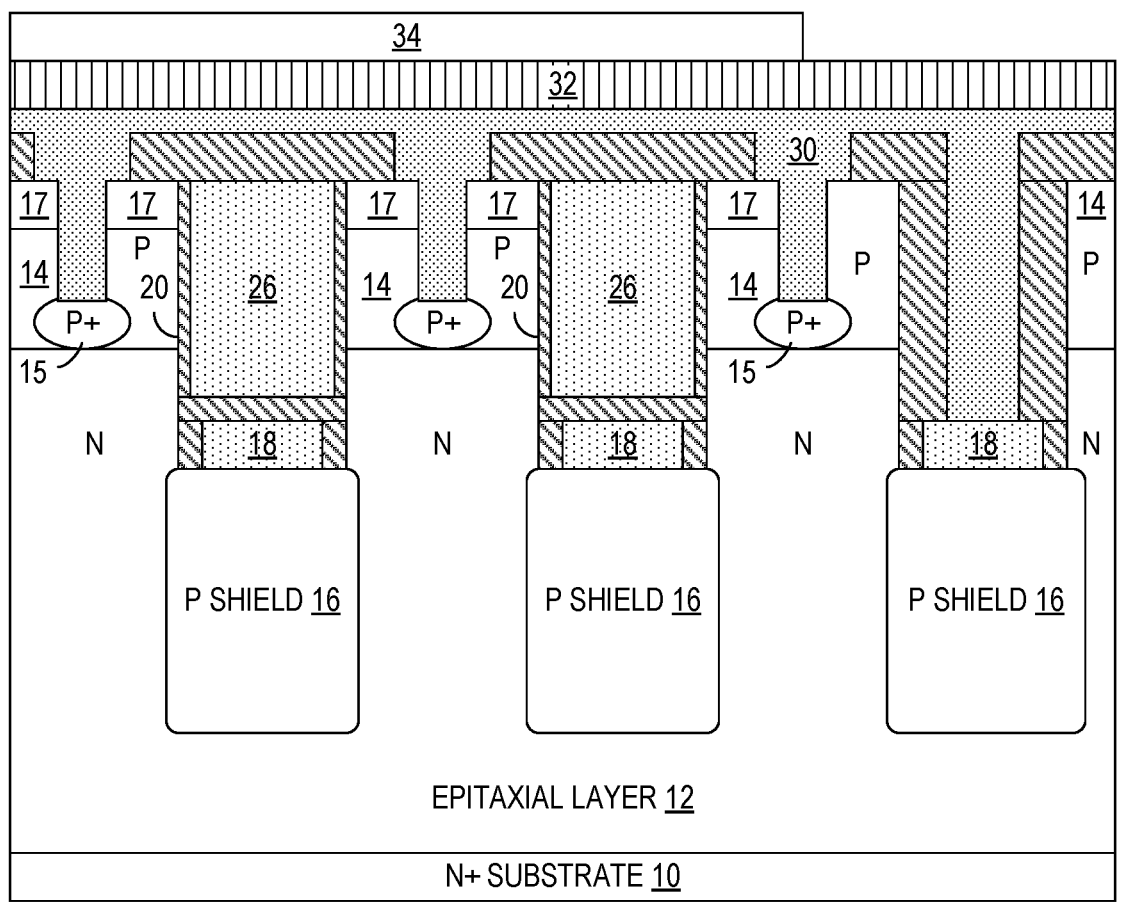
Figure 5U:
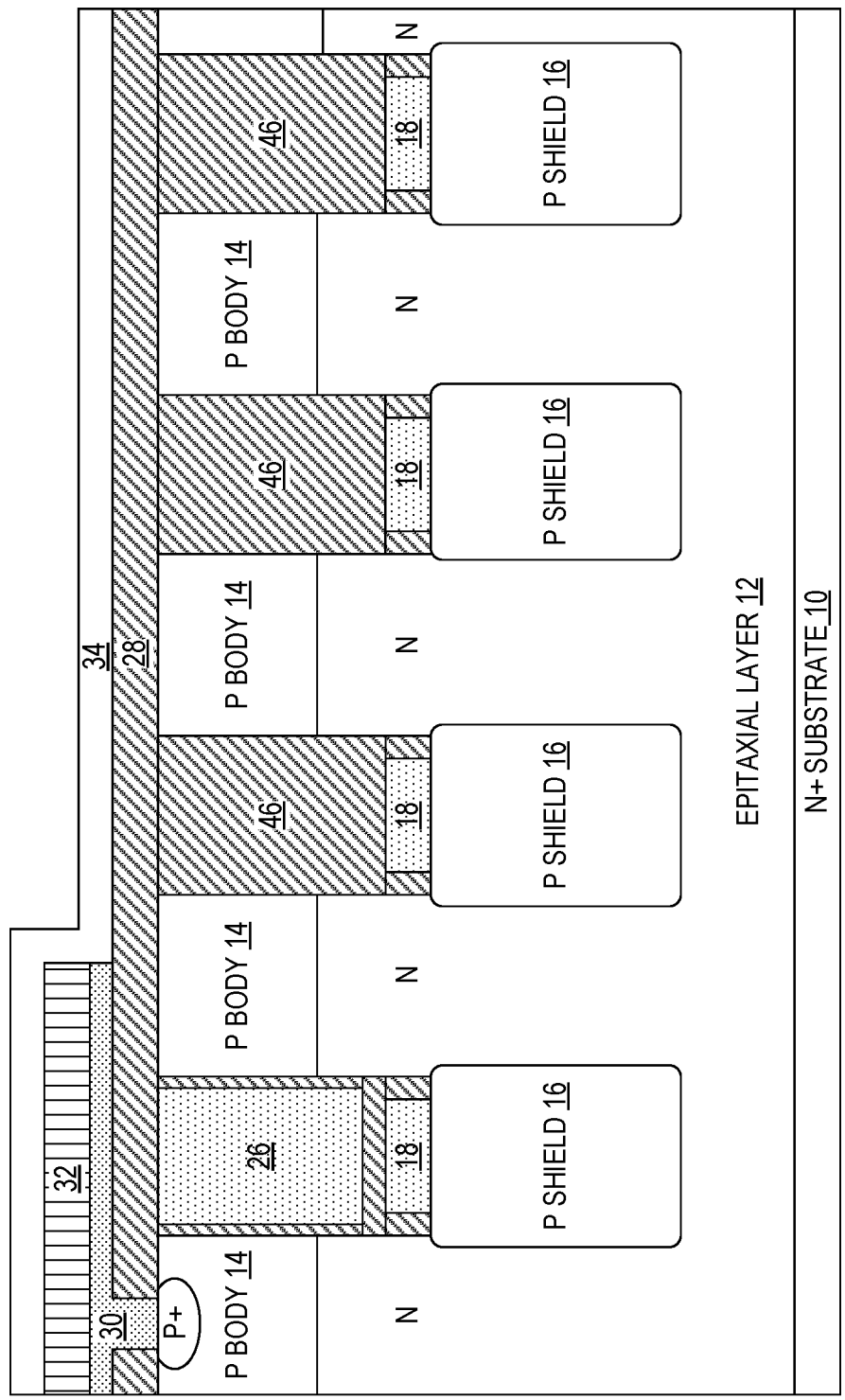

A Mask 6 process patterns passivation layer 34. In particular, passivation layer 34 may be etched from areas corresponding to the bond pads and saw streets of the device. Final device cross-sections after etching passivation layer 34 are shown in FIGS. 5T and 5U. FIG. 5T particularly shows a cross-section of the device in an area corresponding to a source contact, and FIG. 5U shows a cross-section of the edge termination area.

Figure 6:
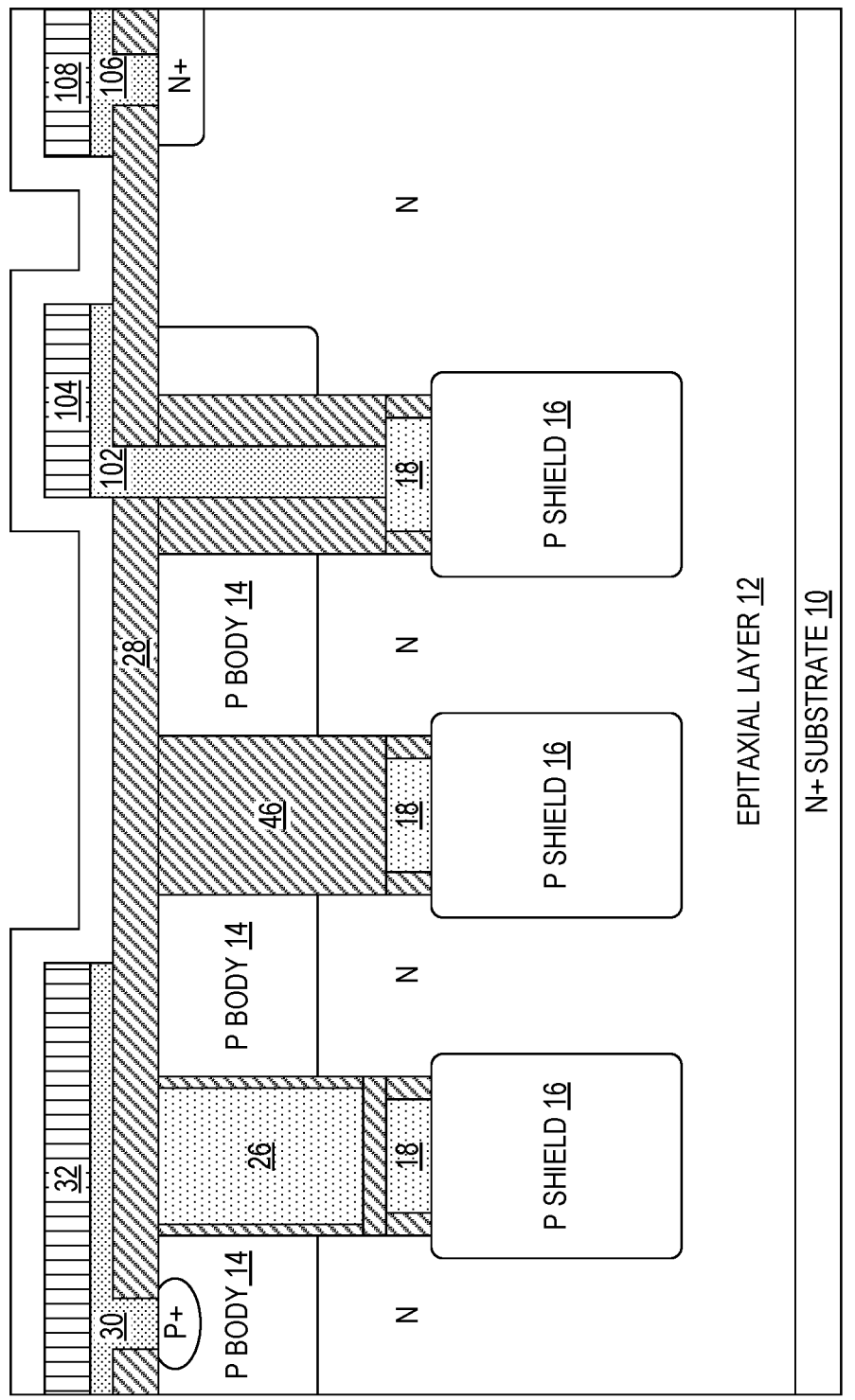
FIG. 6 shows a cross-section of an edge termination area of a P poly shield trench MOSFET.

Power devices with voltage ratings above about 500V may require an N+ channel stop as a boundary between the edge termination area of the device and the saw street. Therefore, an optional seven mask process for a P body masking process (Mask 2B process in Table 1B) needs to be added between IPD mask (Mask 2 process) and the N+ Source mask (Mask 3 process) in the fabrication process described with reference to FIGS. 5A to 5U. FIG. 6 shows a cross-section of a trench MOSFET device having an edge termination shield contact 102 and 104 and an N+ channel stop contact 106 and 108.

Figure 7A:
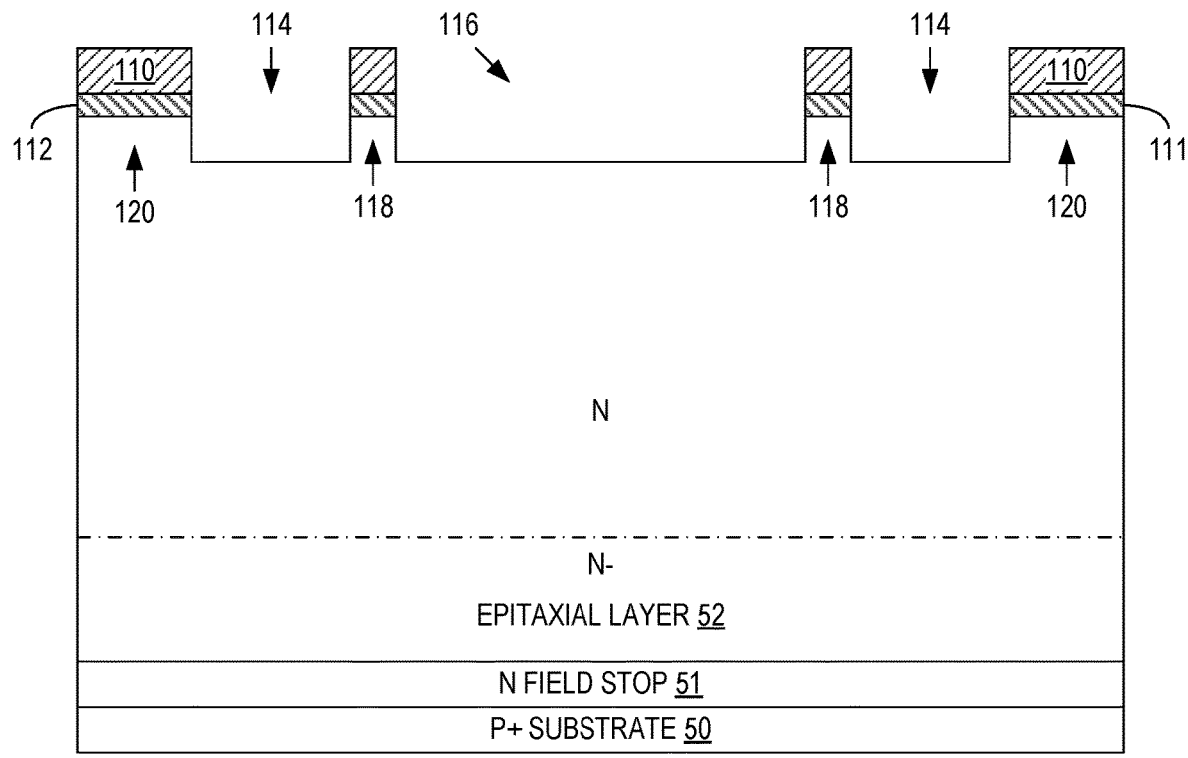
FIGS. 7A to 7T show cross-sectional views of structures formed during processes for fabricating a P poly trench IGBT with gate trenches and source contact trenches that are self-aligned.
Figure 7B:
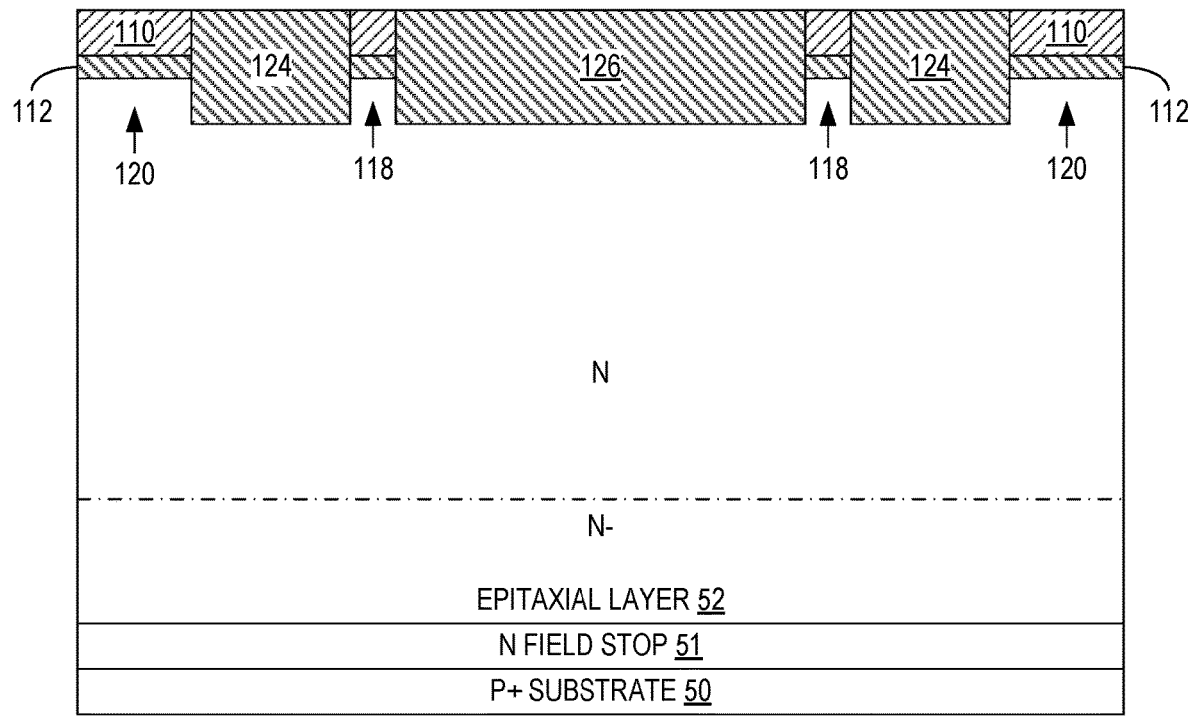
Figure 7C:
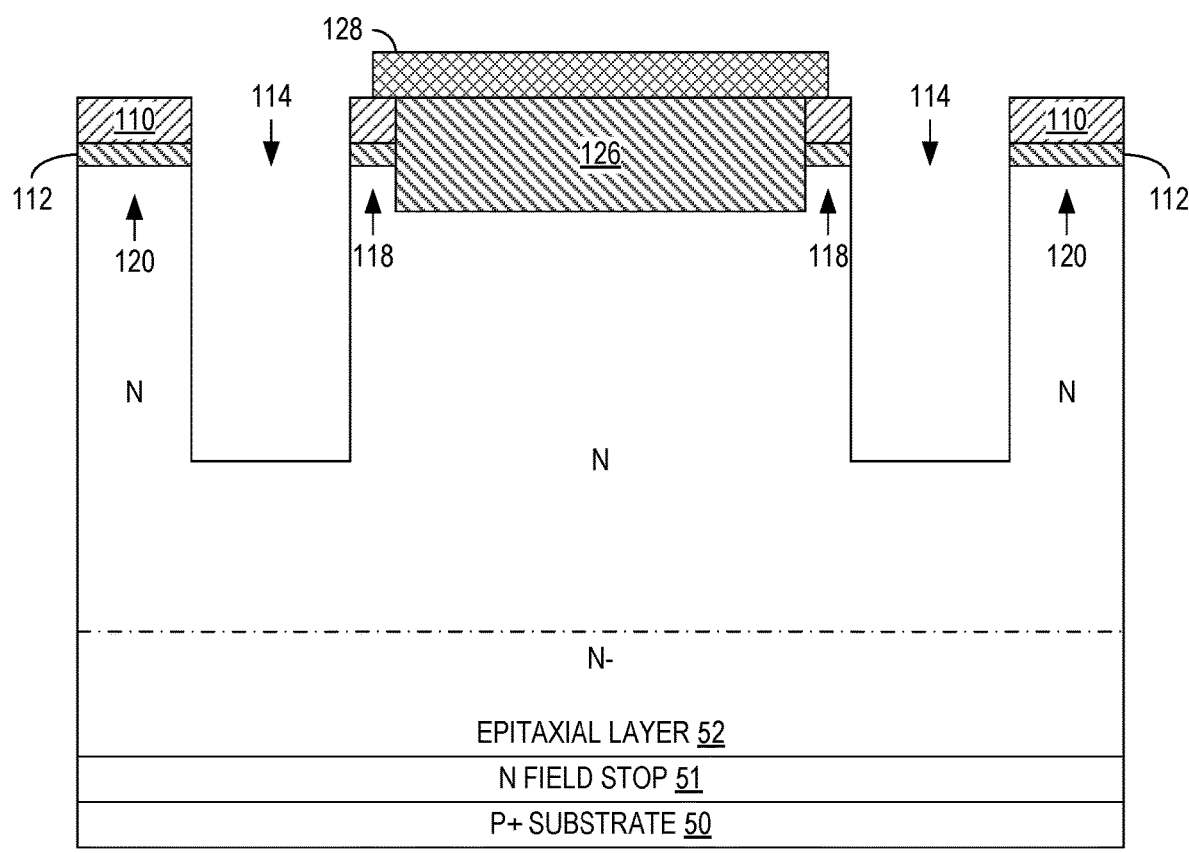
Figure 7D:
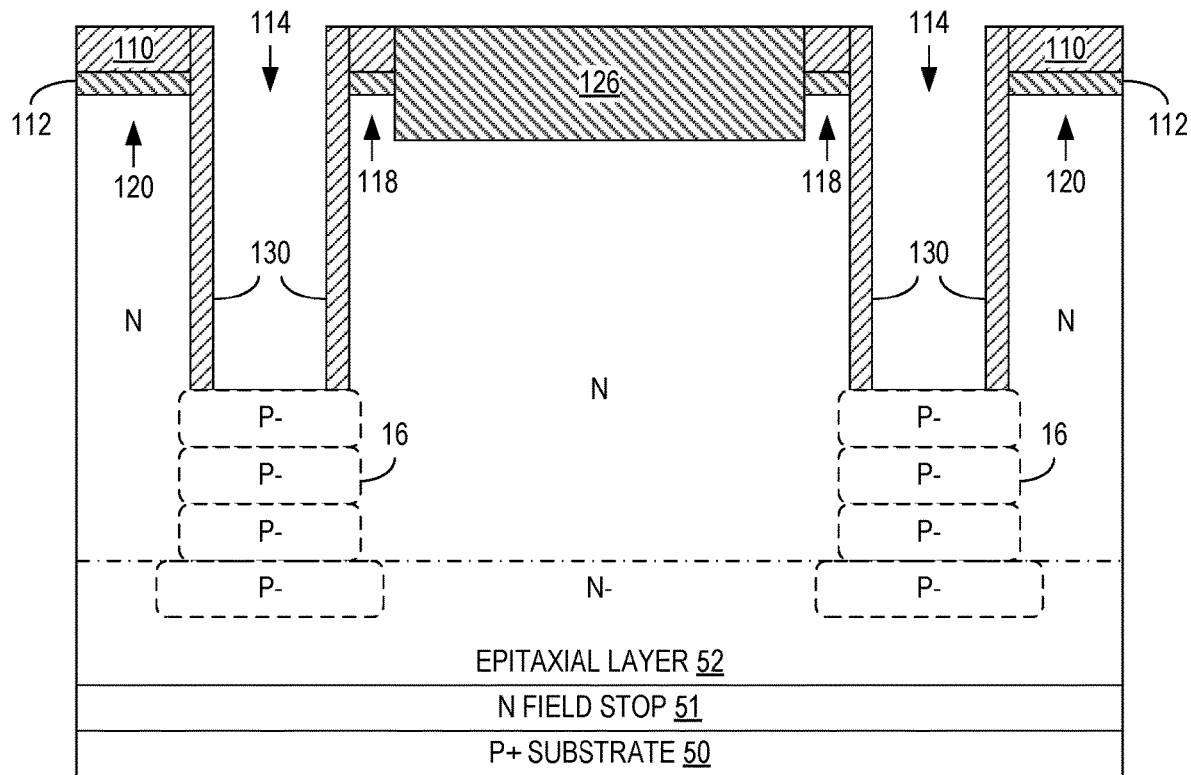
Figure 7E:
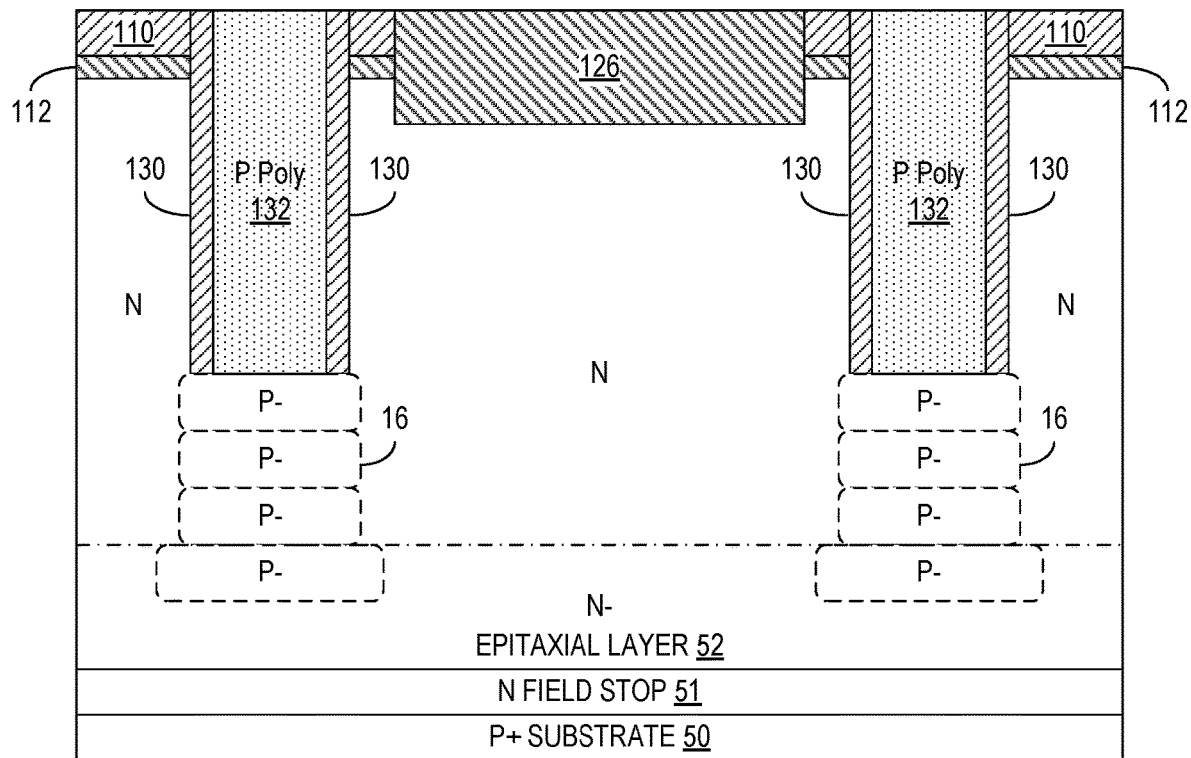
Figure 7F:
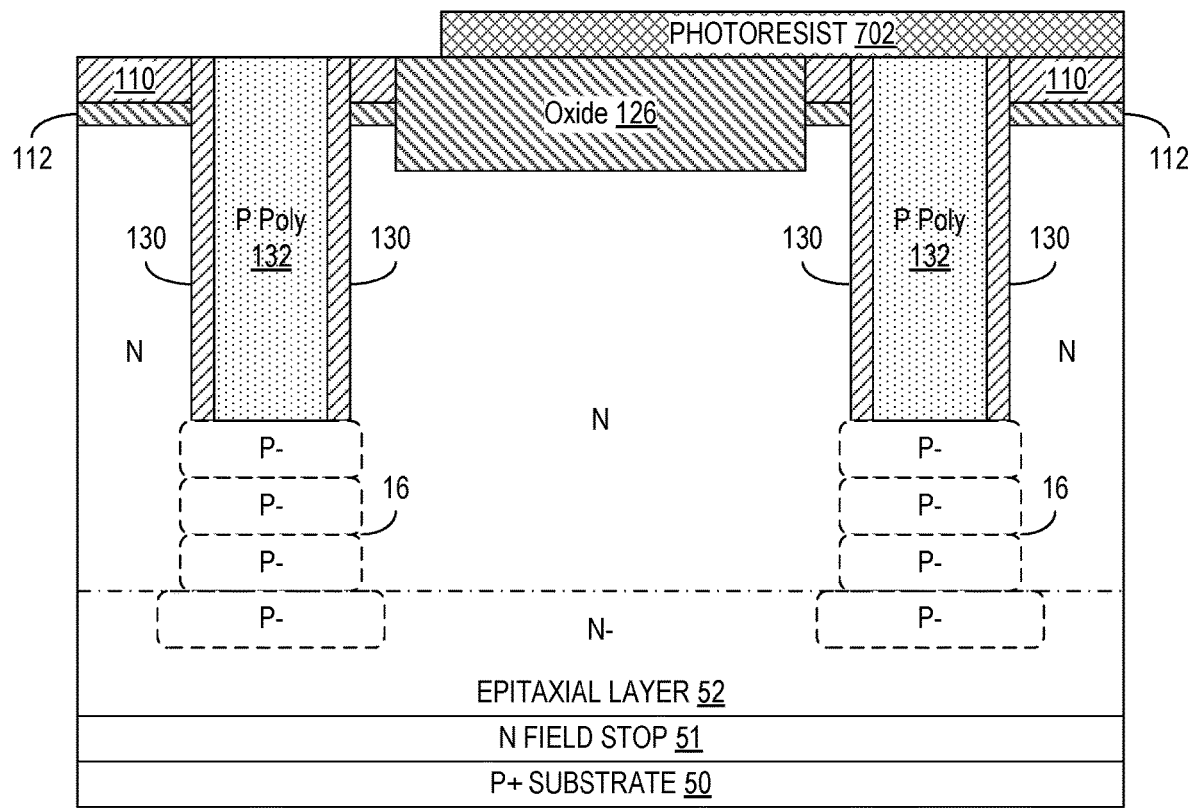
Figure 7G:
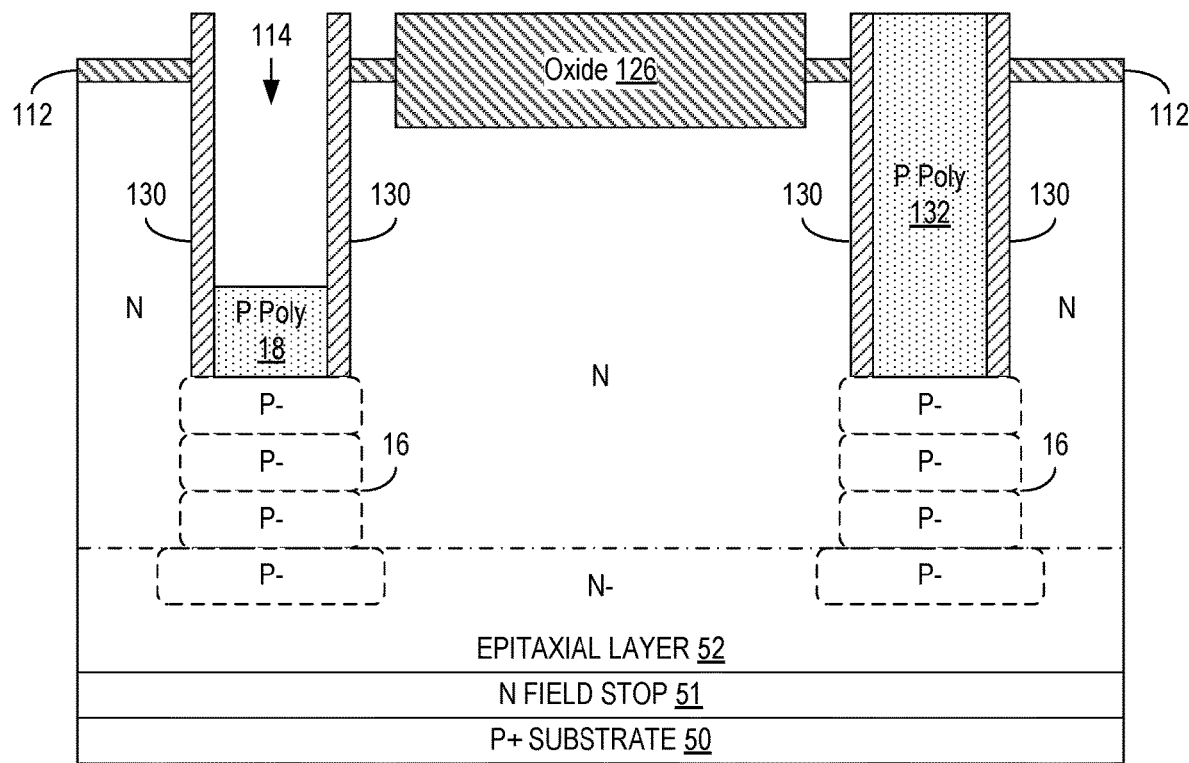
Figure 7H:
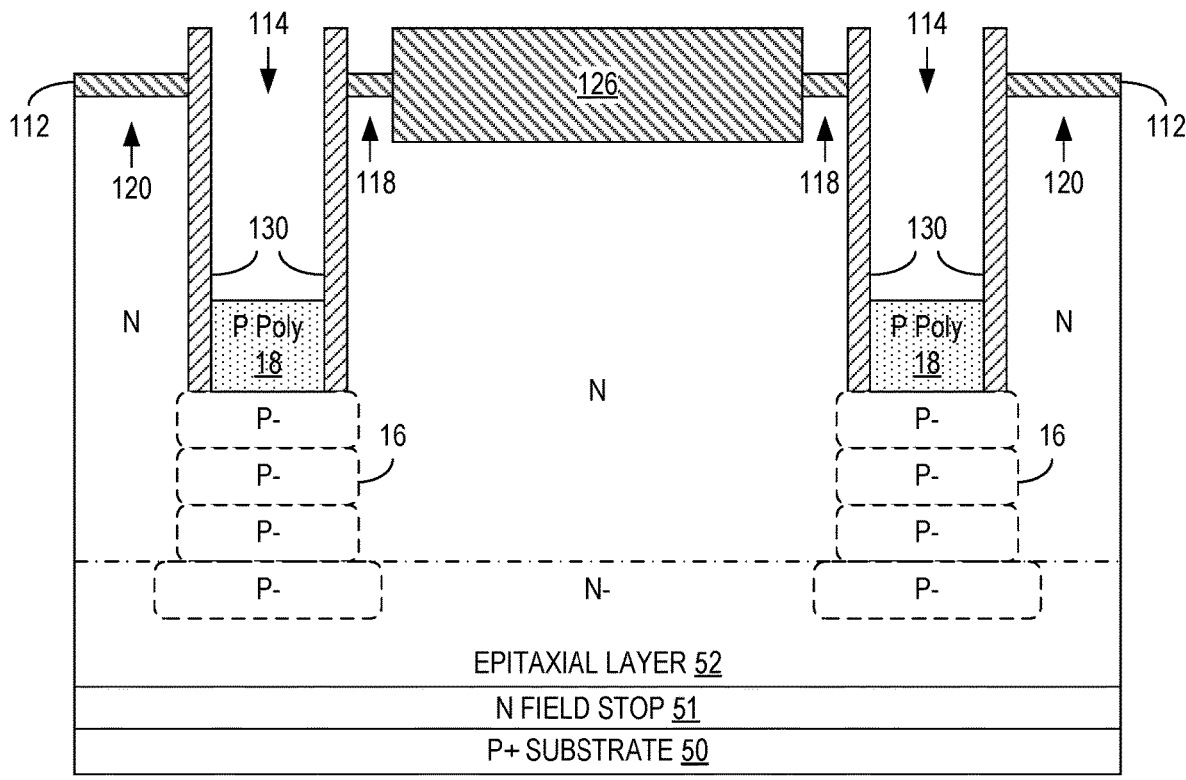
Figure 7I:
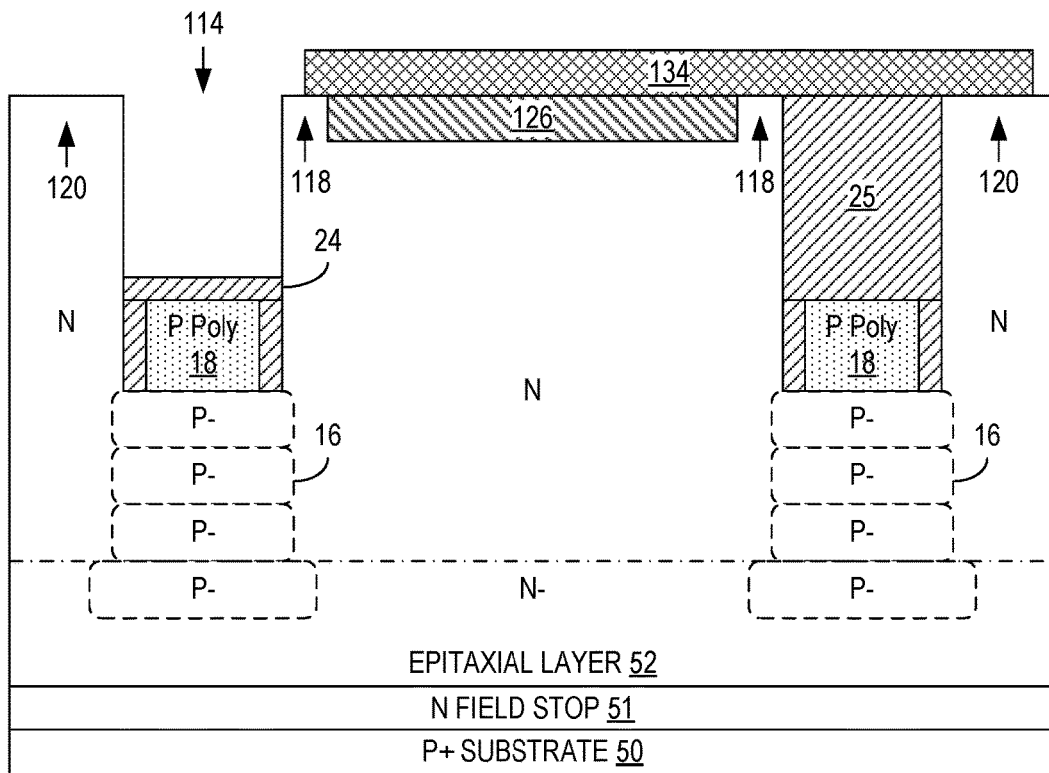
Figure 7J:
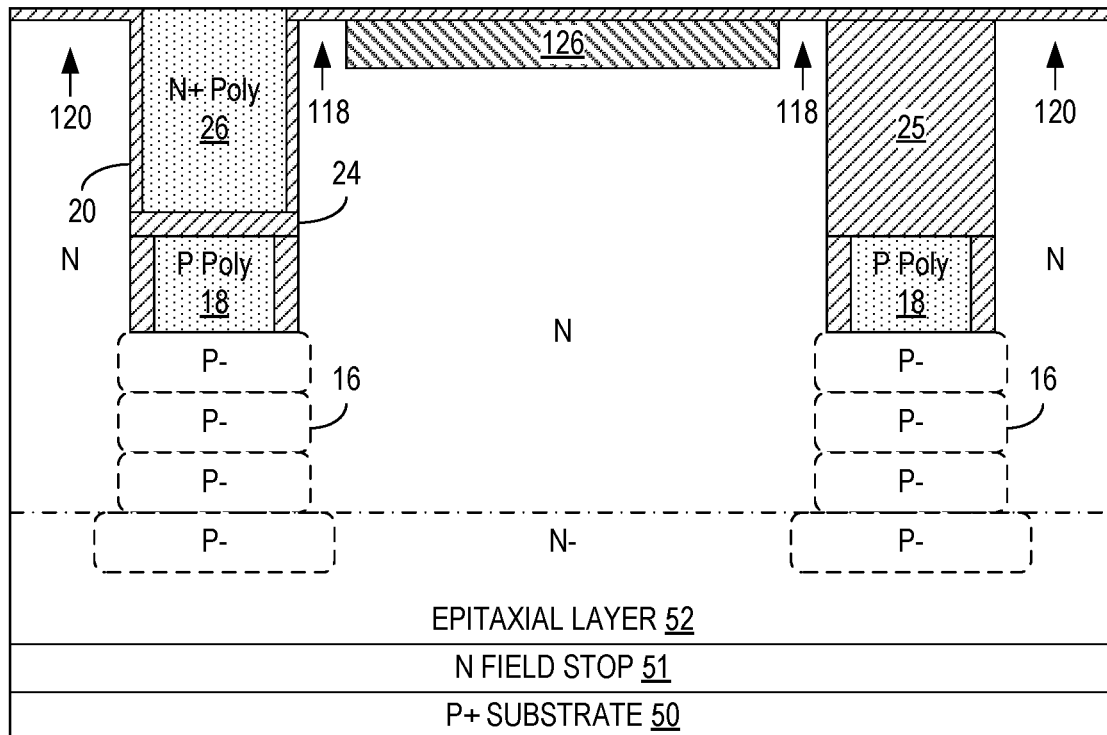
Figure 7K:
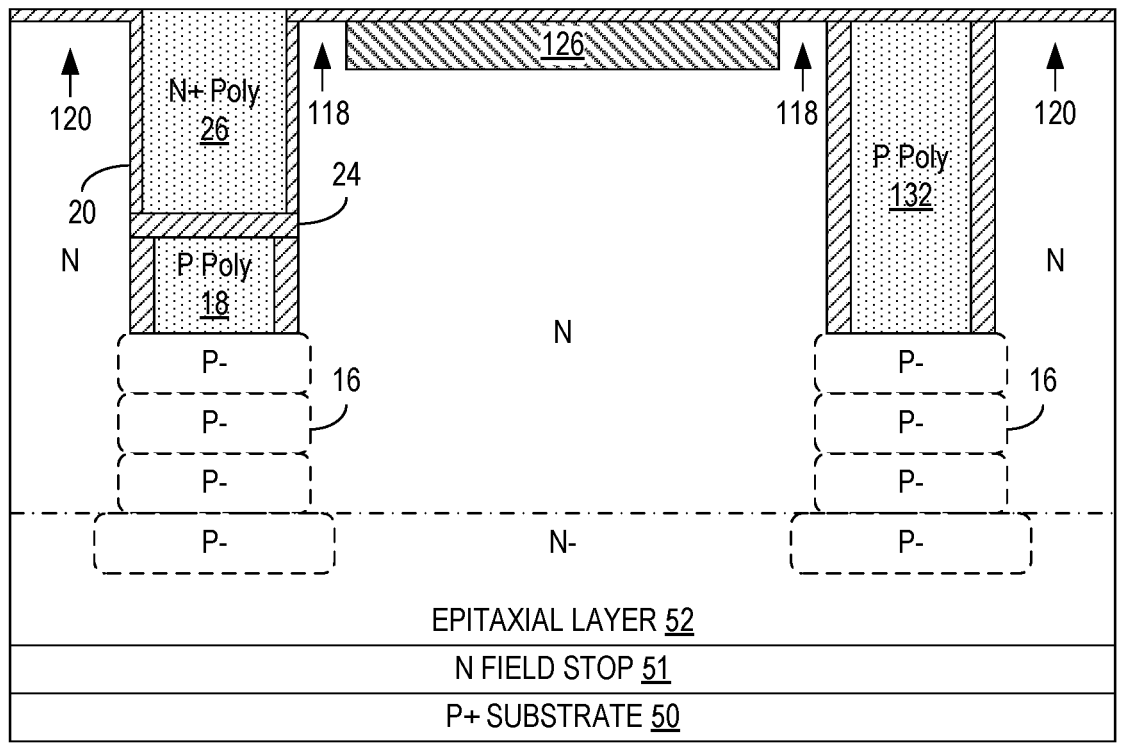
Figure 7L:
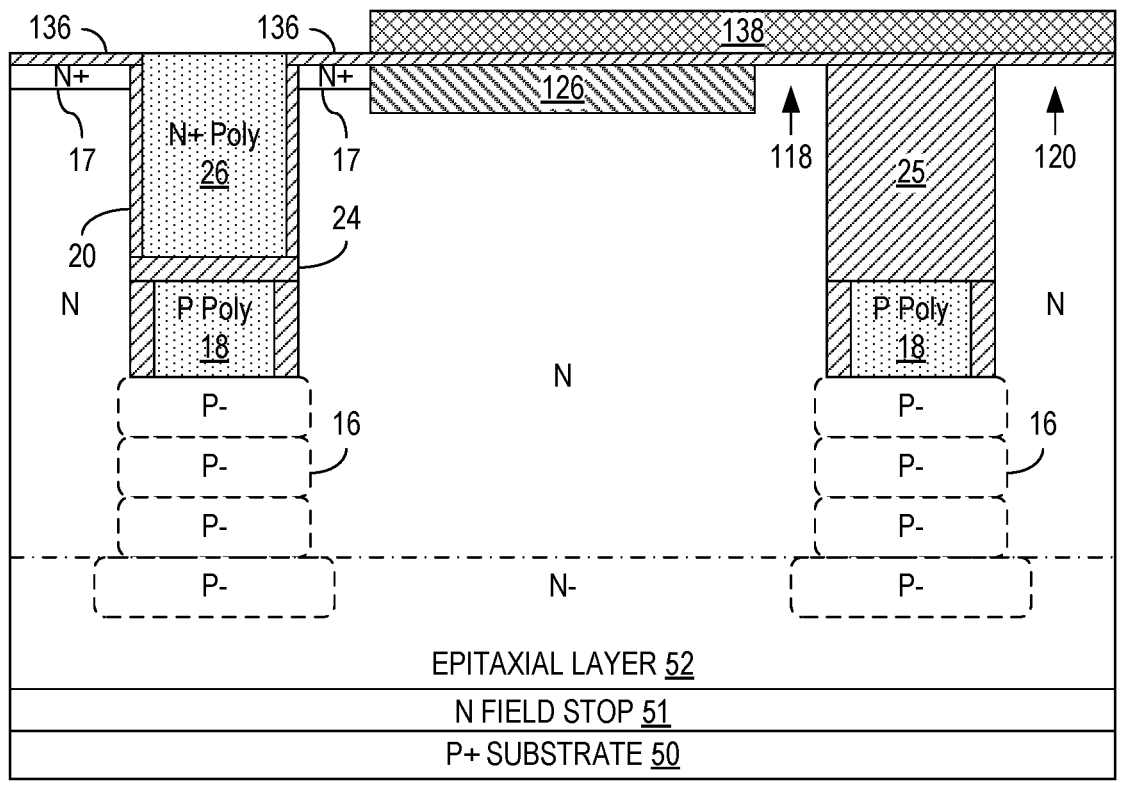
Figure 7M:
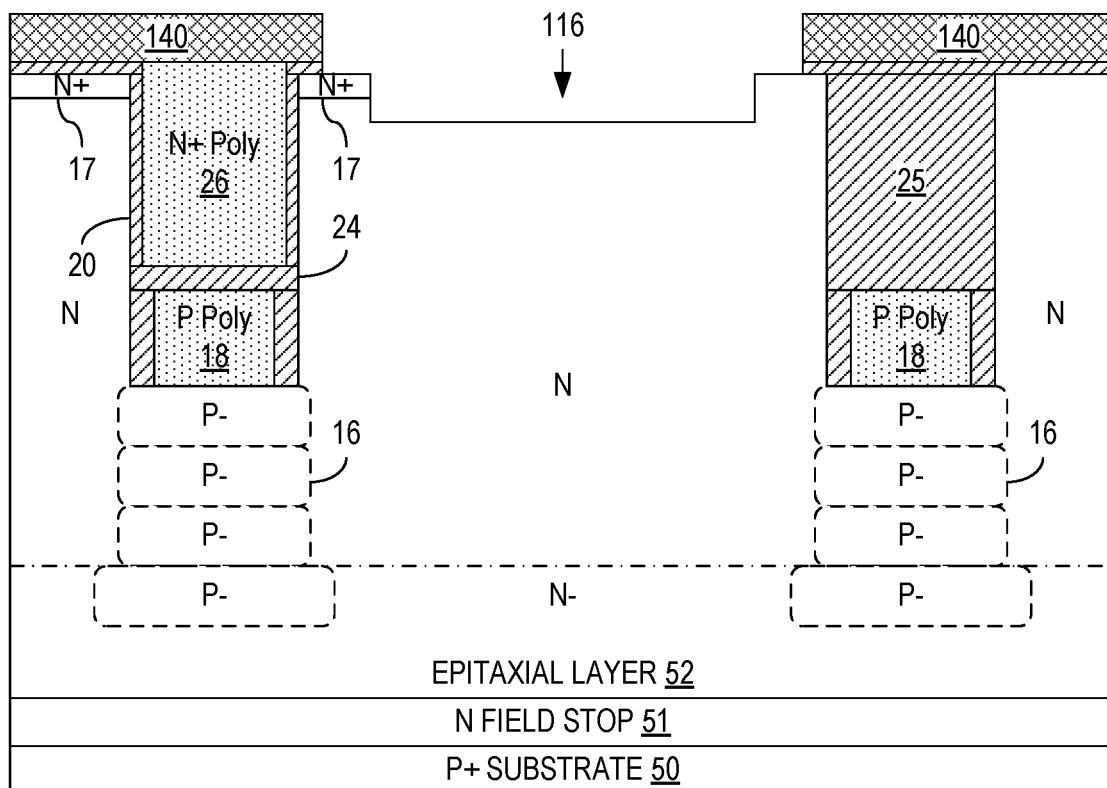
Figure 7N:
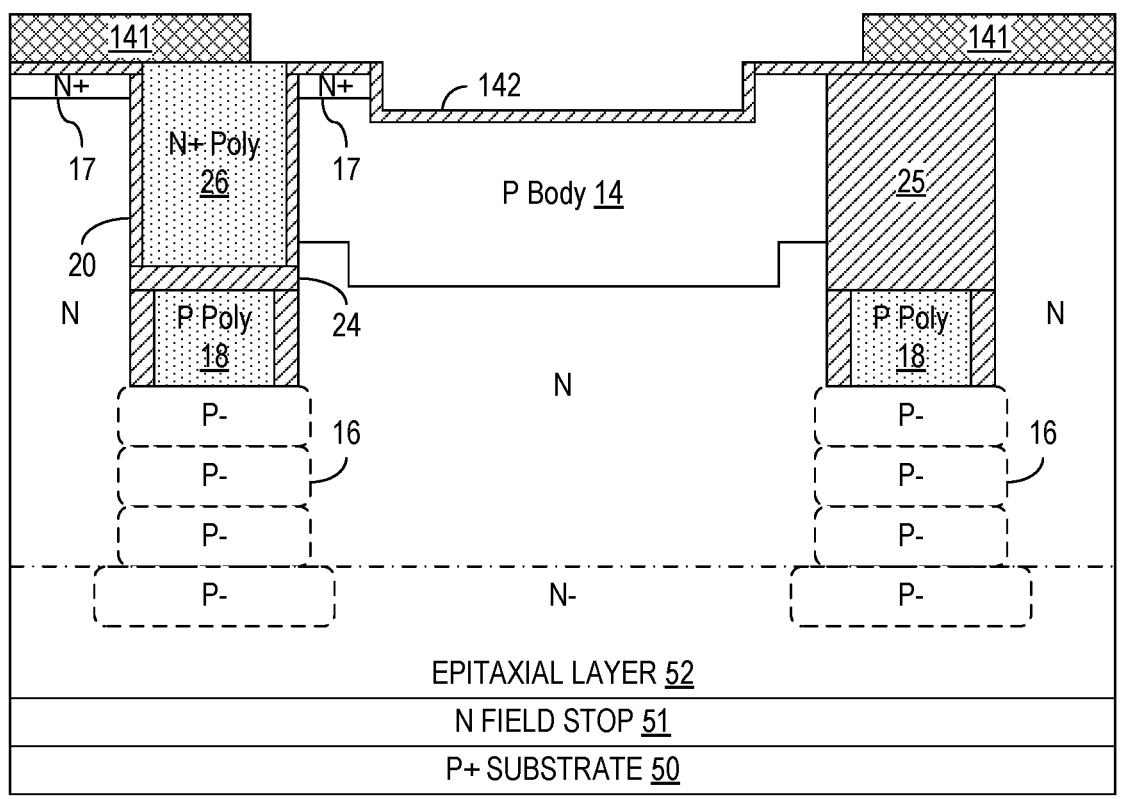
Figure 7O:
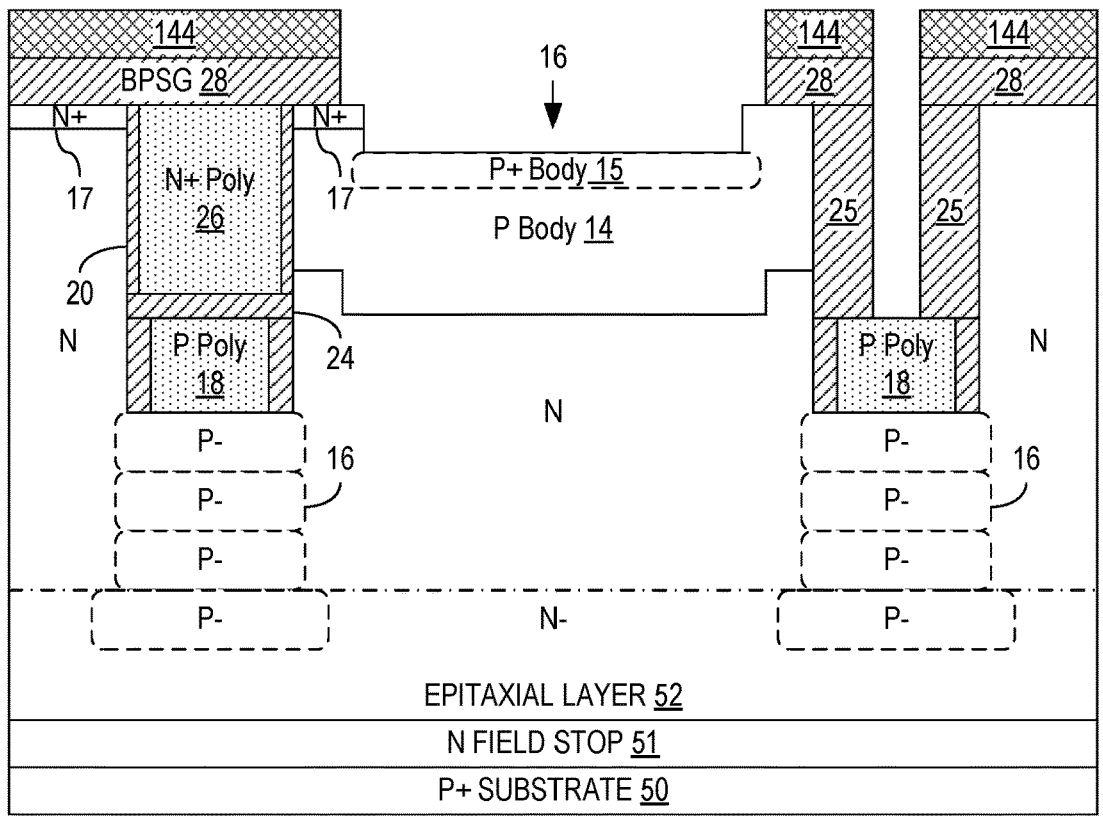
Figure 7P:
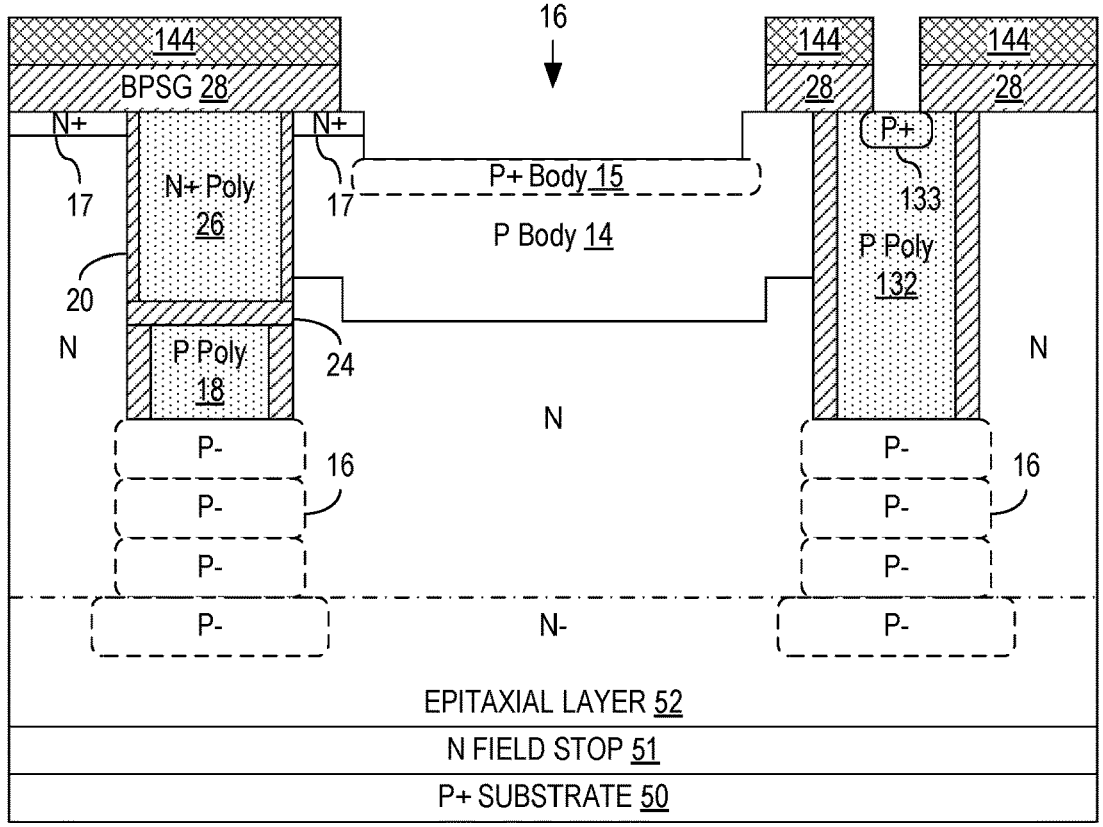
Figure 7Q:
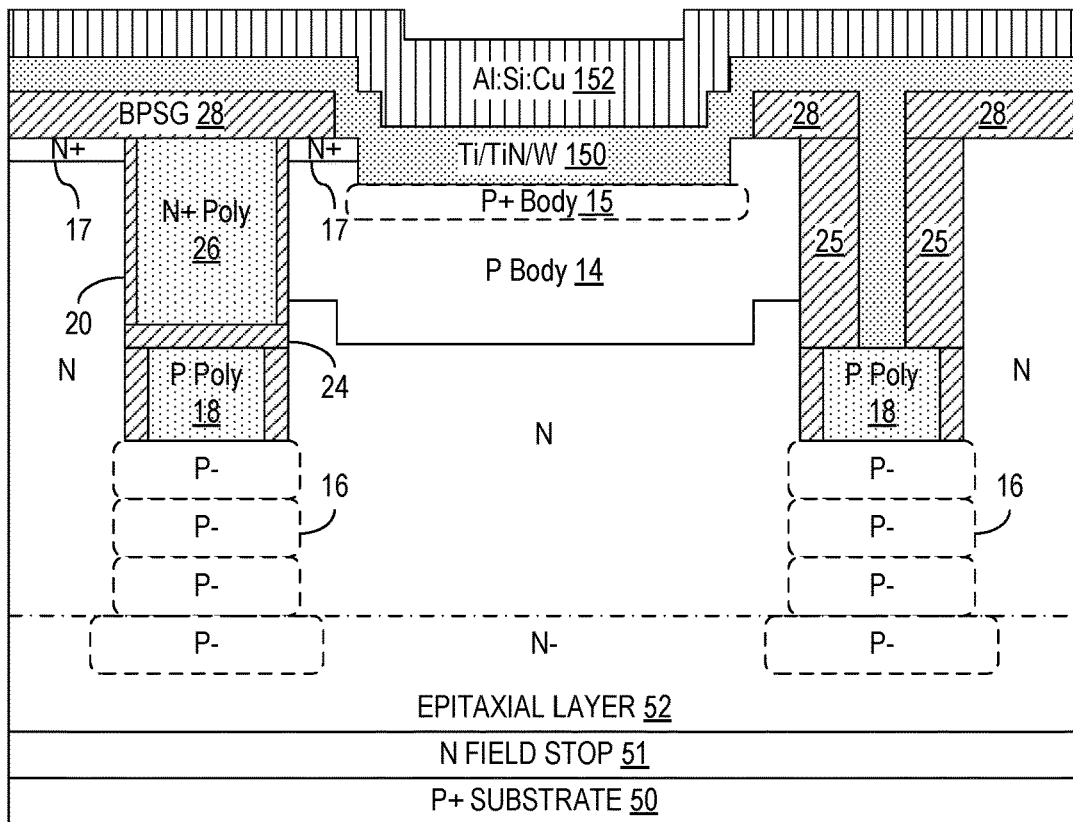
Figure 7R:
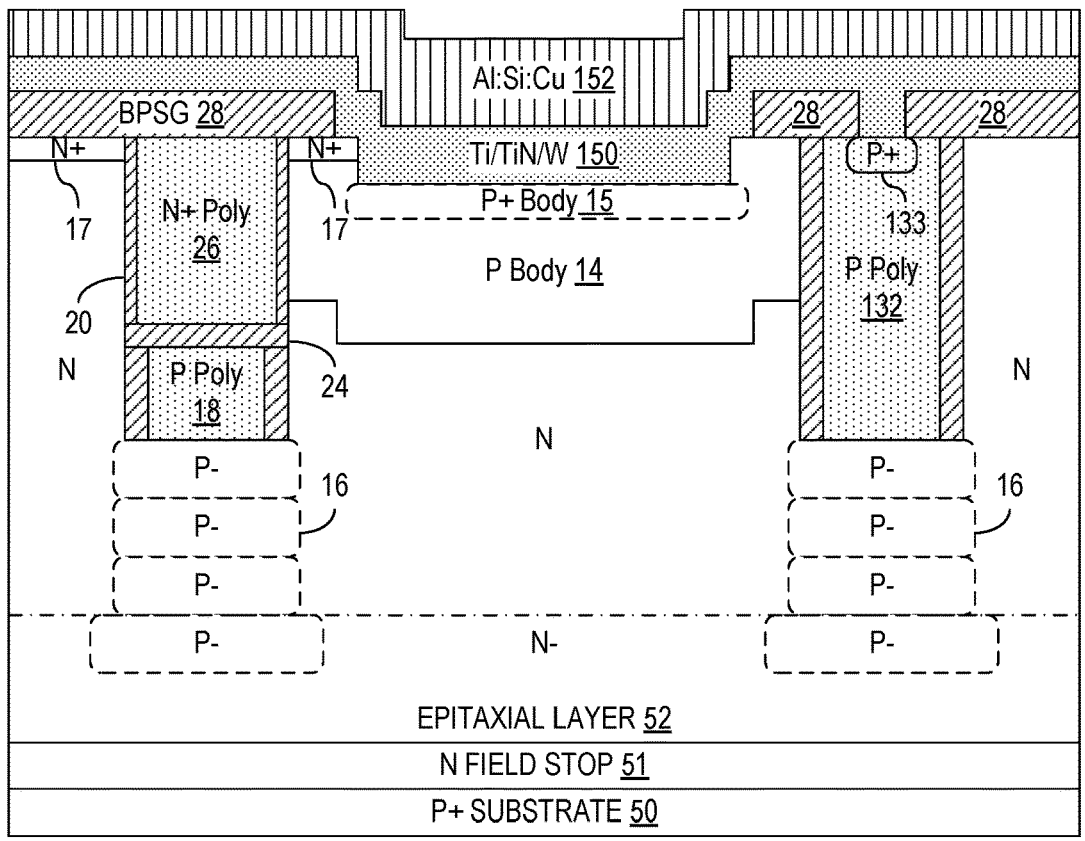
Figure 7S:
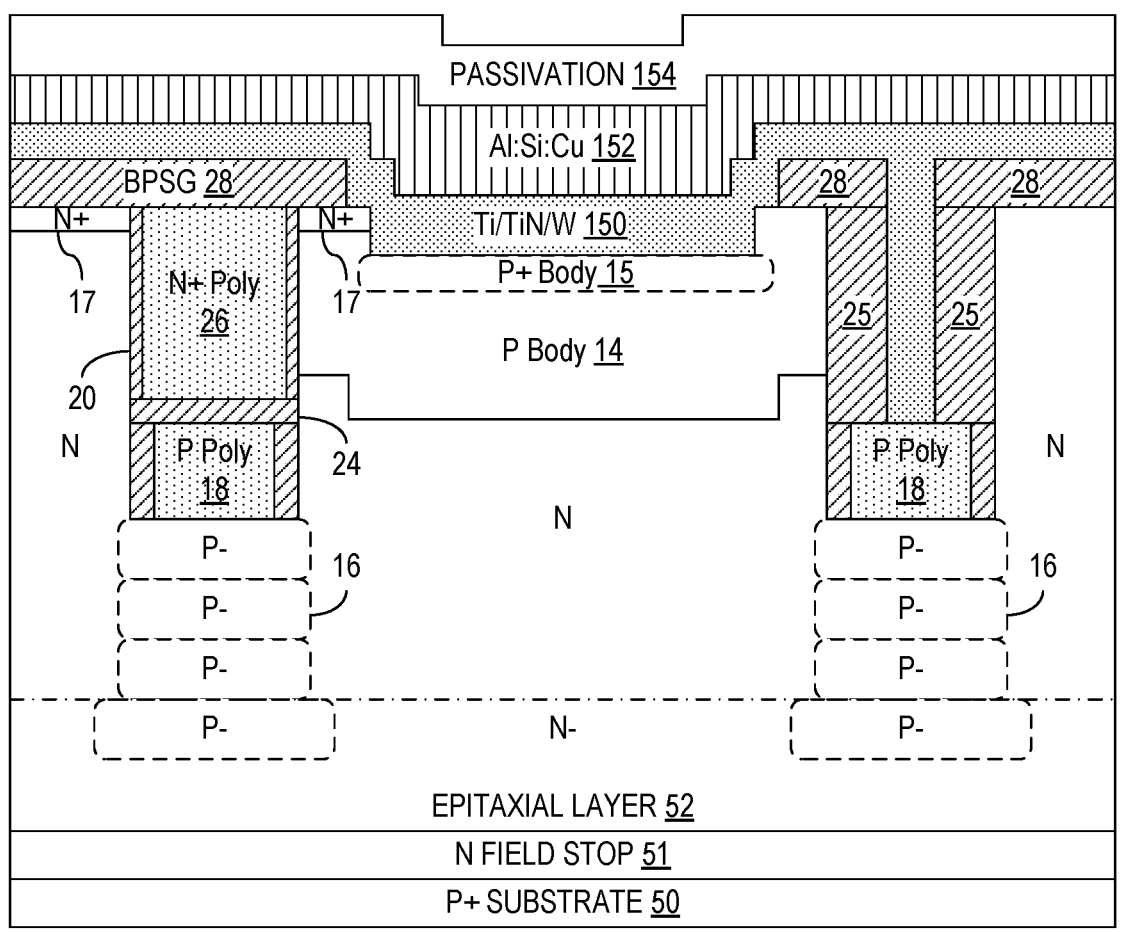
Figure 7T:
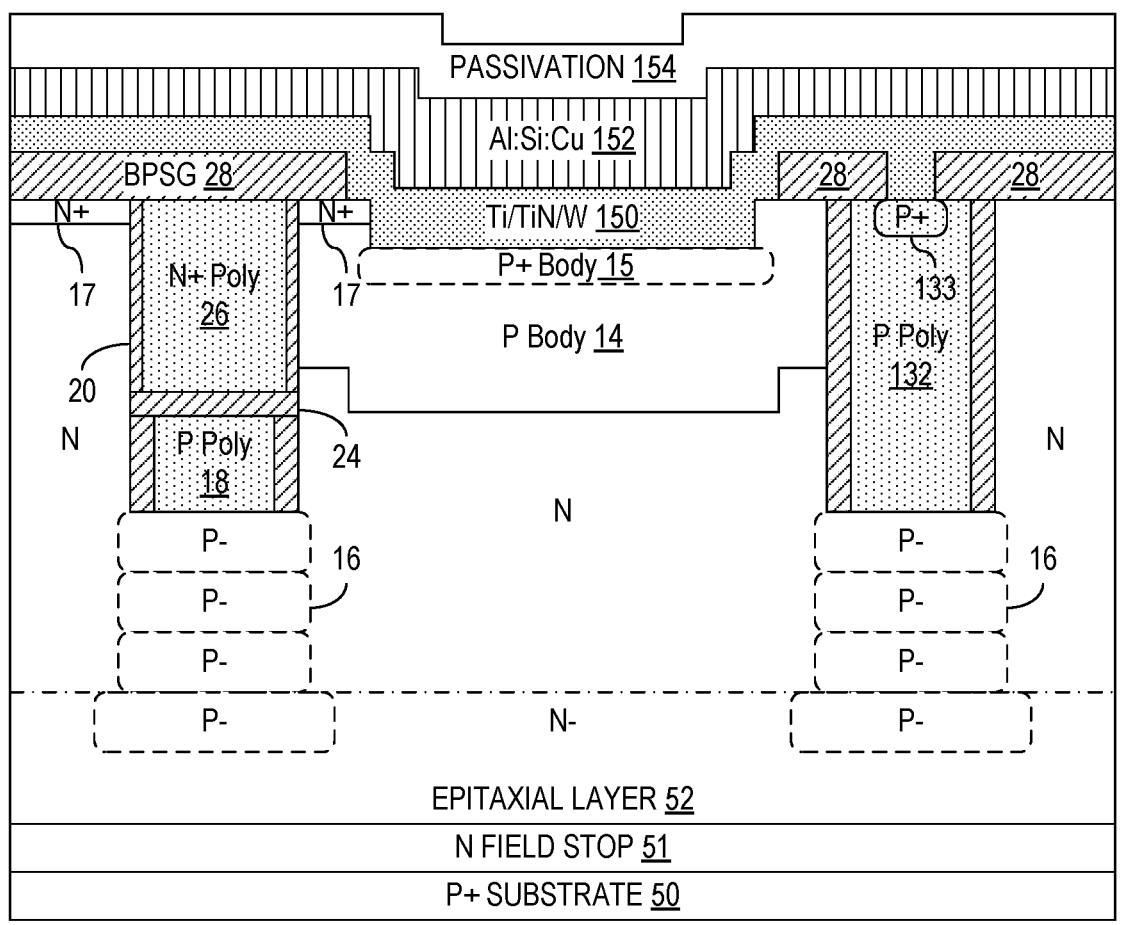

FIGS. 7A to 7T show cross-sections of structures created during a process flow for fabricating an IGBT structure having body trench contacts that are wider than gate trenches. An implementation of the fabrication process may employ nine or ten masking steps as shown in Table 2A or Table 2B. Table 2A particularly lists nine mask steps for P poly shield trench field stop (FS) IGBT with metal contacts to buried P shield regions, and Table 2B lists ten mask steps for P poly shield trench field stop (FS) IGBT with metal contacts to P poly extending to near a top surface of an semiconductor layer.

TABLE 2A

| MASK | PROCESS STEP |
| --- | --- |
| 1 | Trench Etch |
| 2 | Contact Oxide |
| 3 | IPD (Inter Poly Dielectric) |
| 4 | N+ Emitter |
| 5 | P+ Body Contact to etch off oxide |
| 6 | P Body |
| 7 | Contact |
| 8 | Metal |
| 9 | Passivation |

TABLE 2B

| MASK | PROCESS STEP |
| --- | --- |
| 1 | Trench Etch |
| 2 | Contact Oxide |
| 2B | Shield Poly Contact |
| 3 | IPD (Inter Poly Dielectric) |
| 4 | N+ Emitter |
| 5 | P+ Body Contact to etch off oxide |
| 6 | P Body |
| 7 | Contact |
| 8 | Metal |
| 9 | Passivation |

The fabrication flow of Table 2A or 2B may start with a P+ substrate 50 on which a N+ field stop layer 51 and N-type drift layer 52 are epitaxially grown. Epitaxial layer 52 is crystalline semiconductor (silicon) and may have an N− doping adjacent to N field stop 51 and a higher N doping in the upper portion of epitaxial layer 52 because a heavier N doping adjacent to the trenches can reduce resistance for the electrons coming from the MOSFET channel and lower the collector-emitter voltage Vce of IGBT. Alternatively, starting IGBT wafers can be N-type such as a float zone wafer (no epitaxial layer for 1200V and above voltage IGBTs in some cases even for 600V IGBTs) or N− drift and N type field stop on top of lightly doped P or N type substrate. Mask 1 is a trench etch mask that is formed on a top surface of N-type epitaxial layer 52. As shown in FIG. 7A, the trench mask is a hard etch mask including nitride and oxide layers 110 and 112 that are patterned to expose areas of epitaxial layer 52 in areas corresponding to gate trenches 114 and body contact trenches 116. Initial etch processes may use a photoresist mask to etch layers 110 and 112 to form a hard mask and may then use the hard mask to etch initial depths of both gate trenches 114 and body contact trenches 116. Trenches 114 and 116 after the initial etch process may have a depth of about 0.5 micron. Mesa regions 118 and 120 between trenches 114 and 116 remain under regions of oxide and nitride layers 110 and 112 forming the hard mask. The process of FIG. 7A is a self aligned trench gate and contact trench process in that the same mask determines the locations of gate trenches 114 and contact trenches 116. An alternative process in which contact trenches are not self aligned with gate trenches is described below.

FIG. 7B illustrates the structure of FIG. 7A after formation of oxide regions 124 filling gate trenches 114 and oxide regions 126 filling body contact trenches 116. Oxide regions 124 and 126 may be formed by depositing an oxide layer thick enough to fill trenches 114 and 116 and then planarizing the wafer, e.g., using CMP, to remove the top portion of the oxide layer, expose nitride layer 110 in mesa areas 118 and 120, and leave oxide regions 124 and 126 respectively in trenches 114 and 116.

FIG. 7C illustrates a structure formed during a Mask 2 process or contact oxide mask process. The Mask 2 process uses a photoresist mask 128 that is applied over the planarized surface shown in FIG. 7B. Photoresist mask 128 covers oxide regions 126 in body contact trenches 116 and exposes oxide 124 in gate trenches 114. An initial oxide selective etch removes oxide 124 from gate trenches 114, while photoresist mask 128 and nitride layer 110 protect other areas of the wafer. Selective etching of epitaxial layer 52 exposed in gate trenches 114 then deepens gate trenches 114 about an additional 4.5 microns, while photoresist mask 128 protects oxide regions 126 within the contact trench 116. To avoid merging of P body and the P shield regions, gate trenches 114 may be made relatively deep, e.g., in a 4 to 8 microns range, for high voltage devices.

FIG. 7D illustrates a structure created after removal of photoresist mask 128. Sidewall spacers 130 in gate trenches 114 may be formed by first depositing an oxide layer, having a thickness of about 1000 Å, inside gate trenches 114 using a low pressure chemical vapor deposition (LPCVD) process, followed by an etching process using an anisotropic reactive ion etch (RIE) to leave oxide spacers 130 on the trench sidewalls. P shield regions 16 may be formed in epitaxial layer 52 by employing multi dose boron implantation at about 30 KeV to 3 MeV energy ranges. Alternatively, P shield regions 16 may be formed as described above by etching trenches deeper below sidewall spacers 130 and epitaxially growing P-type silicon up to the bottoms of sidewall spacers 130.

The process flow for fabricating IGBT can employ two different alternatives for providing electrical connections to P poly shield regions. FIGS. 7E, 7F, and 7G illustrate structures formed during a process alternative that provides electrical connections to P poly shield regions through areas of P polysilicon extending to or near the top surface of epitaxial layer 52. For this alternative, after forming the sidewall spacers 130, polysilicon 132 may be deposited in multiple steps to fully fill gate trenches 114 with P-type polysilicon. In particular, after depositing polysilicon to partially fill trenches 114, boron or other P-type dopant may be implanted into the polysilicon in trenches 114, and the structure may then be planarized to the surface of nitride layer 110 before repeating the deposition and implant processes. After one or more repetitions, P-type polysilicon 132 completely fills the trenches 114 as shown in FIG. 7E. The multi-step deposition and doping of polysilicon 132 may particularly be used to ensure polysilicon 132 is P type doped especially for the deeper gate trenches 114 such as gate trenches deeper than 2 microns.

Some areas of gate trenches 114 may be kept fully filled with P polysilicon 132, while other trench areas may be etched down via a shield poly mask process, i.e., Mask 2B as a process option of Table 2B. FIG. 7F illustrates this Mask 2B process using a photoresist mask 702 to cover polysilicon 132 in trench areas where connections to P poly shield regions may be made and to expose polysilicon 132 in trench areas where gate or dielectric structures may be formed. Etching down P polysilicon 132 via mask 702 leaves P poly shield regions 18 in the bottom of exposed trench areas and leaves P polysilicon 132 filling the covered trench areas. FIG. 7G illustrates structure created by the process of Table 2B after removal of photoresist mask 702 and nitride layer 110.

The process flow of Table 2A does not required P poly silicon extending to the surface of epitaxial layer 52, and P polysilicon may only need to partially fill gate trenches 114. FIG. 7H illustrates the structure of FIG. 7D after trenches 114 having side spacers 130 are filled (partly or fully) with polysilicon 18 and polysilicon 18 is etched down to about 2 microns thick from bottoms of sidewall spacers 130. In situ doping or an ion implant may be used to make polysilicon regions 18 P-type. Following the poly etch step, nitride layer 110 is removed from the surface of the wafer. The structure shown in FIG. 7H may be formed using either the process flow of Table 2A or Table 2B. In particular, the structure of FIG. 7H differs from the structure of FIG. 7G in that none of the areas of gate trench 114 in FIG. 7H contain polysilicon rising to (or nearly to) the surface of epitaxial layer 52, which may be formed with no mask 2B process or may be formed in an area that mask 2B process exposes to etch down of polysilicon 132.

Mask 3 process uses an IPD (inter poly dielectric mask) such as a photoresist mask 134 as shown in FIG. 7I. Before forming photoresist mask 134, a HDP or sub-atmospheric chemical vapor deposition (SACVD) process deposits an HDP oxide or other dielectric layer over P polysilicon regions 18 within the opened gate trenches 114 of the structure of FIG. 7G or 7H. Next, the structure including the HDP oxide layer is planarized, e.g., using CMP, to the level of the top surface of epitaxial layer 52. After the planarization, photoresist mask 134 as the IPD mask may be applied onto the planarized surface, and the HDP oxide layer in areas of trenches 114 exposed by IPD mask 134 are etched down to leave inter-poly dielectric 24 about 0.2 to 0.3 micron thick on P polysilicon regions 16. Dielectric spacers 124 may be at a depth of in a 2 to 5 micron range, depending on the depth of gate trenches 114. Covered HDP regions 25 remain and fill trenches 114 that mask 134 covers.

FIG. 7J illustrates the structure of FIG. 7I after photoresist mask 134 is removed and a gate oxide 20 about 1000 to 1200 Å is grown on the sidewalls of the gate trenches. N+ polysilicon 26 is then deposited onto IPD layer 24 followed by planarizing the N+ polysilicon 26 using CMP.

FIG. 7K illustrates a structure formed using the process flow of Table 2B. After removing photoresist mask 134 of FIG. 7I, the structure can include areas of the gate trench containing P poly 132 extending to near the top surface of epitaxial layer 52 as well as areas containing the gate structure in which the HDP oxide has been etched down to open part of gate trench 114 and leave inter-poly dielectric 24. In the open areas of gate trench 114, a gate oxide 20 in a thickness range of 700-1500 Å may be grown, and N+ polysilicon 26, may be deposited and planarized, in the same manner described with reference to FIG. 7J. FIG. 7K shows a cross section of a region including P poly and N+ polysilicon filled areas of the gate trenches.

The Mask 4 process for the process flow of Table 2A or Table 2B employs an N+ emitter mask. Before an arsenic or other N-type ion implantation, an implant screen oxide 136 may be formed on the surface of the wafer by etching down to partially or fully remove gate oxide from the top surface of the wafer, and then growing or depositing ion implant screen oxide 136 for better thickness control. Then, photoresist mask 138 is patterned on the surface of the wafer, and an ion implant process forms N+ regions 17, as shown in FIG. 7L. N+ regions 17 may, for example, be formed by arsenic ion implantation with 60-120 Key energy and 5E15 to 1E16 cm$^{-2}$ dose.

The Mask 5 process for the process flow of Table 2A or Table 2B uses a P+ body contact etch mask. As shown in FIG. 7M, a photoresist mask 140 may be used to control selective removal of the oxide layer 126 within body contact trench 116.

The Mask 6 process for the process flow of Table 2A or Table 2B employs a P body mask 141. As shown in FIG. 7N, after removing (or altering) photoresist mask 140 and depositing an ion implantation screen oxide 142, P body contact mask 141 may limit ion implantation to body contact trench 116. P body 14 may be ion implanted with multiple energies and multiple ion doses.

The Mask 7 process employs a contact mask. As shown in FIG. 7O, before the contact mask is applied, a BPSG layer 28 is deposited over the structure of FIG. 7N. Next, using a photoresist mask 144, BPSG layer 28 is etched to expose P body 14, which is followed by a low energy boron implant into P body 14 to form P+ body layer 15 adjacent to the bottom surface of contact trench 16. Contact mask 144 may also expose a portion of HDP oxide layer 25 for an etch process that forms an opening through HDP oxide 25 to P polysilicon region 18.

FIG. 7P illustrates the Mask 7 process in the process flow of Table 2B. The illustrated structure includes a trench area where polysilicon contact region 132 extends to the top of trench 114. Photoresist mask 144, which may be the same in FIGS. 7O and 7P, exposes an area BPSG 28 above P polysilicon 132, so that BPSG layer 28 may be etched to form an opening through BPSG layer 28 to P polysilicon 132. The implant process that forms P+ body contact 15 also implants P poly 132 through a contact opening and can form P+ contact region 133 in P polysilicon 132.

The Mask 8 process employs a metal mask. As shown in FIG. 7Q, a metal adhesion layer including Ti/TiN/W may be deposited to fill the body contact trench 116 and openings through HDP oxide 25 and to cover BPSG layer 28. A further metal layer 152, which may be of Al:Si:Cu, is deposited over metal adhesion layer 150. FIG. 7R illustrates the Mask 8 process for the alternative shield poly contact structure created in the process flow of Table 2B. In the structure of FIG. 7R, the adhesion or Ti/TiN/W layer 150 is deposited to fill body contact trench 116 and the P polysilicon contact opening to P+ contact region 133 in P polysilicon 132. For the structures of FIGS. 7Q and 7R, the metal mask (not shown) is used to pattern metal layers 150 and 152 create interconnects and surface contacts of the device, e.g., the body contact(s), the P shield contacts(s), the gate contact(s), and edge termination for the IGBT device.

The Mask 9 process employs a passivation mask. A passivation layer 154, which may include an oxide layer and a polyimide layer, is deposited over metal layer 152, is etched via the photoresist mask (not shown) to expose contact pads, e.g., the body contact(s), the P shield contacts (s), the gate contact(s), and edge termination contact(s) for the IGBT device. FIG. 7S shows a cross-section of an IGBT fabricated using the process flow of FIG. 2A. FIG. 7T shows a cross-section of an IGBT fabricated using the process flow of FIG. 2B. The structures of FIGS. 7S and 7T differ in the contact structure for connection to P poly shield regions 18. In the structure of FIG. 7S, metal 150 contacts P poly shield region 18 through an opening in HDP oxide 25. In the structure of FIG. 7T, metal 150 contacts a P+ regions 133 of P polysilicon 132 near the top surface of epitaxial layer 52, and P polysilicon 132 is contiguous with P poly shield region 18 in a shared gate trench. The resulting structure of FIG. 7S or 7T may be similar or identical to a portion of an active area of IGBT 200 described above with reference to FIGS. 2A and 2B.

Figure 8A:
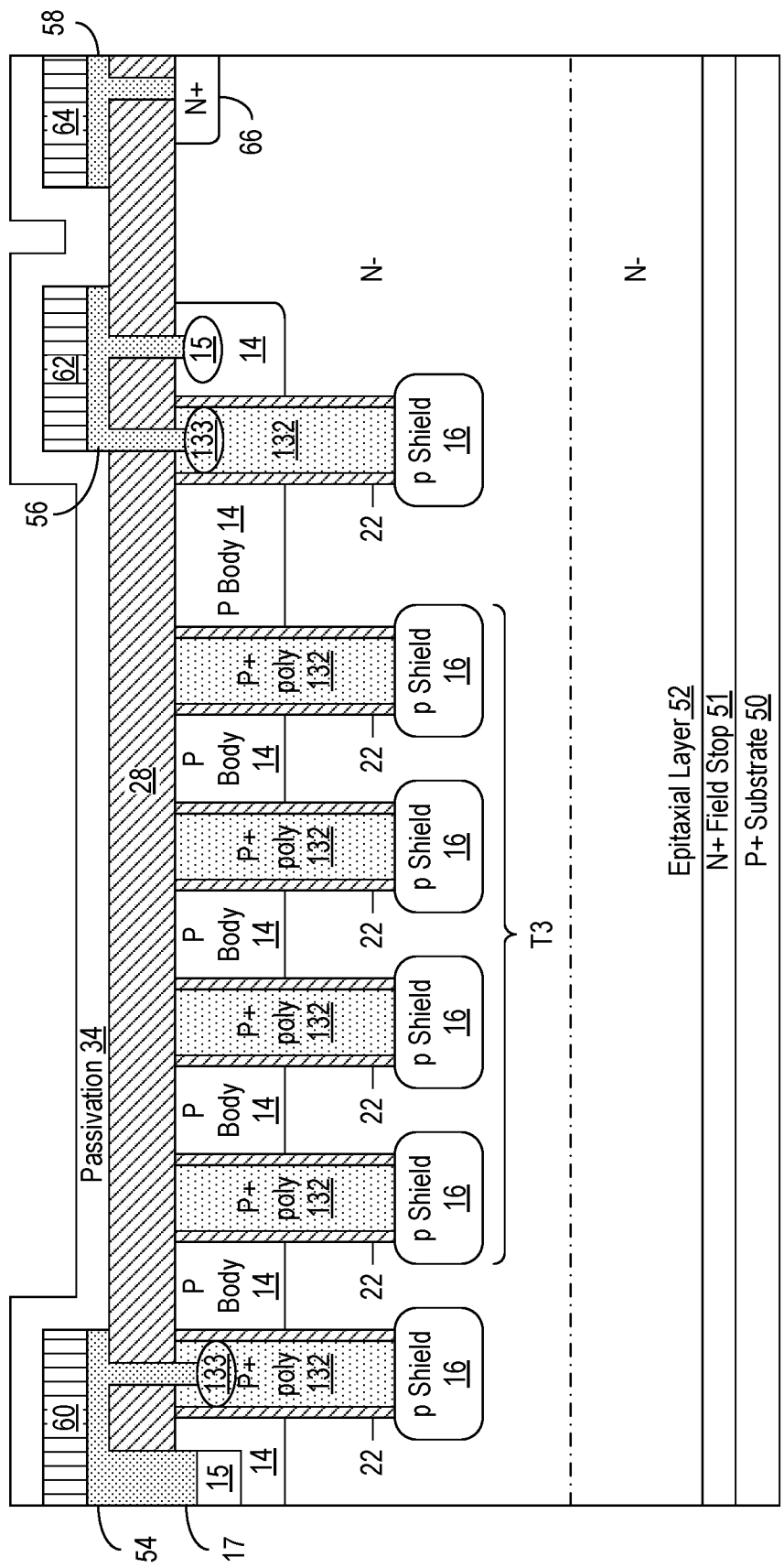
FIGS. 8A, 8B, and 8C show cross-sectional views of configurations for edge termination areas of trench IGBTs in different implementations of the invention.
Figure 8B:
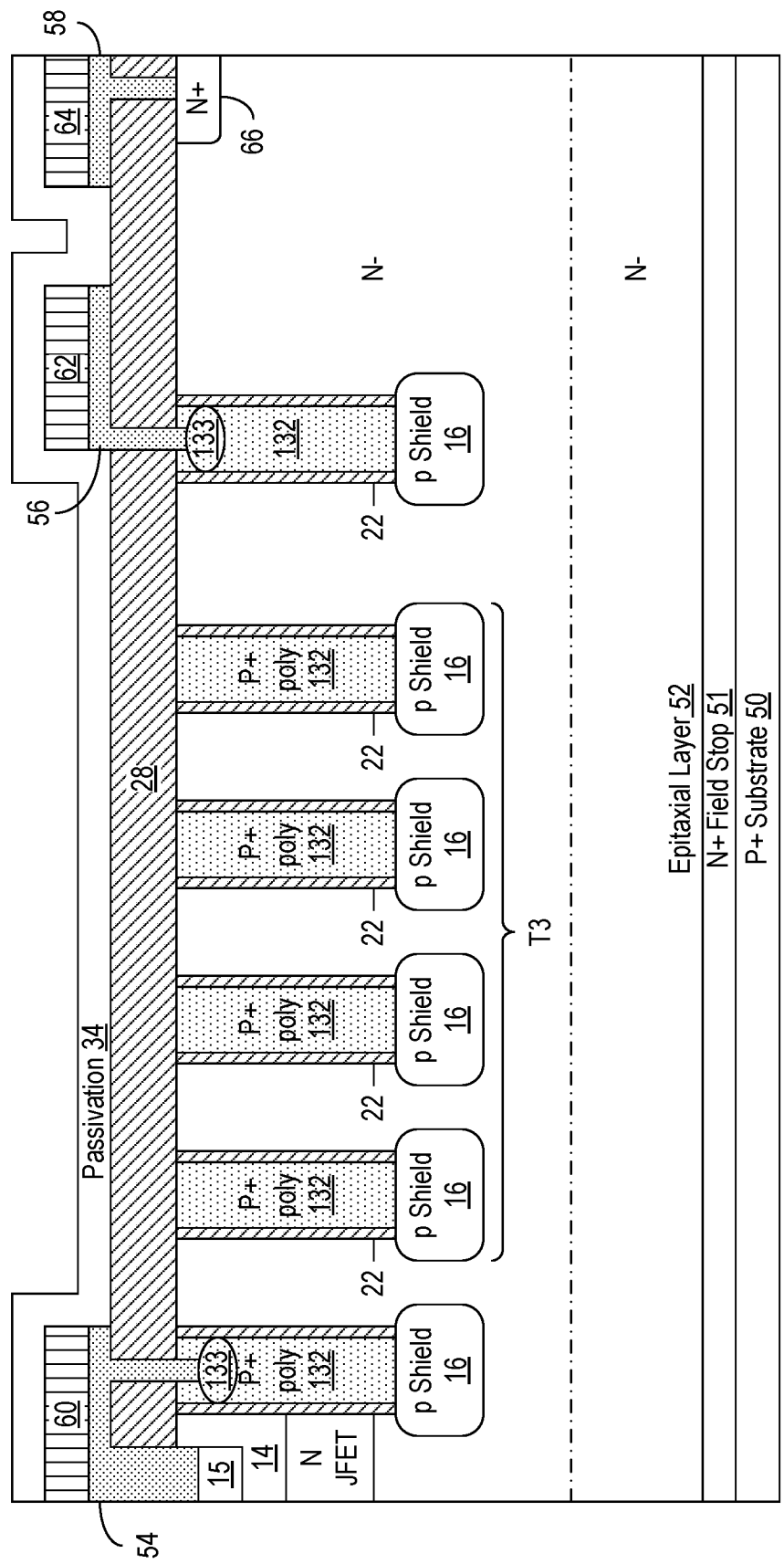
Figure 8C:
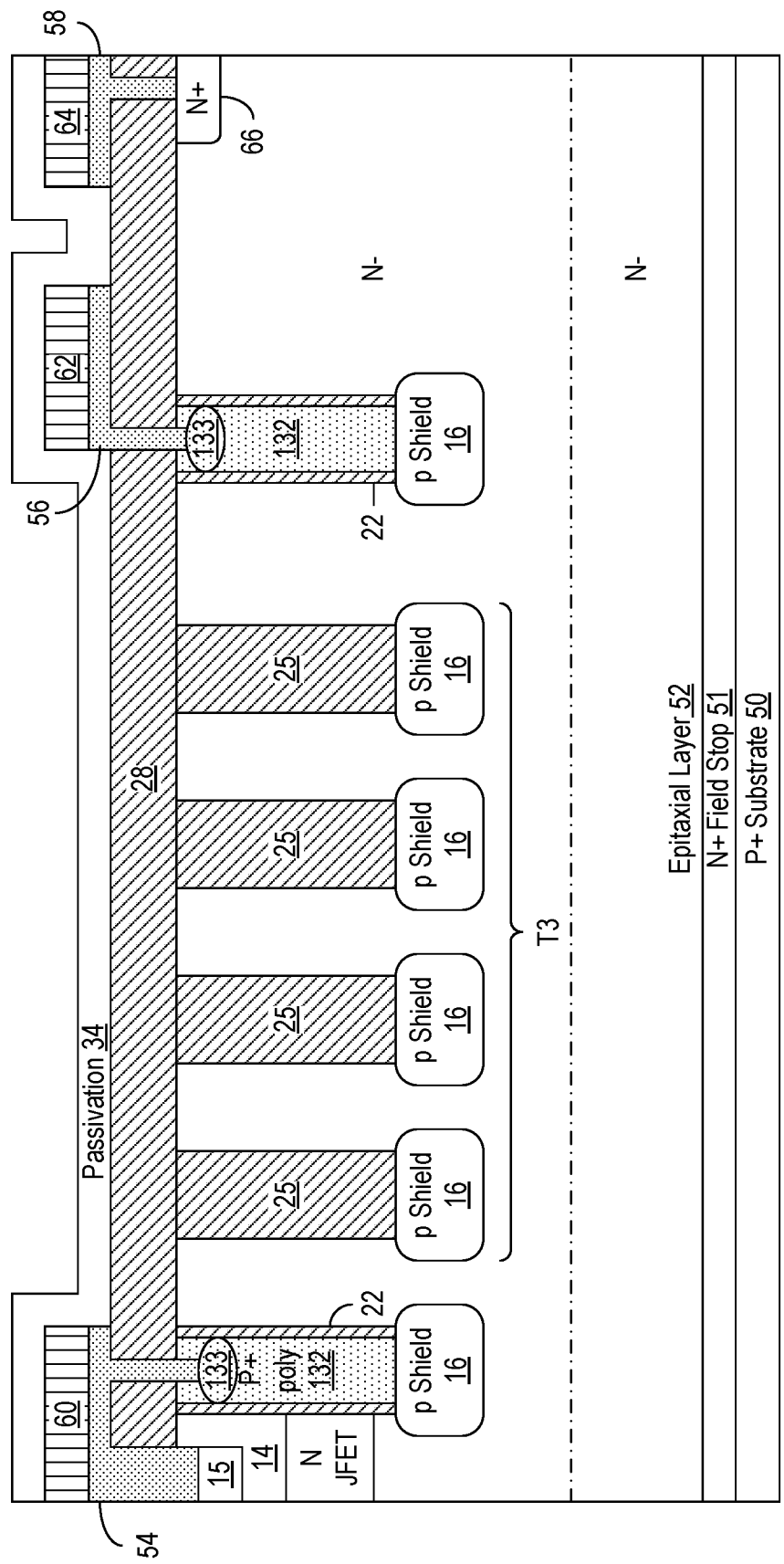

FIGS. 8A, 8B, and 8C illustrate alternative IGBT edge termination configurations that may be fabricated using the process flow of Table 2B. Edge termination structures that are similar to the illustrated configurations, but having P poly silicon regions 132 replaced with HDP oxide 25 or HDP oxide with shield contact structures through HDP oxide 25, can be fabricated using the process flow of Table 2A. The illustrated configurations include floating shield regions 16 or 18 in trench areas T3. "Floating" in this case means that the floating region 16 and 18 are not ohmically contacting any one of the device electrodes either directly or indirectly. The purpose of floating some or all P poly and P shield regions 16 and 18 is to have more electron and hole carrier storage in the upper portion of the N− drift region of the IGBT device to lower the voltage Vce across collector and emitter electrodes of the IGBT. However, too many stored electrons and holes in the N− drift region of the IGBT, may slow down IGBT turn off. Therefore to optimize speed and Vce tradeoffs, not all P Poly and P Shields are floating, only some may be floating in IGBTs for applications requiring faster turn off.

FIG. 8A particularly shows a cross-section in an edge termination area of an IGBT resulting from the process flow of Table 2B. The illustrated IGBT structure includes an emitter contact 60, a P-shield contact 62, and an edge termination contact 64 and termination structure with P body regions between floating P poly filled trench rings. The trench areas shown in FIG. 8A all include P+ polysilicon 132 extending from P shield regions 16 buried in epitaxial layer 52 to near a top surface of epitaxial layer 52. The P+ polysilicon region 132 in the gate trench closest to the active area is electrically coupled or shorted to emitter contact 60 and to emitter or P body region 14. The P+ polysilicon region 132 in the gate trench furthest from the active area is electrically coupled or shorted to P-shield contact 62. A number of P+ polysilicon regions 132 in the intervening gate trenches may be fully floating. P shields with P poly filled trenches 132 distribute the applied voltage in a controlled fashion at the termination from the die edge to the emitter to prevent low voltage breakdown. The number of floating P+ polysilicon regions 132 in the edge termination area may be chosen according to the desired breakdown voltages of the IGBT.

FIG. 8B shows an alternative cross-section in an edge termination area of an IGBT resulting from the process flow of Table 2B. The edge termination configuration of FIG. 8B differs from the edge termination configuration of FIG. 8A in that the structure of FIG. 8B does not have body regions between the floating P-poly-filled trench rings.

FIG. 8C shows another alternative cross-section in an edge termination area of an IGBT resulting from the process flow of Table 2B. The edge termination configuration of FIG. 8C differs from the edge termination configurations of FIGS. 8A and 8B in that the structure of FIG. 8C has some field ring trenches filled with oxide above buried P shield regions and a field ring trench with P poly field plates.

In an exemplary embodiment, a 650 V trench field stop (FS) IGBT using structure such as described above may employ floating P poly shield regions and an N− epitaxial region about 52 microns thick with 8E13 cm$^{-3}$ N type doping concentration to provide a breakdown over 800V. At a 700 V bias condition for the exemplary structure, the highest impact ionization rate is beneath the body trench contact region, which is the most desirable location for the purpose of robust IGBT device performance and reliability because breakdown is more repeatable and reliable at the PN Junction. The highest impact ionization area starts the breakdown first which is localized beneath the body trench contact region at 700 V Vce. (In contrast, breakdowns tending to occur at the oxide and silicon interface are more variable, i.e., not reliable.) Collector-emitter current (Ice), in the exemplary configuration, generally increase as a function of collector-emitter voltage (Vce), e.g., at gate-emitter voltage (Vge) of 15 V. A 2D simulation shows the impact of floating both P poly shield regions on the increasing collector-emitter current density (Jce) which is 750 A/cm$^2$ at 1.5 V Vce. The Ice versus Vce curve from the 2D simulations of the exemplary embodiment having only floating P poly shield region and shorting a second P poly shield region to the emitter can reduce carrier storage inside the IGBT drift region. This occurs especially at areas close to the top surface of N and N− drift region, around the P shield regions, which will speed up IGBT turn off. However, the current density, Jce at 1.5-V Vce significantly reduced from 750 A/cm2 down to 125 A/cm2. Emitter shorting of the both P poly shield regions will further increase the IGBT turn off speed but also decrease Jce or increase Vce.

Table 3 lists eight mask steps for an alternative fabrication process in accordance with another implementation of the present invention. Table 3 particularly illustrates a process in which the gate trenches and contact trenches in a trench MOSFET or a trench IGBT are not self aligned.

TABLE 3

| MASK | PROCESS STEP |
| --- | --- |
| 1 | Trench Mask |
| 2 | P Polysilicon Mask |
| 3 | Inter Poly Dielectric Mask |
| 4 | P Body Mask |
| 5 | N+ Emitter |
| 6 | Contact Mask |
| 7 | Metal Mask |
| 8 | Passivation Mask |

The fabrication process of Table 3 may begin with a wafer including epitaxial layer 912 and a field stop layer 910 that were grown on a substrate (not shown). The type of substrate employed generally depends on the type of trench device being fabricated. For example, a trench MOSFET may be fabricated on a substrate having the same conductivity type as epitaxial layer 912, e.g., N type for an N-channel trench MOSFET. A trench IGBT may be fabricated on a substrate having an opposite conductivity type as epitaxial layer 912, e.g., a P+ substrate for an N-type epitaxial layer 912. The following description assumes a process employing an N type epitaxial layer 912, but more generally, conductivity types could be reversed to fabricate other types of trench devices.

Figure 9A:
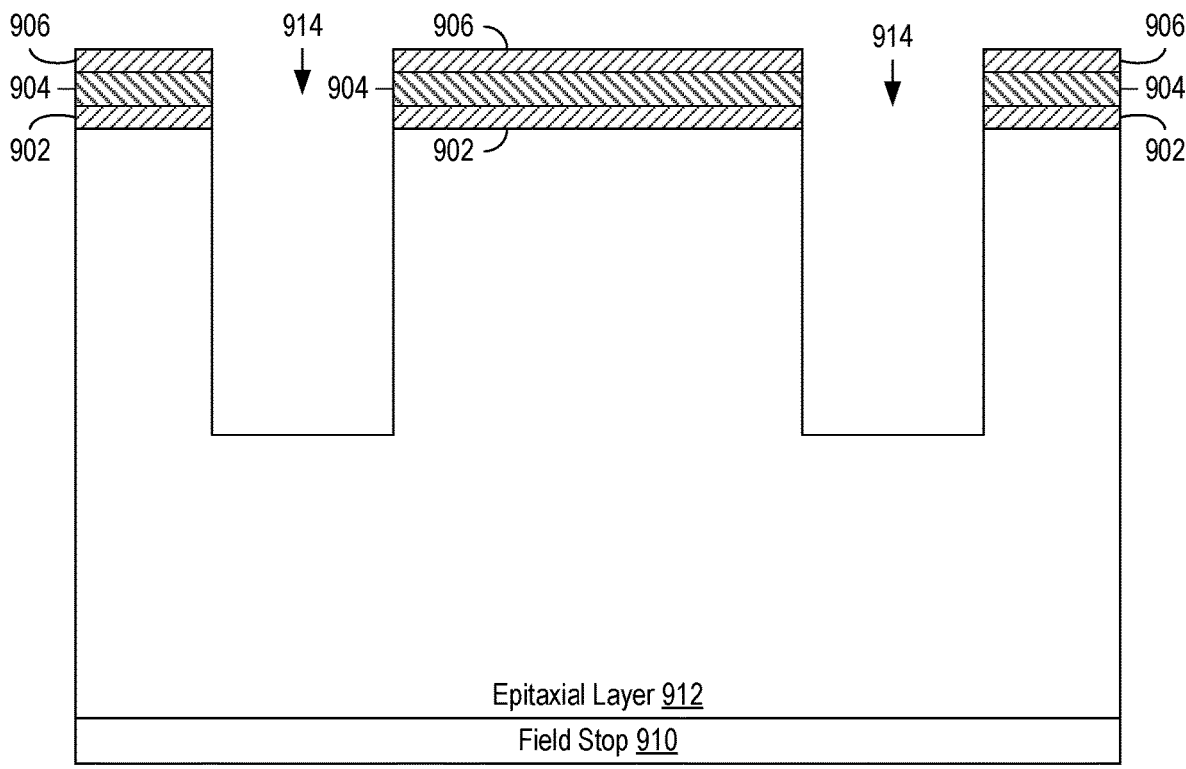
FIGS. 9A to 9U show cross-sectional views of structures created during a process forming shielded trench MOSFET or IGBT devices with gate trenches and contact trenches that are not self-aligned.
Figure 9B:
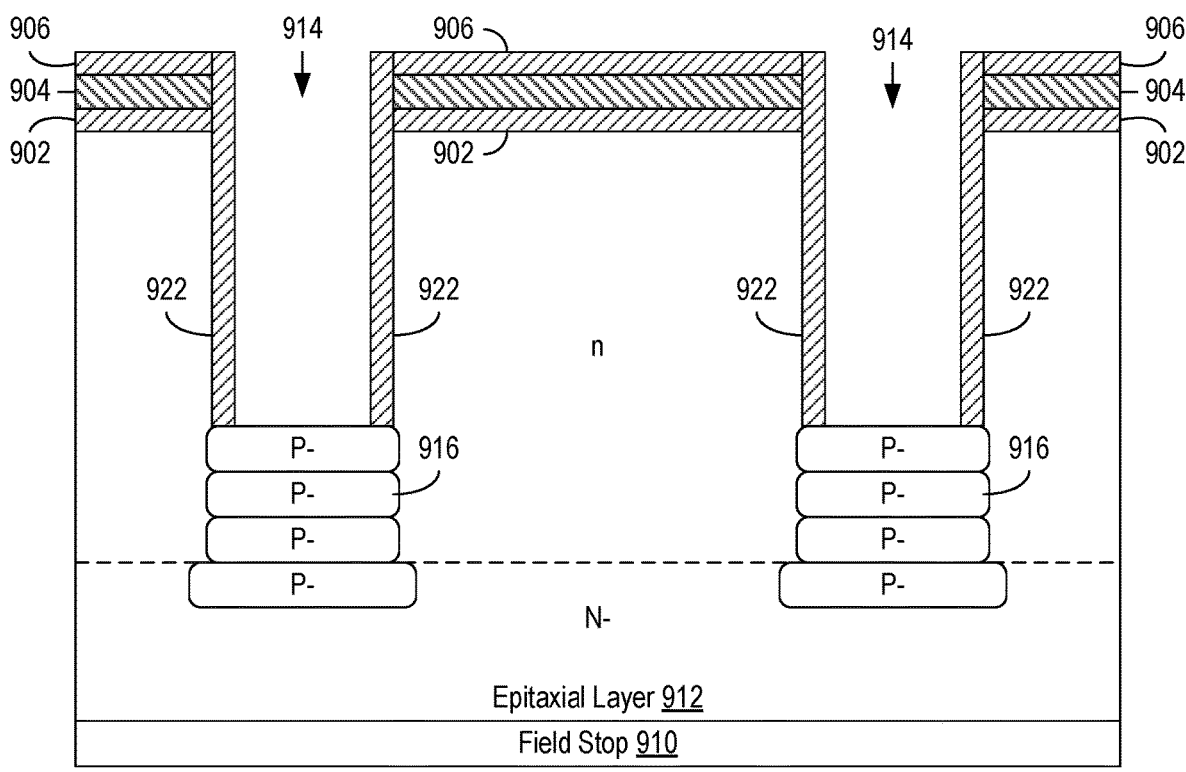
Figure 9C:
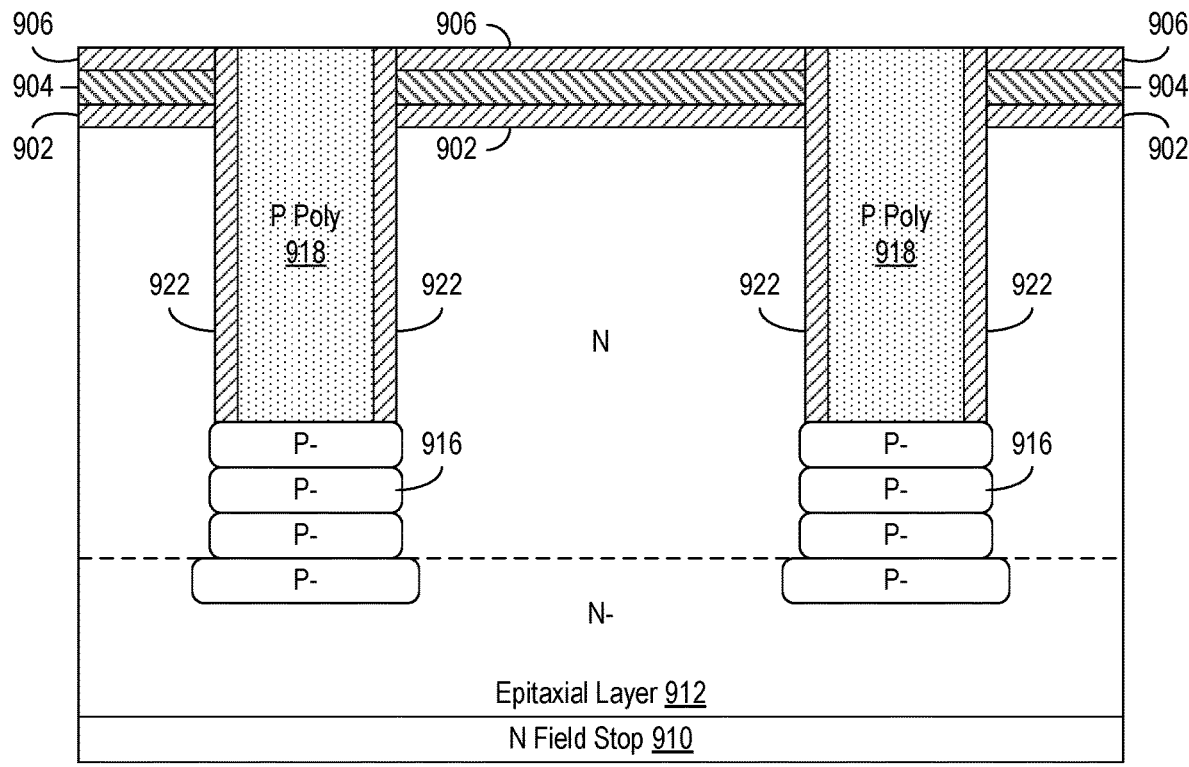

A Mask 1 process in the process flow or Table 3 employs a trench mask to etch gate trenches in epitaxial layer 912, and FIGS. 9A, 9B, and 9C illustrate structures created during the Mask 1 process. As shown in FIG. 9A, a hard mask including a first silicon dioxide layer 902, a silicon nitride layer 904, and a second silicon oxide layer 906 is patterned to expose trench areas of epitaxial layer 912. Using the hard mask, gate trenches 914 may be etched to a depth selected for gate trenches, e.g., between about 3 to 6 microns. P shield regions 916 may be implanted at the bottom of trenches 914. An LPCVD oxide layer of about 1000 Å may be deposited into trenches 914 and then anisotropically etched using reactive ion etch (RIE) to leave sidewall spacers 922 as shown in FIG. 9B. Then, a multi-energy and multi-dose boron or other P-type ion implantation, e.g., at 60 KeV to 3 MeV range, forms shield regions 916 in epitaxial layer 912 below gate trenches 914. A P polysilicon layer 918 may be deposited in trenches 914 and may be subject to deposition and implantation processes before P polysilicon 918 fully fills trenches 914 and is planarized to surface of the wafer as shown in FIG. 9C.

Figure 9D:
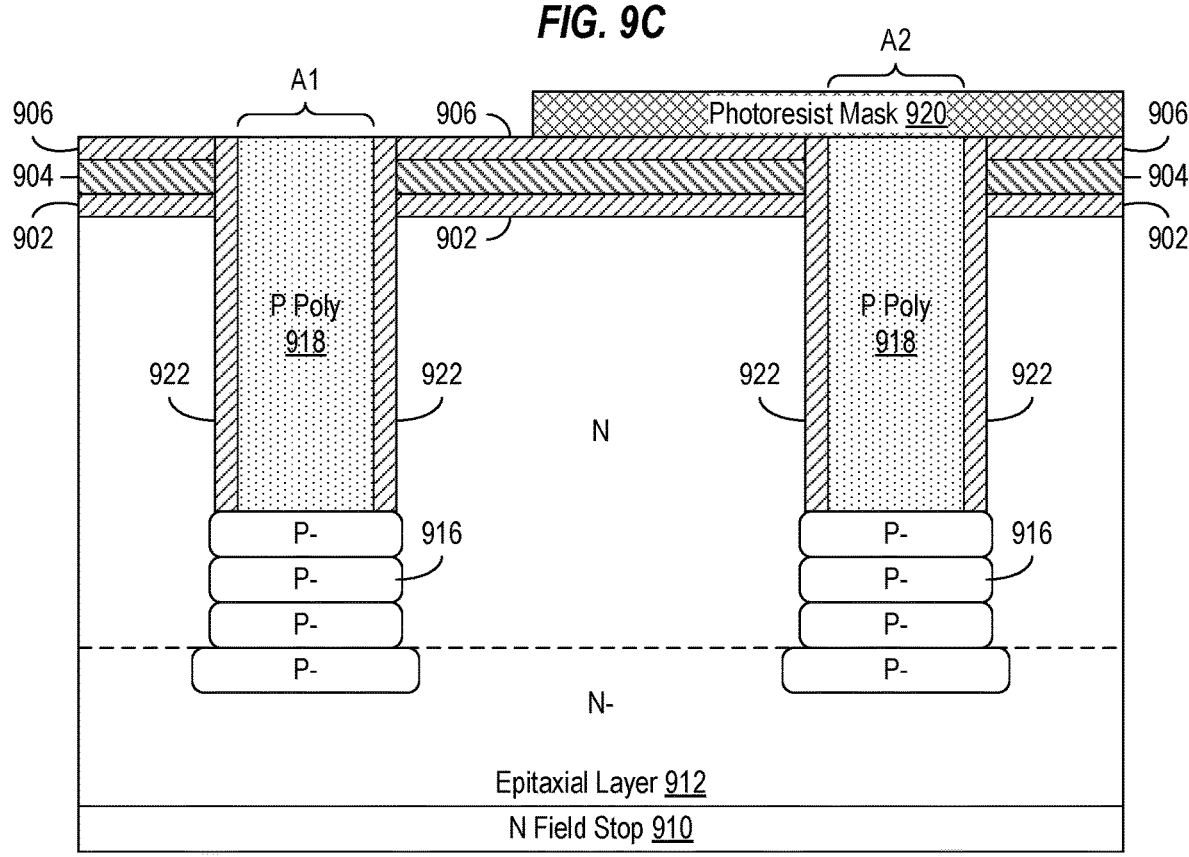
Figure 9E:
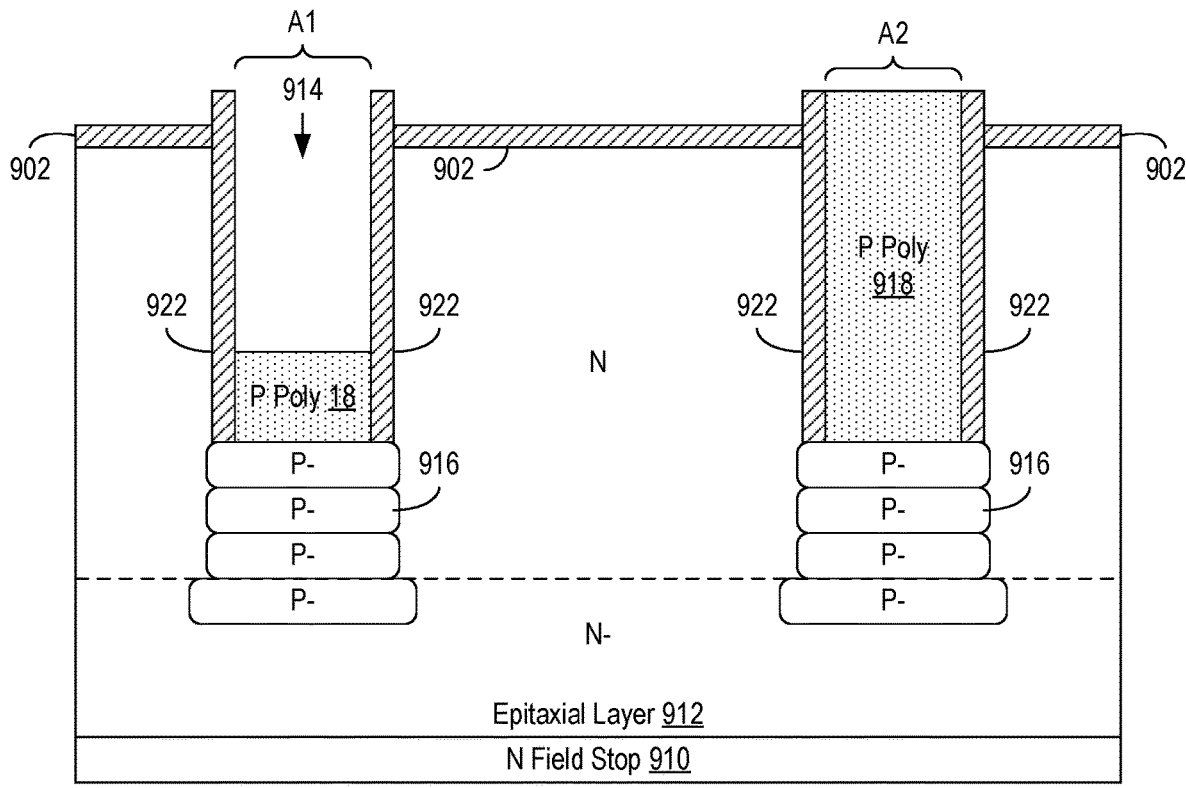
Figure 9F:
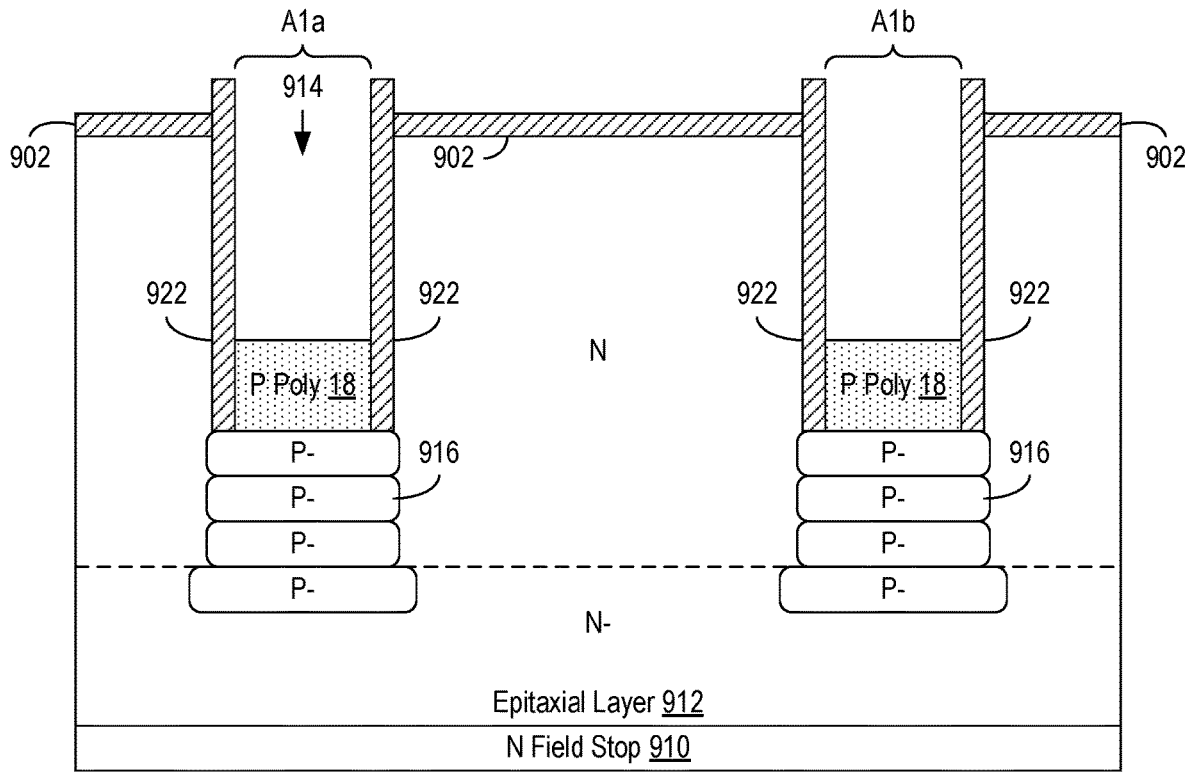

The Mask 2 process of Table 3 employs a P polysilicon mask. FIGS. 9D, 9E, and 9F show cross-sections of structures formed during the Mask 2 process. The Mask 2 process may keep some trench areas A2 fully filled with P polysilicon 918 and may etch down polysilicon 918 in other trench areas A1. FIG. 9D illustrates a photoresist mask 920 patterned to cover trench areas A2 containing P polysilicon 918 and expose other trench areas A1 containing P polysilicon 918. Exposed P polysilicon 918 is etched down via mask 920 to form P shield regions 18, which will be buried in trench areas A1. Photoresist mask 920, oxide layer 906, and nitride layer 904 may be removed, leaving oxide layer 902 on the surface of the wafer and poly shield regions 18, P polysilicon 918, and sidewall spacers 922 in the gate trenches 914 as shown in FIG. 9E. FIG. 9F illustrates a different portion of the structure and particularly a portion including two areas A1a and A1b where P doped polysilicon 918 was deposited and subsequently etched down to about 2 microns from the trench bottom, leaving P polysilicon regions 18.

Figure 9G:
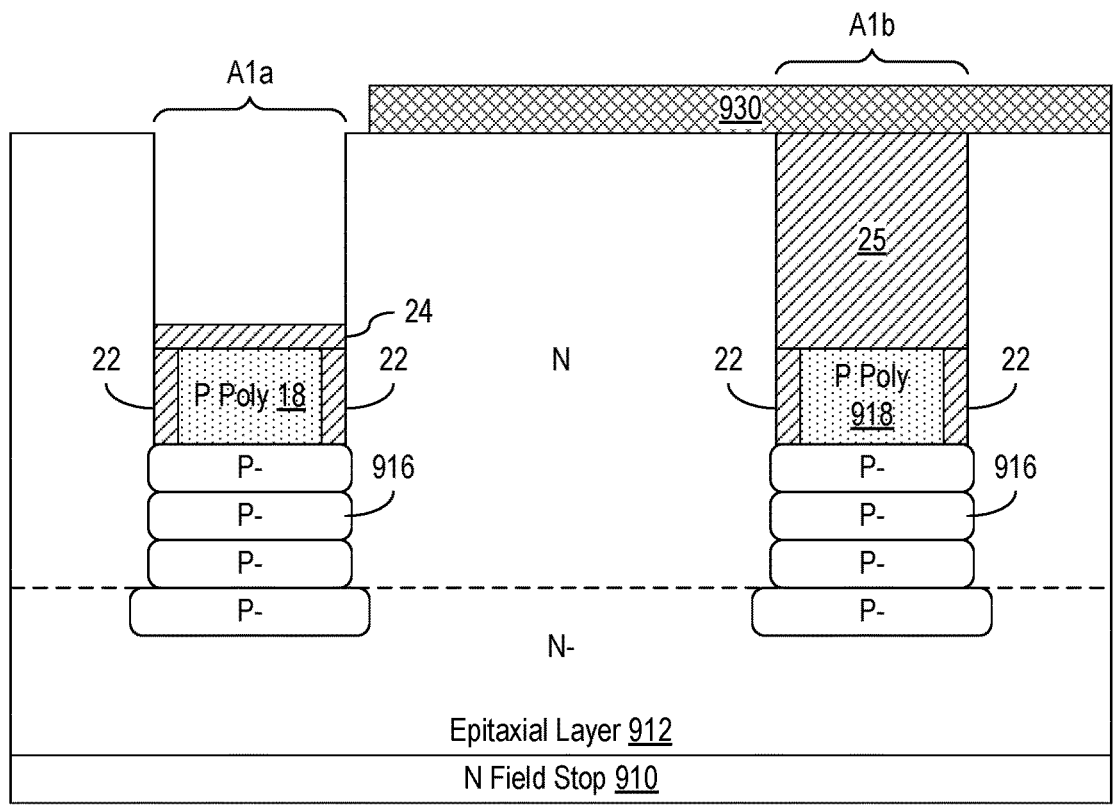
Figure 9H:
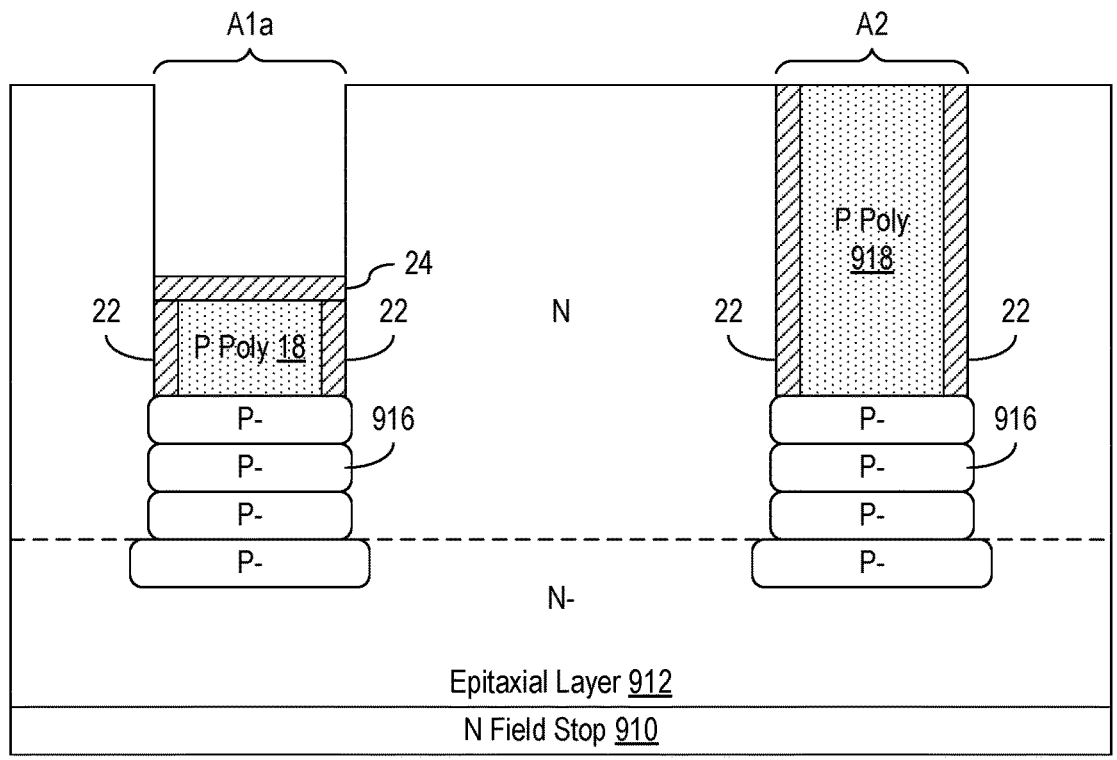
Figure 9I:
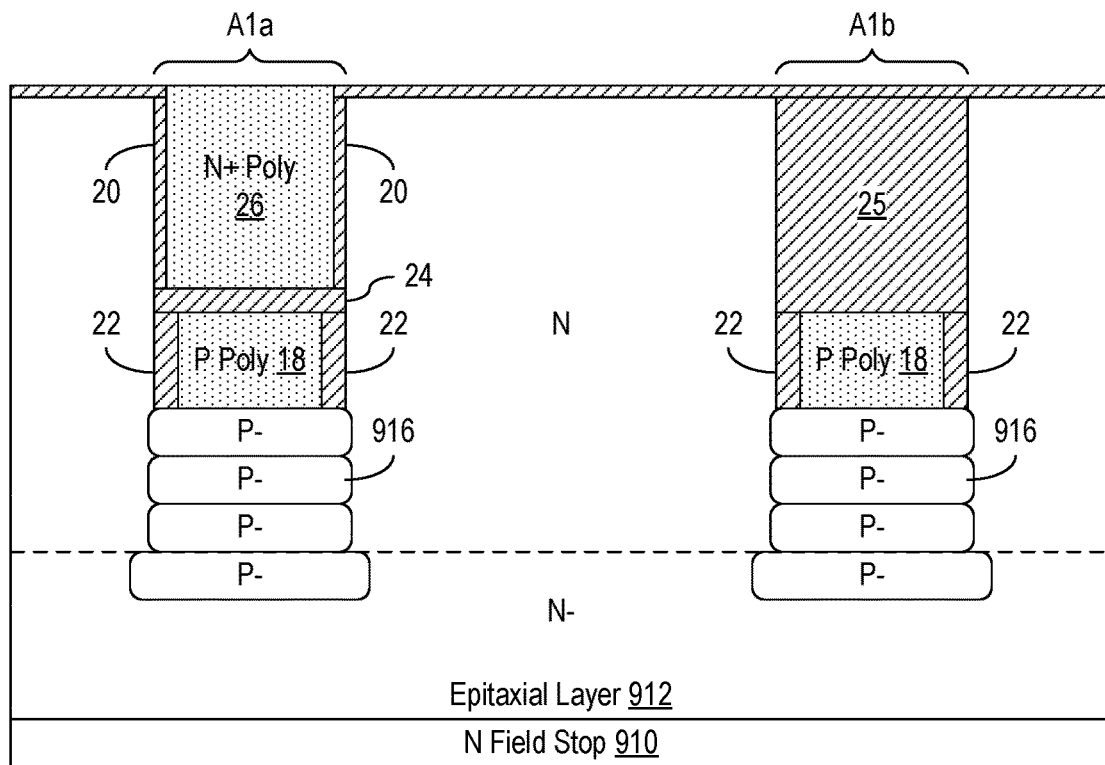
Figure 9J:
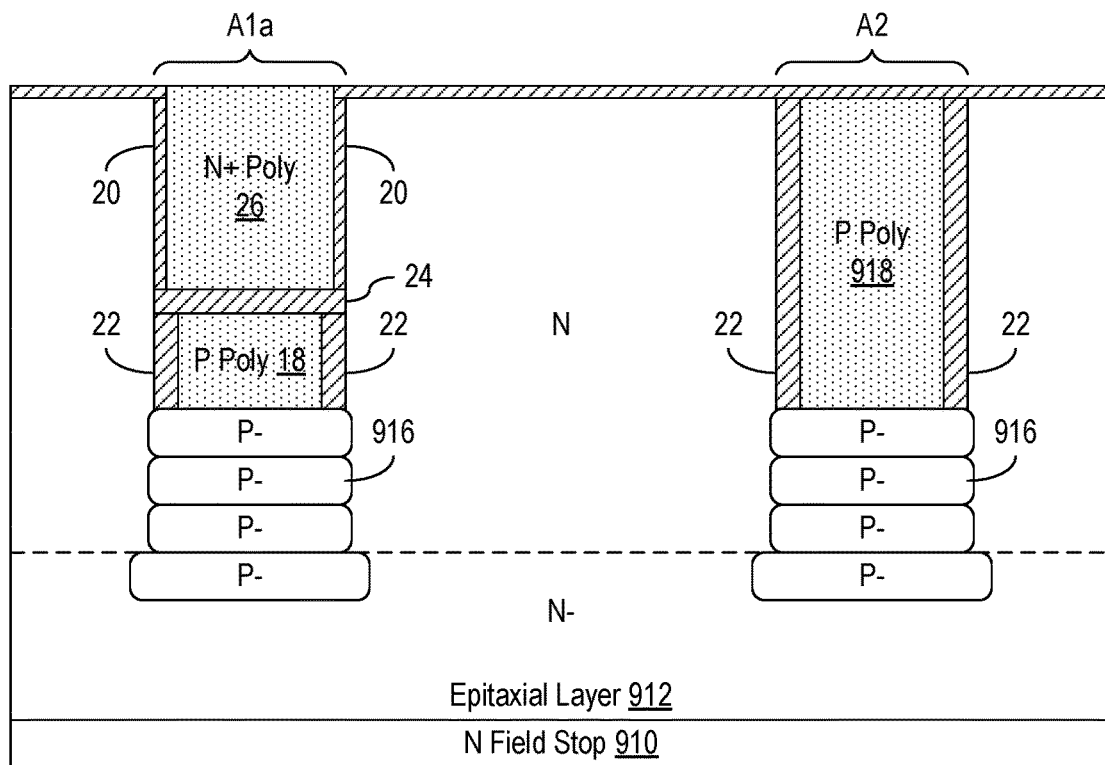

A Mask 3 process employs an Inter-Poly Dielectric (IPD) mask. FIGS. 9G, 9H, 9I, and 9J show cross-sections of structures formed during the Mask 3 process. For the Mask 3 process, an HDP or SACVD oxide layer may be deposited in all trench areas that are not filled with P poly 918. The deposited oxide 25 may be planarized using CMP, and an IPD photoresist mask 930 may expose areas A1a where deposited oxide 25 will be etched down to form inter-poly dielectric layers 24 and may cover trench areas A1b where HDP oxide 25 will remain filling the trench as shown in FIG. 9G. FIG. 9H illustrates a portion of the structure where P polysilicon 918 (with sidewall spacers 22) fills trench area A2 and where etched down IPD spacer 24 remains in trench area A1a over P poly shield region 18 after the Mask 3 etch process. After removing mask 930 and cleaning the wafer, a gate oxide 20 in a thickness range of about 700-1500 Å may be grown, e.g., in trench areas A1a. Next, N+ polysilicon 26 may be deposited and planarized. FIG. 9I and FIG. 9J illustrate different regions of the device. FIG. 9I illustrates trench area A1a with N+ polysilicon 26 above P poly shield region 18 and inter-poly spacer 24 and trench area A1b with IPD region 25 above P poly shield region 18. FIG. 9J illustrates trench area A2 where P poly 918 (with sidewall spacers 22) fills the trench and contacts shield region 916 in epitaxial layer 912.

Figure 9K:
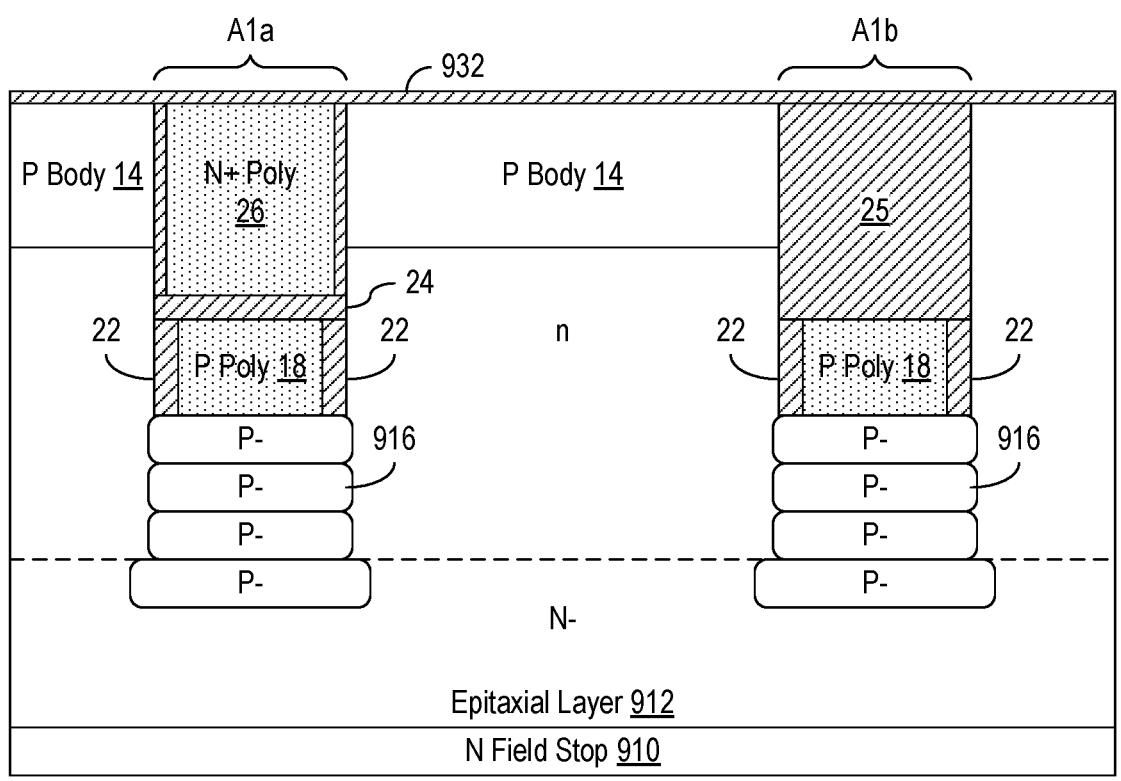

The Mask 4 employs a P body mask for a trench MOSFET or a trench IGBT. For the Mask 4 process, gate oxide 20 may be etched down or removed from the top surface of the wafer, and an ion implant screen oxide 932 as shown in FIG. 9K may be deposited or grown for better thickness control. A photoresist mask (not shown) is then applied and patterned to expose regions where P body regions 14 are desired, and P body regions 14 may be ion implanted in epitaxial layer 912 via the P body photoresist mask. The P body ion implant process may be followed by wafer cleaning and an annealing or driving process for P body 14. FIG. 9K illustrates the resulting structure including P body regions 14 in mesas between trenches.

Figure 9L:
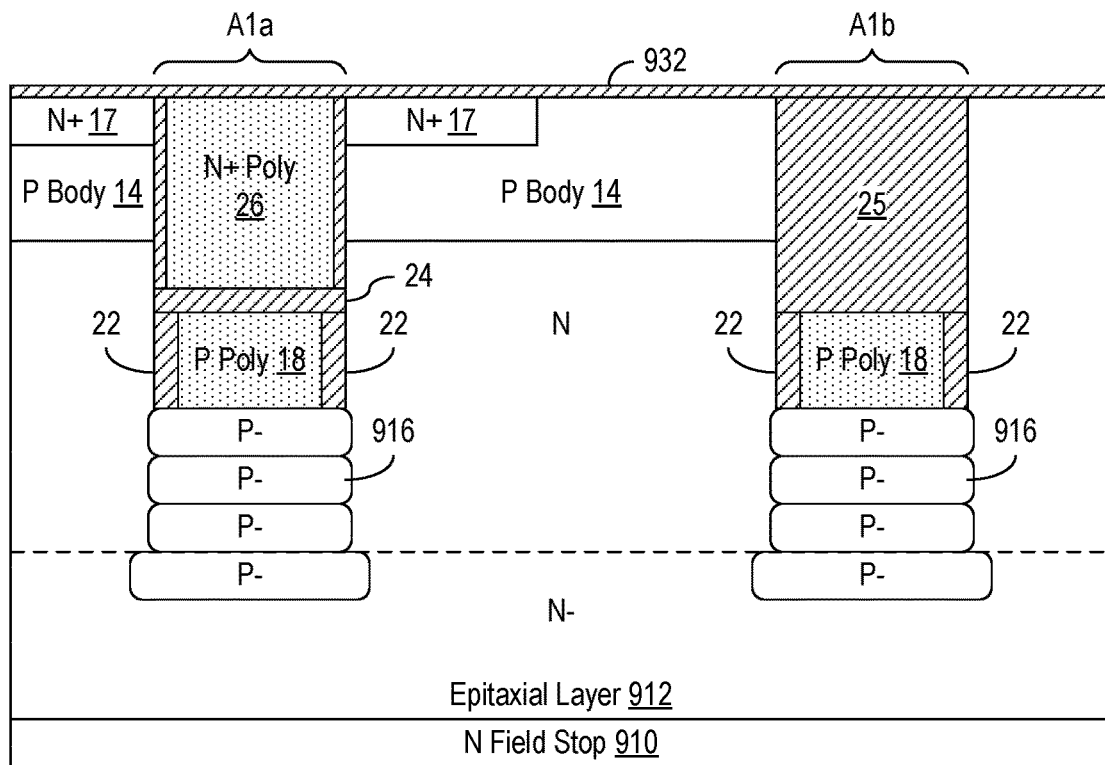
Figure 9M:
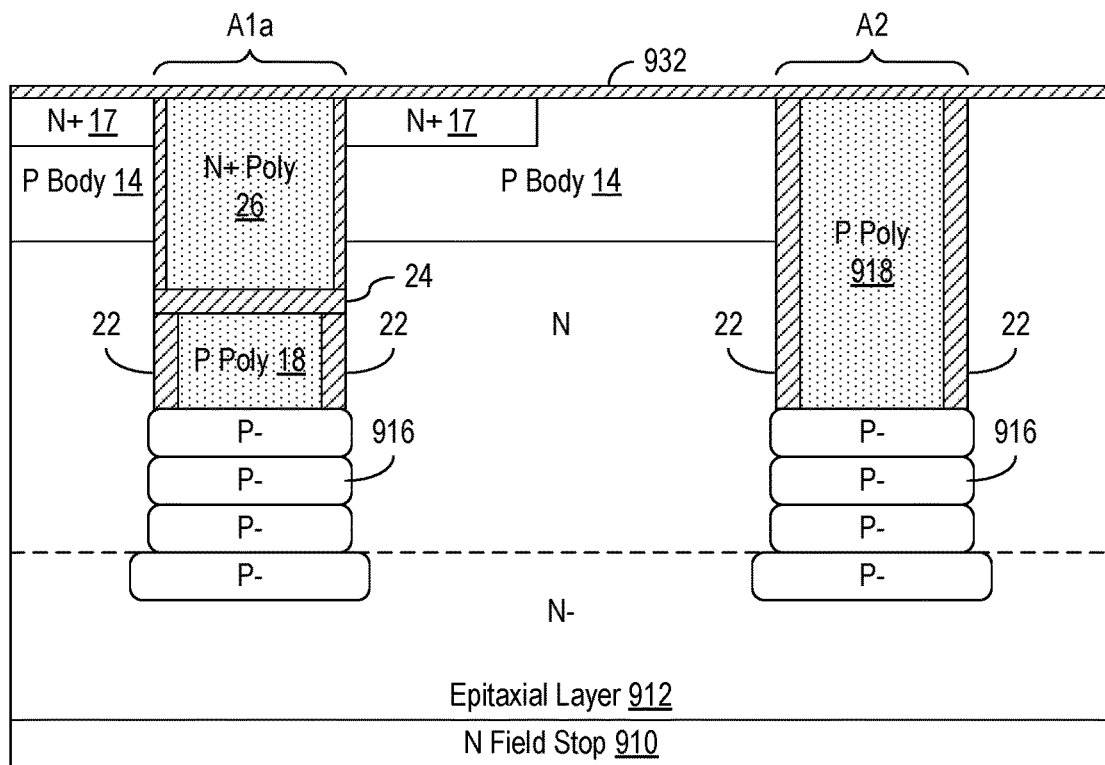

The Mask 5 process employs a N+ emitter or source mask for trench IGBT or MOSFET fabrication. FIGS. 9L and 9M show cross-sections of different regions of the device after the Mask 5 process forms N+ regions 17. As noted above, screen oxide 932 was formed after gate oxide 20 was etched down or removed from the surface of the wafer, and screen oxide 932 may remain when N+ regions 17 are implanted in areas exposed by an emitter photoresist mask (not shown).

Figure 9N:
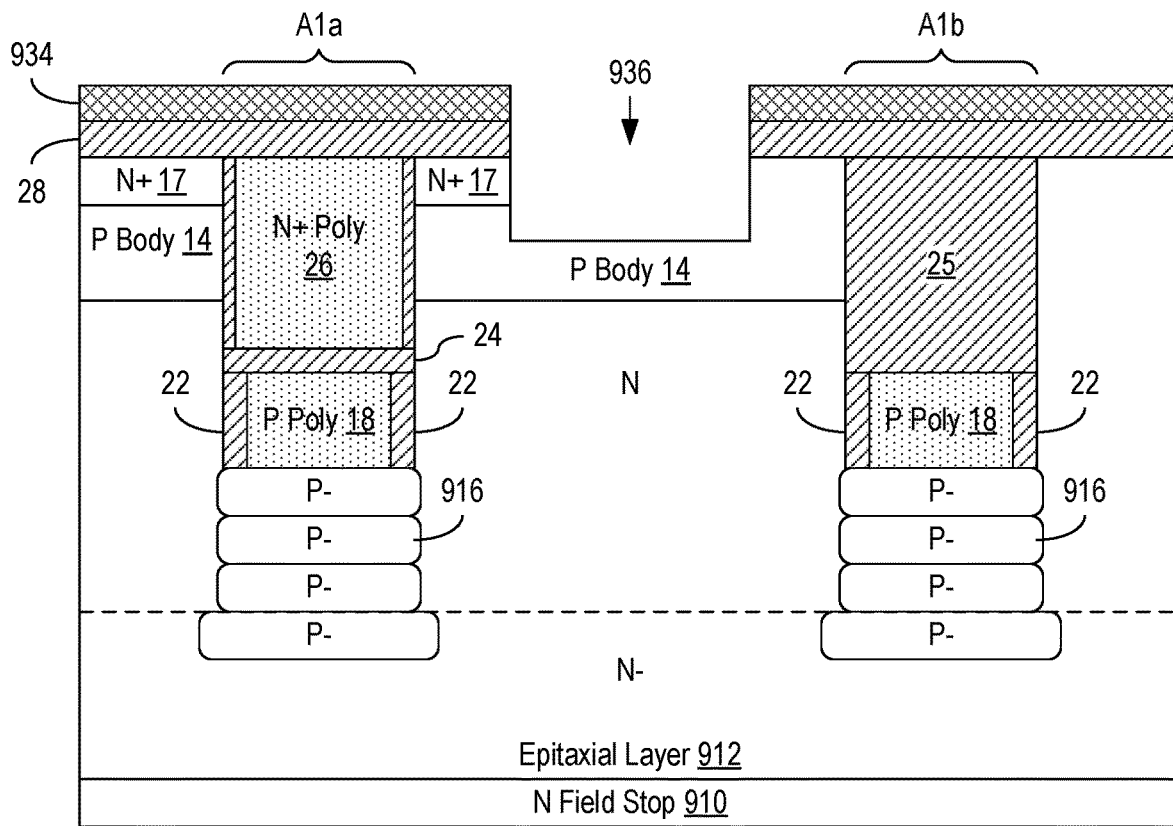
Figure 9O:
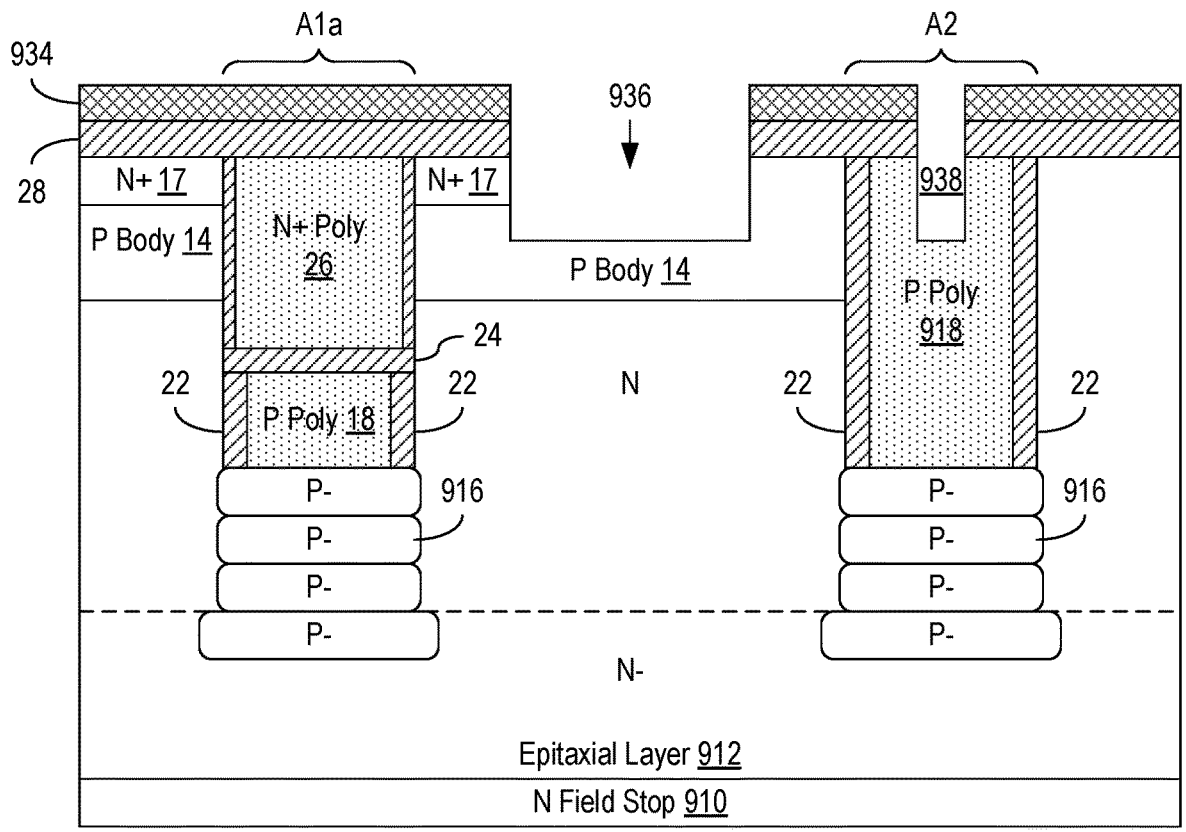
Figure 9P:
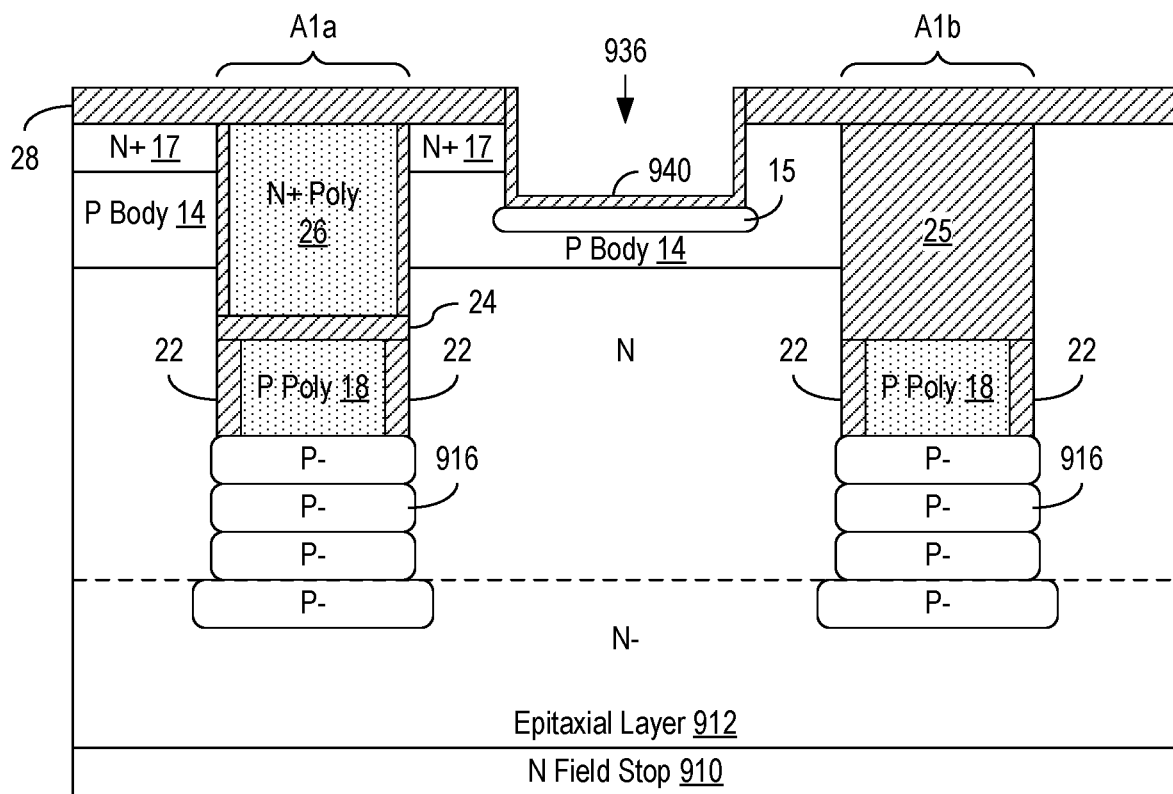
Figure 9Q:
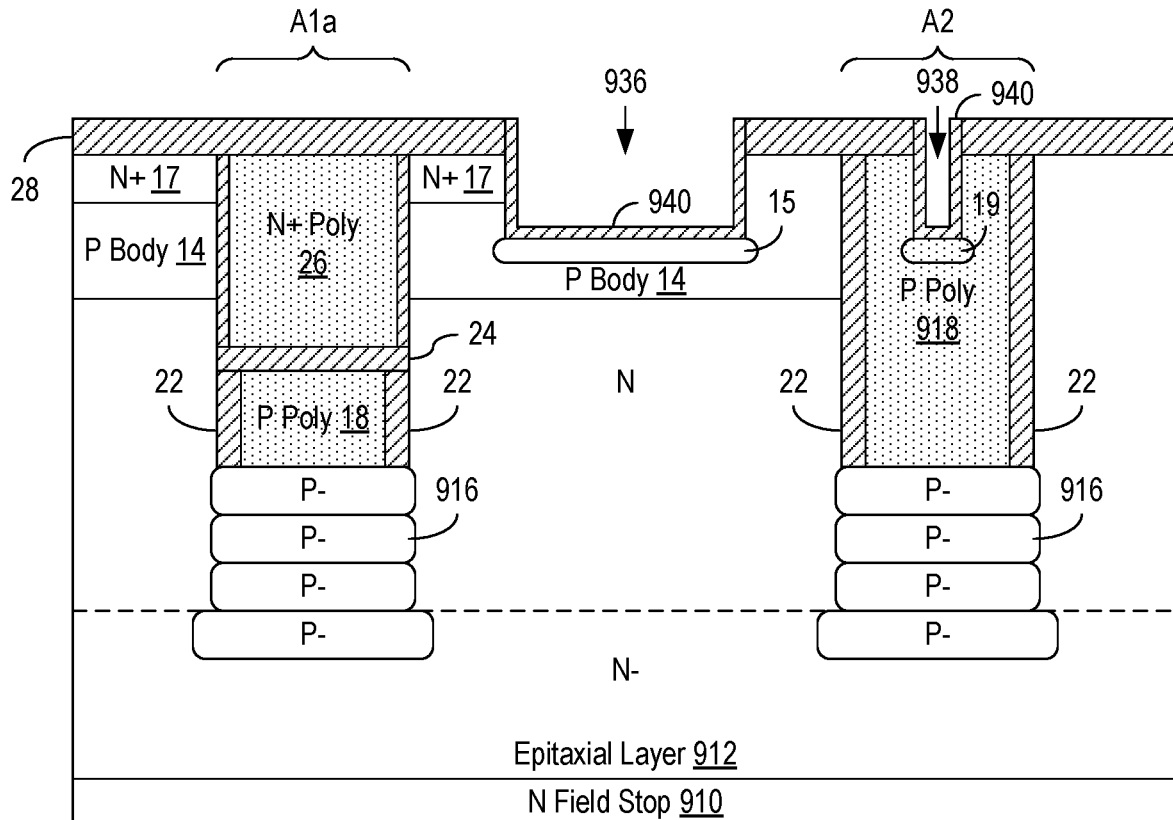

The Mask 6 process employs a contact mask applied after formation of a BPSG layer 28. FIGS. 9N, 9O, 9P, and 9Q show cross-sections of the different regions of the device during or after the Mask 6 process. FIG. 9N and FIG. 9O illustrate trench areas A1a, A1b, and A2 of the device after contact etching of BPSG layer 28 through a photoresist mask 934. The contact etch forms a source/body contact trench 936 through BPSG 28 and into P body region 14 in epitaxial layer 934 between trench areas and forms an opening 938 through BPSG 28 and into P polysilicon 918 in trench area A2. Photoresist mask 934 may then be removed and any surface oxide may be etched/removed from source/body contact trench 936, before a screen oxide 940 is formed and a boron, $BF_2$, or other P-type ion implant process forms P+ body contact regions 15 at the bottom of the source/body contact trench 936 and a P+ contact region 19 in P poly 918. FIGS. 9P and 9Q illustrate the different regions of the device with P+ body contacts. As noted above, source/body contact trench 936 is formed during a different mask process from the mask process used for the gate trenches. Accordingly, being non-self-aligned, contact trenches 938 are subject to alignment errors relative to the gate trenches, but the process of Table 3 does not required any specific relationship between the sizes of the contact and gate trenches.

Figure 9R:
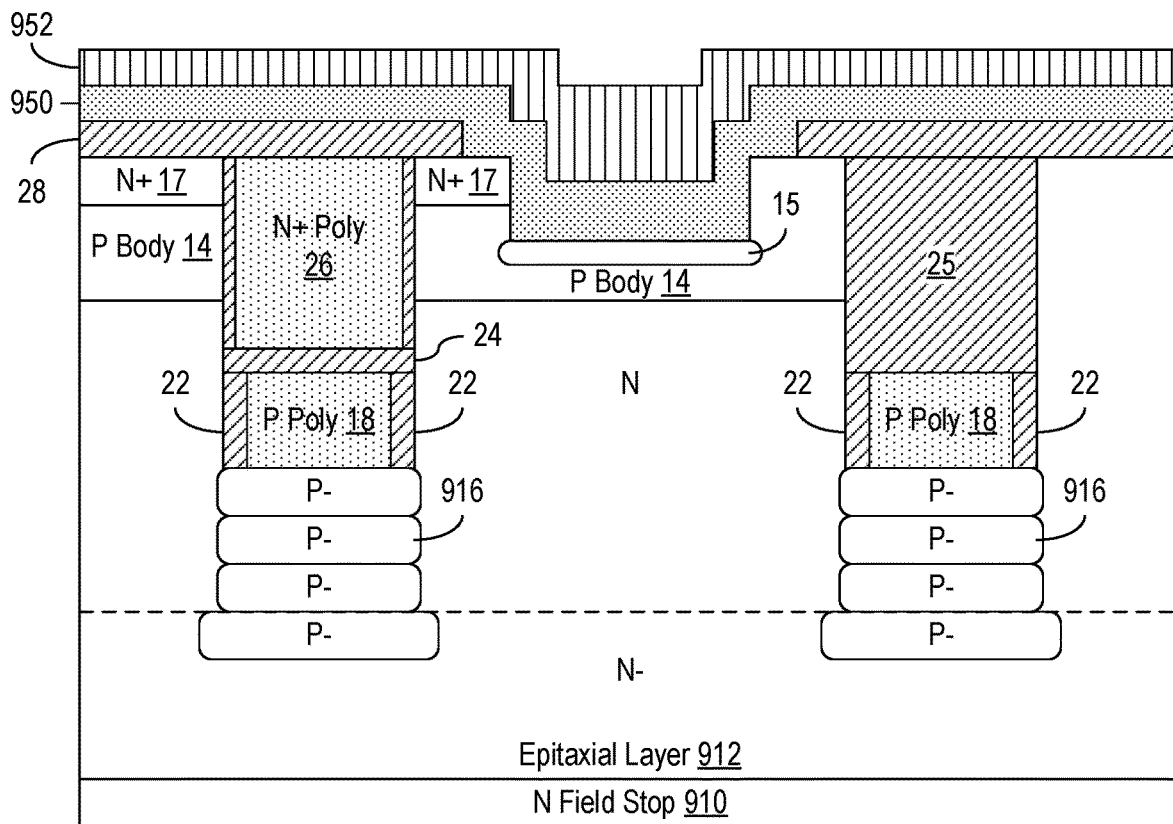
Figure 9S:
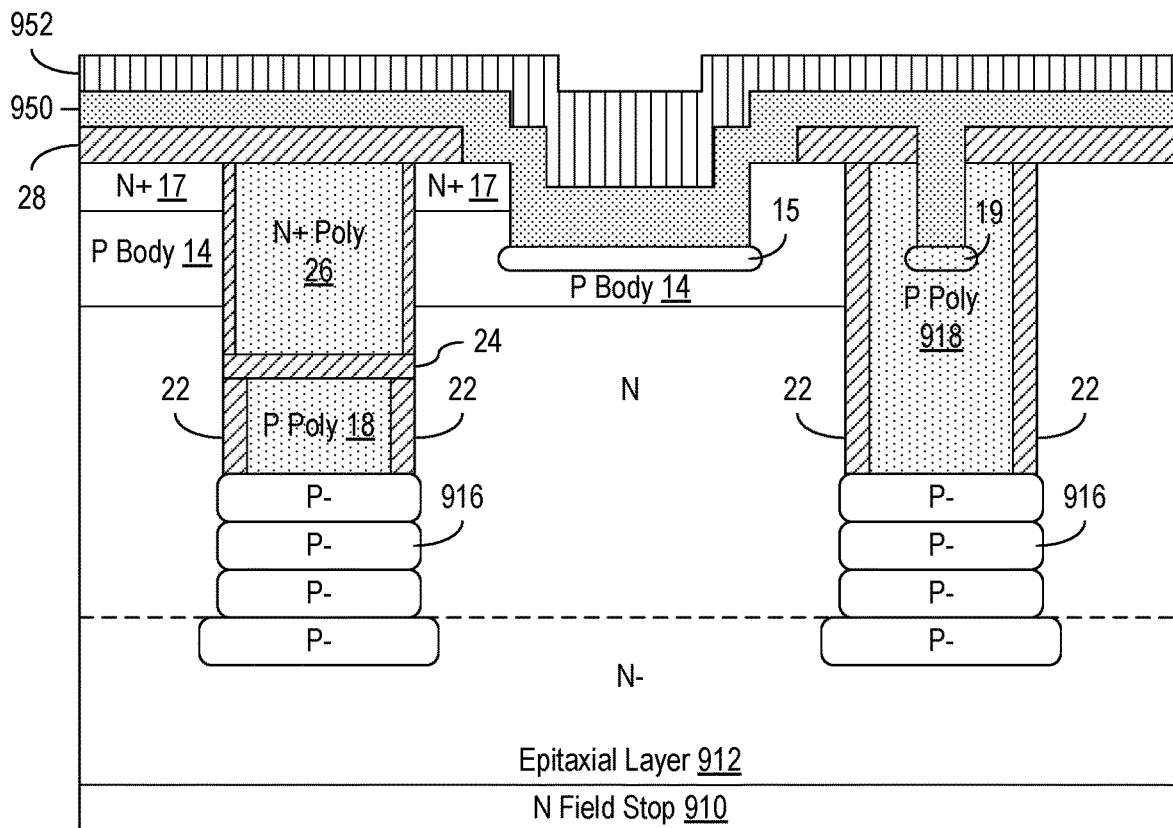

The Mask 7 process employs a metal mask. FIGS. 9R and 9S show cross-sections of the different regions of the device after the Mask 7 process. As shown in FIGS. 9R and 9S, after screen oxide 940 is removed and BPSG layer 28 is partially etched back, a Ti/TiN/W layer 950 is deposited to fill contact opening 938 and adhere to epitaxial layer 912 including source regions 17 and P+ body contact 15. A metal layer 952, e.g., an Al:Si:Cu layer, is then deposited. The metal mask is used to pattern metal layers 950 and 952 to separate contacts and interconnects.

Figure 9T:
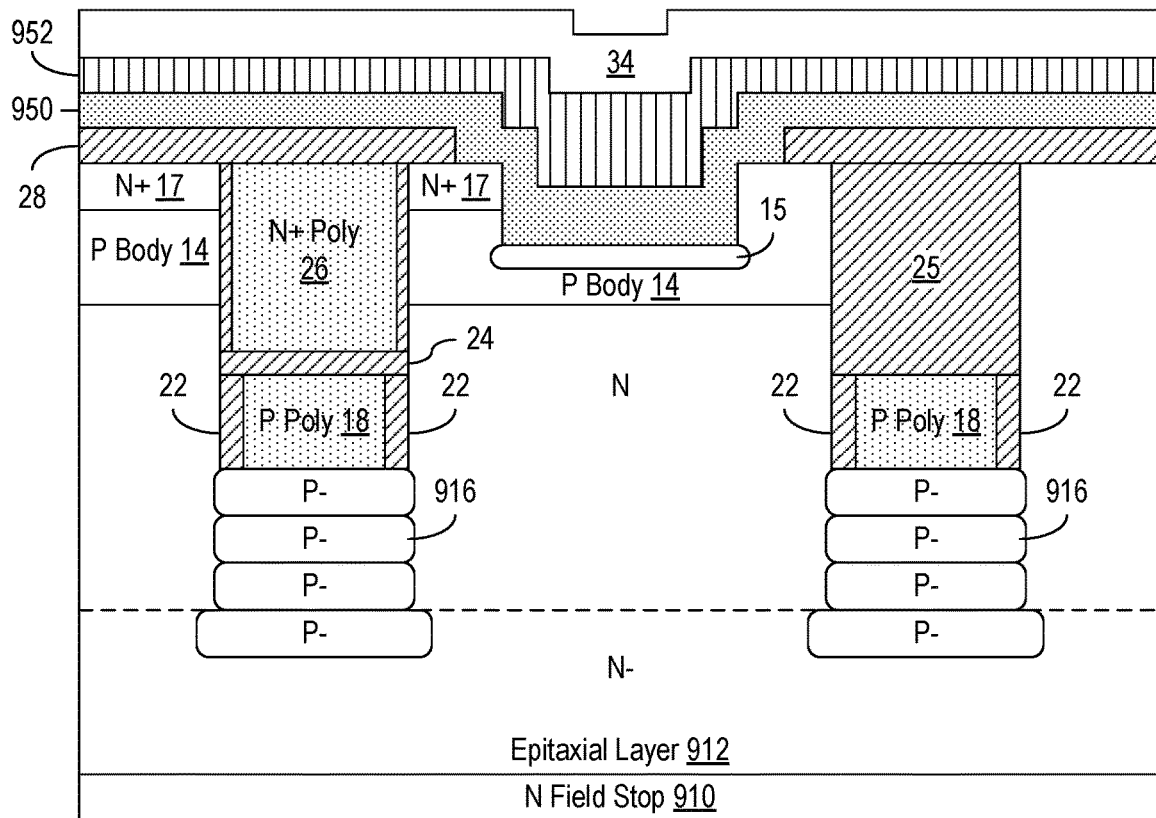
Figure 9U:
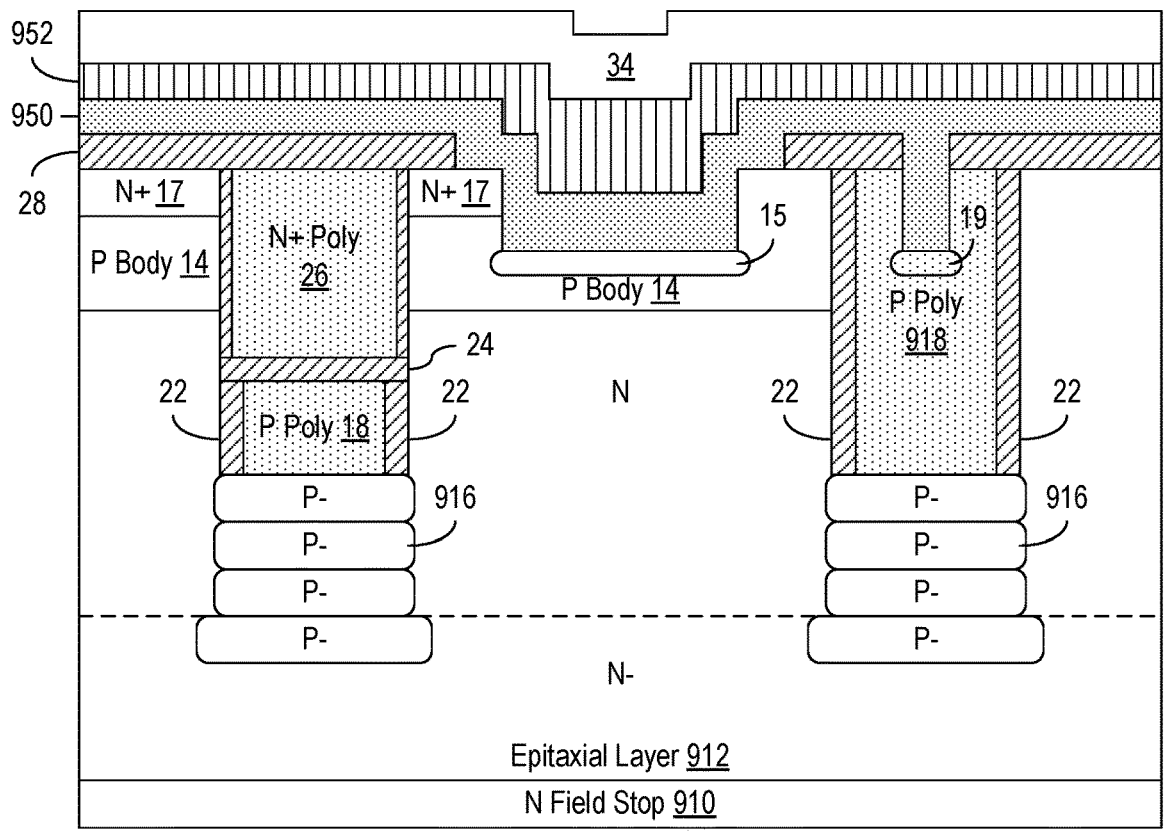

The Mask 8 process employs a passivation mask. As shown in FIGS. 9T and 9U, a passivation layer 34, which may include oxide and polyimide layers, is deposited on the patterned metal layer 952 and etched via the passivation mask (not shown) to create openings to contact pads of the device.

Figure 10A:
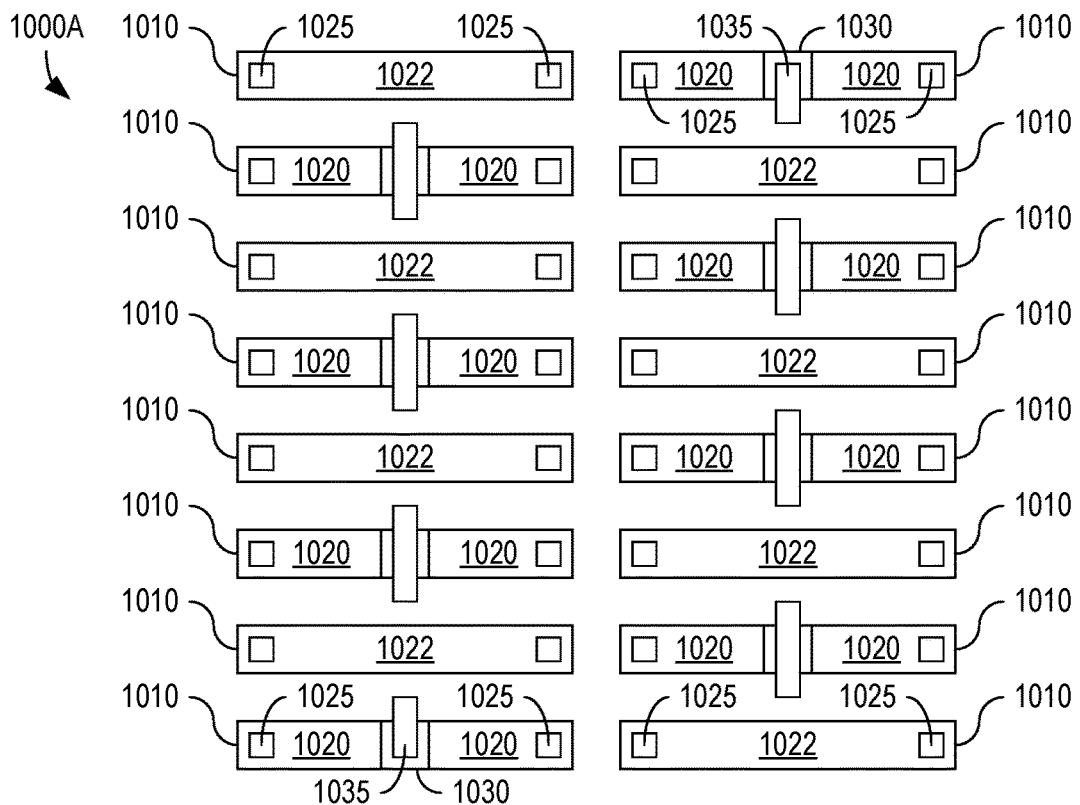
FIGS. 10A, 10B, and 10C show top views of the active areas of trench devices and different arrangements of trench areas containing gate structures, electrical vias, or dielectric above shield structures.
Figure 10B:
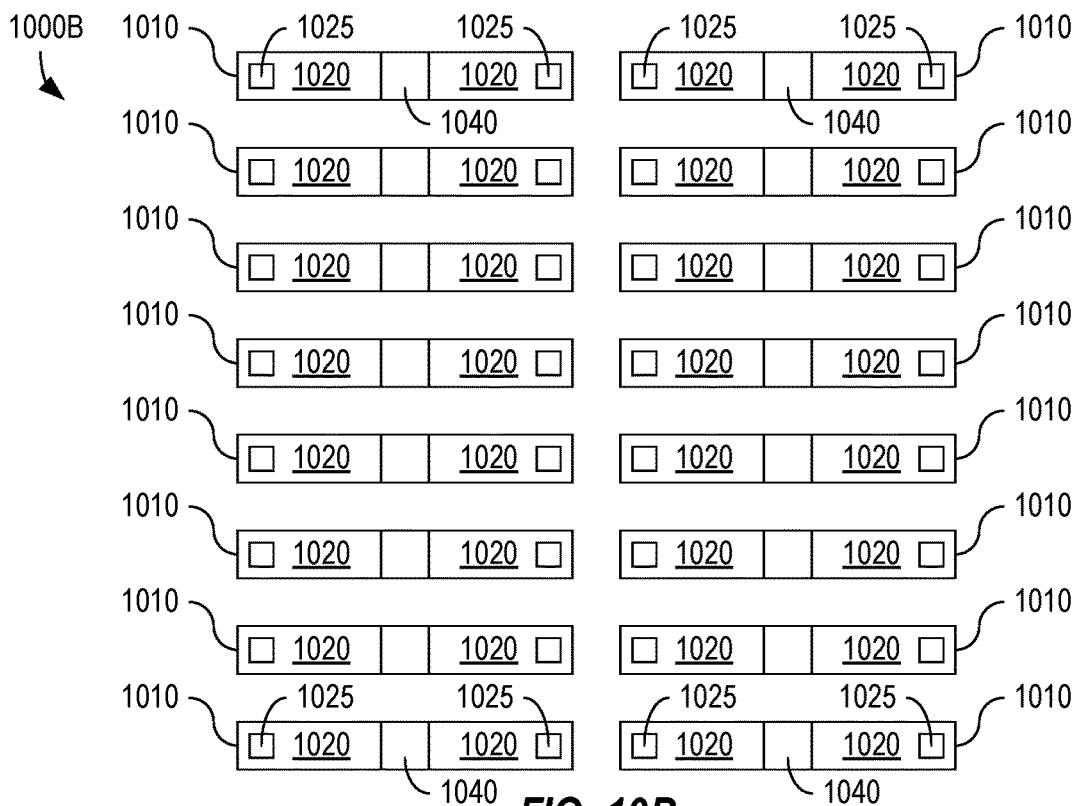
Figure 10C:
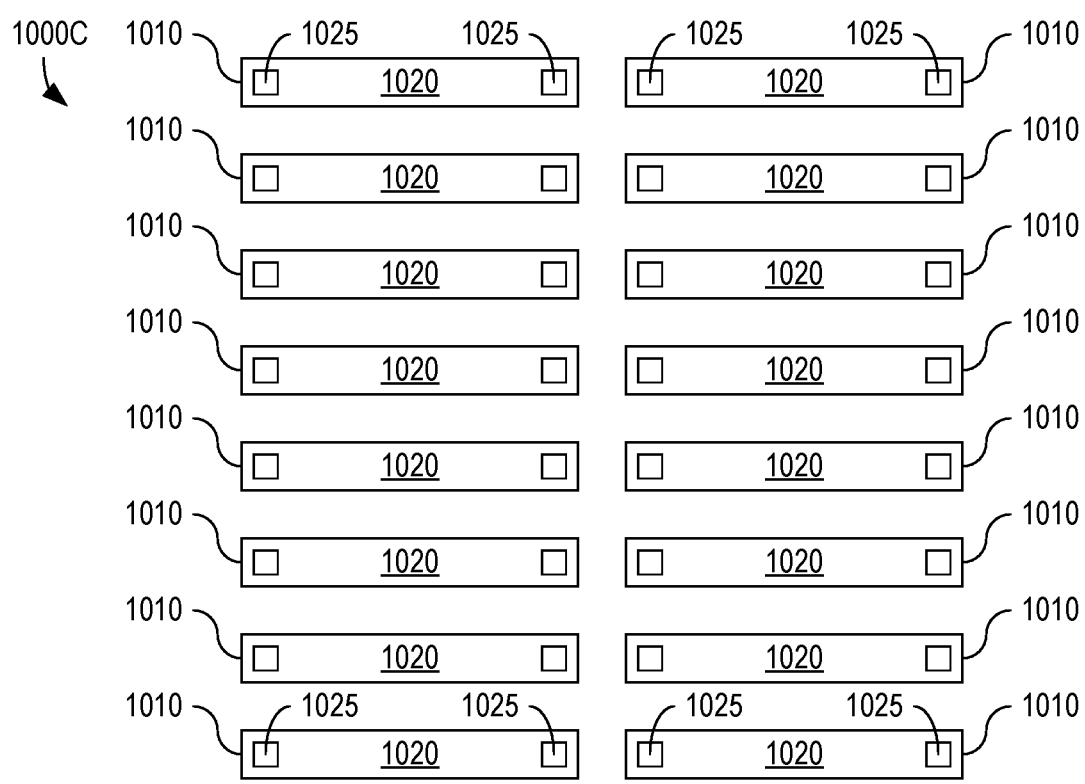

Trench IGBTs fabricated using the process flows described above may optimize turn off speed versus Jce through choices of whether all, some, or none of the shield regions 16 and 18 are connected to the emitter contact, connected to a separately biased contact, or isolated (float). FIGS. 10A, 10B, and 10C show the top views of trench IGBT devices 1000A, 1000B, and 1000C illustrating different example implementations of electrical connections to P poly shield regions 18. Each trench device 1000A, 1000B, or 1000C may have cross-sections in accordance with any of the IGBT structures disclosed above.

FIG. 10A shows a top view illustrating a layout of trenches 1010 in an active area of a trench device 1000A. P poly shield regions 18 may be in or below all areas of trenches 1010. Trench areas 1020 and 1022, for example, may contain N+ polysilicon, e.g., gate polysilicon 26, over inter-poly dielectric spacers 24 and P poly shield regions 18 described above. Gate contacts 1025 make ohmic contact with gate polysilicon 26 in areas 1020 and 1022 of trenches 1010. Areas 1030 of trenches 1010 contain dielectric, e.g., oxide spacers 22 or HDP oxide 25, surrounding conductive vias, e.g., metal interconnect 56 or P polysilicon 132, electrically connected to the buried P poly shield regions 18. Contacts 1035 may electrically short poly shield regions 18 through the conductive vias in trench areas 1030 to the emitter, which is formed in mesas between trenches 1010. In the implementation of FIG. 10A, conductive vias to P poly shield regions 18 are in every other trench 1010, i.e., areas 1020, and ohmically connect the emitter of trench device 1000A to the P poly shield regions 18. Areas 1022 do not contain conductive vias to P poly shield regions 18, and P poly shield regions 18 in trench areas 1022 may float.

FIG. 10B shows a top view of an active area of a trench device 1000B providing an example contact option for connections to P poly shield regions 18. In trench device 1000B, each trench 1010 contains a contact area 1040. For example, trench areas 1040 in trench device 1000B may contain HDP oxide 25 or may contain p poly silicon 132. If no contacts are formed in areas 1040, all of the P poly shield regions in trenches 1010 may float. Optionally, contacts may be formed in one or more of areas 1040 to connect the P poly shield regions in one or more trench 1010 to the emitter or other active components. A contact mask option, without changing any other masking layer, can determine which P poly shield regions 18 are contacted.

More generally, regions 1040, which may contain HDP oxide 25 or p poly silicon 132 for contacts, are not required in a configuration where all P poly shield regions 18 float. FIG. 10C shows a top view of a trench device 1000C with floating P poly shield regions 18 in all trenches 1010 without any oxide filled regions.

Although particular implementations have been disclosed, these implementations are only examples and should not be taken as limitations. For example, the process described above use epitaxial layers to have desired doping concentrations. Instead of having N region over N− drift region grown during epitaxial growth, this N layer at the surface can be formed by high energy phosphorous ion implantation without a mask or with a mask, for example, using P body as mask or a dedicated mask. Starting wafer IGBT wafer could be float zone (FZ) wafer with only N− doping concentration for the required breakdown, and N field stop and P+ collector regions may be formed by backside ion implantation of phosphorous, hydrogen or helium(for N Field stop), and boron forming the P+ collector with laser activation after the front side wafer processing is completed and the wafer backside is ground and etched. Alternatively, N Field Stop and N drift can be epitaxially grown over a lightly doped N or P substrate, and P+ Collector may be formed by boron ion implantation and activation (laser or thermal) after completion of the IGBT wafer frontside process and also wafer backside grinding and etching. Various further adaptations and combinations of features of the implementations disclosed are within the scope of the following claims.

What is claimed is:

1. A trench device comprising:
   a semiconductor layer of a first conductivity type;
   a shield region of a second conductivity type in the semiconductor layer;
   a shield polysilicon region of the second conductivity type on the shield region and confined laterally by first dielectric spacers;
   a dielectric layer on the shield polysilicon region; and
   a trench gate structure on the dielectric layer.

2. The device of claim 1, further comprising:
   a body region of the second conductivity type adjacent to the trench gate structure; and
   a source region of the first conductivity type inside the body region, the source region and the body region ohmically contacting a top electrode.

3. The device of claim 1, wherein the trench devices comprises a trench MOSFET or a trench IGBT.

4. The device of claim 1, further comprising a metal contact extending into a contact trench in the semiconductor layer, the contact trench being shallower in the semiconductor layer than is the gate structure.

5. The device of claim 1, wherein a charge carrier density in the shield region is substantially equal to a charge carrier density in the semiconductor layer.

6. The device of claim 1, further comprising:
   a substrate of the first conductivity type, the semiconductor layer being on the substrate; and
   a bottom electrode on a bottom surface of the substrate.

7. The device of claim 1, further comprising:
   a substrate of the second conductivity type, the semiconductor layer being on the substrate; and
   a bottom electrode on a bottom surface of the substrate.

8. The device of claim 1, wherein the first conductivity type is N type, and the second conductivity type is P type.

9. The device of claim 1, further comprising:
   a second shield region of the second conductivity type in the semiconductor layer;
   a second shield polysilicon region of the second conductivity type on the second shield region and confined laterally by dielectric spacers;
   a second dielectric layer on the second shield polysilicon region; and
   a second trench gate structure on the second dielectric layer.

10. The device of claim 1, wherein the semiconductor layer comprises a drift region of the trench device.

11. The device of claim 1, wherein the semiconductor layer is a crystalline silicon layer.

12. The device of claim 2, wherein the gate trench structure includes a gate having the first conductivity type and a gate dielectric between the gate and the body region.

13. A trench semiconductor device, comprising:
   a substrate making ohmic contact to a bottom electrode;
   a semiconductor layer of a first conductivity type, the semiconductor layer forming a junction with the substrate;
   a plurality of shield regions of a second conductivity type in the semiconductor layer;
   a plurality of shield polysilicon regions of the second conductivity type and confined laterally by dielectric spacers, the shield polysilicon regions respectively being on the shield regions; and
   a plurality of gate trench structures respectively on the shield polysilicon regions, each of the gate trench structures including:
   a dielectric layer on an underlying one of the shield polysilicon regions; and
   a conductive gate on the dielectric layer.

14. The device of claim 13, further comprising:
   a plurality of body regions of the second conductivity type adjacent to the gate trench structures;
   a plurality of source regions of the first conductivity type in the body regions; and
   a top electrode ohmically contacting the source regions and the body regions.

15. The trench semiconductor device of claim 13, wherein the first conductivity is N type, and the second conductivity is P type.

16. The device of claim 13, wherein the semiconductor layer comprises a drift region of the trench device.

17. The device of claim 13, wherein the semiconductor layer is a crystalline silicon layer.

18. The device of claim 14, further comprising an edge termination area including a plurality of rings, some of the rings including field plates enclosing an active device area.

19. The trench semiconductor device of claim 14, wherein:
   the trench semiconductor device is an insulated gate bipolar transistor (IGBT);
   the substrate has the second conductivity type;
   the bottom electrode is a collector of the IGBT; and
   the top electrode is an emitter of the IGBT.

20. The trench semiconductor device of claim 19, wherein one or more of the shield polysilicon regions in an active device area of the IGBT ohmically contact the emitter electrode and act to improve switching speed.

21. The trench semiconductor device of claim 19, wherein one or more of the shield polysilicon regions in an active device area of the IGBT floats and acts to minimize a voltage drop between the collector and the emitter of the IGBT.

22. A method of forming a vertical trench power device, the method comprising:
   forming a plurality of gate trenches in a semiconductor layer of a first conductivity type, the semiconductor layer overlying a substrate;
   forming dielectric spacers on sidewalls of the gate trenches;
   forming shield regions of a second conductivity type in the semiconductor layer;
   forming polysilicon shield regions of the second conductivity type in the gate trenches and in contact with the shield regions in the semiconductor layer, the polysilicon shield regions being confined laterally by the dielectric spacers on the sidewalls of the gate trenches;
   forming dielectric spacers overlying the polysilicon shield regions; and
   forming conductive gate structures in the gate trenches, the conductive gate structures overlying the dielectric spacers and the polysilicon shield regions.

23. The method of claim 22, wherein forming the shield regions in the semiconductor layer comprises implanting dopants of the second conductivity type into the semiconductor layer below bottoms of the gate trenches.

24. The method of claim 22, wherein forming the shield regions in the semiconductor layer comprises:
   etching to extend the gate trenches below the dielectric spacers; and
   selectively growing an epitaxial layer from a bottom of the gate trenches up to the dielectric spacers to form the shield regions of the second conductivity type in the semiconductor layer.

25. The method of claim 22, wherein forming the polysilicon shield regions comprises:
depositing a polysilicon layer into the gate trenches;
doping the polysilicon layer with dopants of the second conductivity type; and
etching down the polysilicon layer to leave the polysilicon shield regions at the bottoms of the gate trenches.

26. The method of claim 22, wherein forming the dielectric spacers comprises:
depositing a dielectric layer to completely fill the gate trenches;
planarizing the dielectric layer to form a planar top surface;
applying a mask to protect the dielectric layer in first areas of the gate trenches and to expose the dielectric layer in second areas of the gate trenches; and
etching down the dielectric layer through the mask to form the dielectric spacers in the second areas of the gate trenches and to leave the insulating layer filling the first areas of the gate trenches.

27. The method of claim 22, wherein forming the gate trenches comprises:
etching the semiconductor layer through a mask that exposes the semiconductor layer in areas of the gate trenches and in areas of body contact trenches, the etching forming the body contact trenches and forming an initial depth of the gate trenches, the gate trenches having a first width and the body contact trenches having a second width that differs from the first width, wherein:
depositing a dielectric layer in the body contact trenches and the initial depth of gate trenches, the dielectric layer being thick enough to completely fill the body contact trenches; and
isotropically etching the dielectric layer to remove the dielectric layer from the gate trenches while leaving dielectric material in the body contact trenches; and
selectively etching the semiconductor layer to deepen the gate trenches while the dielectric material in the body contact trenches prevents deepening of the body contact trenches.

28. The method of claim 22, wherein forming the gate trenches comprises:
etching the semiconductor layer through a first mask that exposes the semiconductor layer in areas of the gate trenches and in areas of body contact trenches, the etching forming the body contact trenches and forming an initial depth of the gate trenches, the gate trenches having a first width and the body contact trenches having a second width that differs from the first width, wherein:
depositing oxide into the body contact trenches and the gate trenches;
planarizing the oxide;
etching through a second mask that protects the areas of the body contact trenches and exposes the areas of the gate trenches, to remove the oxide from the gate trenches; and
further etching the semiconductor layer in the areas of the gate trenches to make the gate trenches deeper than the body contacts trenches.

29. The method of claim 22, wherein forming conductive gate structures comprises:
growing a gate oxide in the gate trenches and covering mesas of the semiconductor layer between the gate trenches;
depositing a polysilicon layer of the first conductivity to fill the gate trenches; and
planarizing the polysilicon layer with respect to a surface of the semiconductor layer.

30. The method of claim 22, wherein the first conductivity is N type, and the second conductivity is P type.

31. The method of claim 22, wherein the substrate is P type with an N type field stop layer, and the vertical trench power device comprises a power IGBT.

32. The method of claim 22, wherein forming the polysilicon shield regions comprises:
depositing a polysilicon layer of the second conductivity type into the gate trenches;
planarizing the polysilicon layer at a surface of the semiconductor layer;
applying a first mask to protect the polysilicon layer in first areas of the gate trenches and to expose the polysilicon layer in second areas of the gate trenches; and
etching the polysilicon layer through the first mask to leave the polysilicon layer extending to a surface of the semiconductor layer in the first areas of the gate trenches and to form the polysilicon shield regions that are confined laterally by the dielectric spacer in the second areas regions.

33. The method of claim 23, wherein implanting the dopants comprises ion implanting the dopants of the second conductivity using a plurality of energies and a plurality of doses to form the shield regions of the second conductivity type in the semiconductor layer.

34. The process of claim 29, further comprising:
implanting dopants of the second conductivity type though a first mask layers into the semiconductor layer to form body regions of the second conductivity type in the semiconductor layer;
implanting dopants of the first conductivity type though a second mask into the semiconductor layer to form source regions of the first conductivity type in the body regions;
depositing a BPSG overlying the semiconductor layer;
etching contact regions and saw street areas through a third mask;
sputtering a metal layer;
etching the metal layer through a fourth mask;
depositing a passivation layer;
etching the passivation layer through a fifth mask to remove the passivation layer from bonding pads and saw streets;
grinding a backside of the substrate; and
depositing a metal layer on the backside of the substrate.

35. The process of claim 32, further comprising:
implanting dopants of the second conductivity type though a second mask into the semiconductor layer to form body regions of the second conductivity type in the semiconductor layer;
implanting dopants of the first conductivity type though a third mask into the semiconductor layer to form source regions of the first conductivity type in the body regions;
depositing an insulating layer overlying the semiconductor layer; and
etching through a fourth mask to form an opening through the insulating layer to the polysilicon layer in the first areas of the gate trenches.

* * * * *